(12) United States Patent
Kawanishi et al.

(10) Patent No.: US 9,023,222 B2
(45) Date of Patent: *May 5, 2015

(54) PATTERN FORMING METHOD

(71) Applicant: Kabushiki Kaisha Toshiba, Tokyo (JP)

(72) Inventors: Ayako Kawanishi, Yokohama (JP);
Shinichi Ito, Yokohama (JP); Hirokazu Kato, Kariya (JP); Shimon Maeda, Tokyo (JP); Hideki Kanai, Takatsuki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/018,939

(22) Filed: Sep. 5, 2013

(65) Prior Publication Data

US 2014/0295669 A1 Oct. 2, 2014

(30) Foreign Application Priority Data

Mar. 27, 2013 (JP) .................. 2013-066502

(51) Int. Cl.
*B44C 1/22* (2006.01)
*H01L 21/027* (2006.01)
*B81C 1/00* (2006.01)
*H01L 21/033* (2006.01)
*H01L 21/311* (2006.01)

(52) U.S. Cl.
CPC ........ *H01L 21/0271* (2013.01); *B81C 1/00388* (2013.01); *H01L 21/0337* (2013.01); *H01L 21/31144* (2013.01); *Y10S 438/947* (2013.01)

(58) Field of Classification Search
CPC .................................................. B81C 1/00388
USPC ....................................... 216/41, 58; 438/947
See application file for complete search history.

(56) References Cited

U.S. PATENT DOCUMENTS

| | | | |
|---|---|---|---|
| 6,565,763 B1 | 5/2003 | Asakawa et al. |
| 7,569,469 B2 | 8/2009 | Kim et al. |
| 7,723,009 B2 | 5/2010 | Sandhu et al. |
| 7,767,099 B2 | 8/2010 | Li et al. |
| 7,923,373 B2 | 4/2011 | Sandhu |
| 7,964,107 B2 | 6/2011 | Millward |
| 7,999,160 B2 | 8/2011 | Cheng et al. |
| 8,083,953 B2 | 12/2011 | Millward et al. |

(Continued)

FOREIGN PATENT DOCUMENTS

JP 2012-219236 11/2012

OTHER PUBLICATIONS

Liu et al.; "Towards an All-Track 300 mm Process for Directed Self-Assembly", J. Vac. Sci. Technol., B, vol. 29, No. 6, pp. 06F203-1 to 06F203-6, (2011).

*Primary Examiner* — Shamim Ahmed
(74) *Attorney, Agent, or Firm* — Finnegan, Henderson, Farabow, Garrett & Dunner, L.L.P.

(57) ABSTRACT

According to one embodiment, a pattern forming method includes forming a first guide layer on a processed film, phase-separating a first self-assembly material with the use of the first guide layer to form a first self-assembly pattern including a first polymer portion and a second polymer portion, selectively removing the first polymer portion, forming a second guide layer with the use of the second polymer portion, and phase-separating a second self-assembly material with the use of the second guide layer to form a second self-assembly pattern including a third polymer portion and a fourth polymer portion.

17 Claims, 49 Drawing Sheets

(56) References Cited

U.S. PATENT DOCUMENTS

| | | |
|---|---|---|
| 8,083,958 B2 | 12/2011 | Li et al. |
| 8,133,341 B2 | 3/2012 | Nealey et al. |
| 8,204,124 B2 | 6/2012 | Okada et al. |
| 8,226,838 B2 | 7/2012 | Cheng et al. |
| 8,263,323 B2 * | 9/2012 | Yoon et al. .................. 430/324 |
| 8,287,957 B2 | 10/2012 | Nealey et al. |
| 8,361,704 B2 | 1/2013 | Colburn et al. |
| 8,372,295 B2 | 2/2013 | Millward |
| 8,394,877 B2 | 3/2013 | Asakawa et al. |
| 8,398,868 B2 | 3/2013 | Cheng et al. |
| 8,404,124 B2 | 3/2013 | Millward et al. |
| 8,562,844 B2 * | 10/2013 | Millward ..................... 216/17 |
| 8,715,917 B2 * | 5/2014 | Holmes et al. ............... 430/325 |
| 8,790,522 B1 * | 7/2014 | Schmid et al. ................ 216/17 |
| 2009/0001045 A1 | 1/2009 | Chen et al. |
| 2010/0163180 A1 | 7/2010 | Millward |
| 2012/0058435 A1 | 3/2012 | Seino et al. |
| 2012/0214094 A1 | 8/2012 | Mikoshiba et al. |
| 2012/0219236 A1 | 8/2012 | Ali et al. |
| 2012/0225243 A1 | 9/2012 | Millward |
| 2013/0189504 A1 | 7/2013 | Nealey et al. |
| 2014/0065839 A1 * | 3/2014 | Kawanishi et al. ........... 438/761 |

* cited by examiner

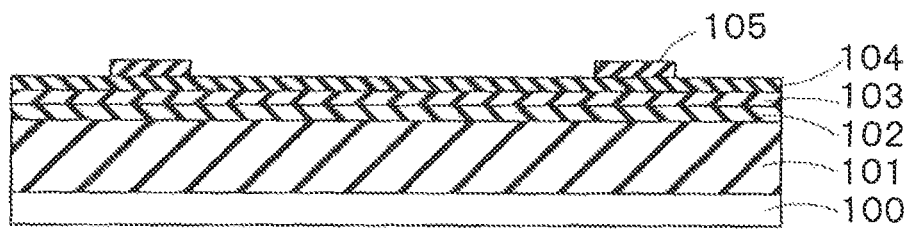
F I G. 2A
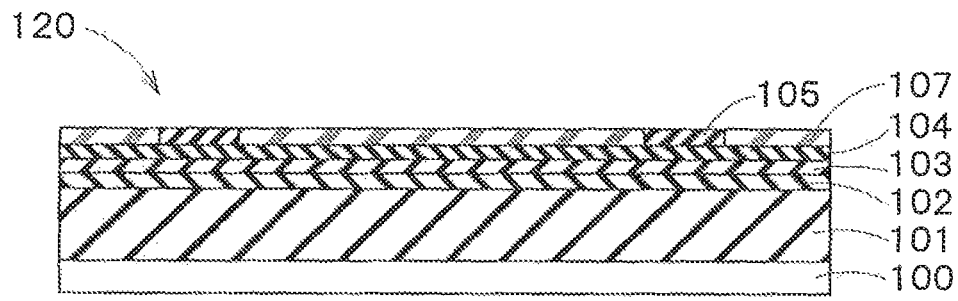
F I G. 2B
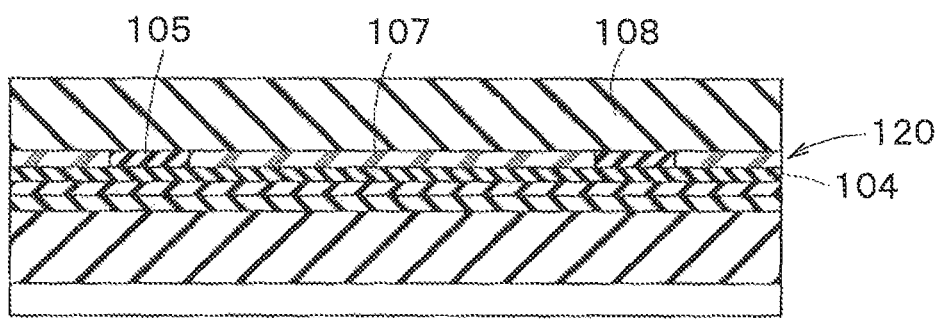
F I G. 2C

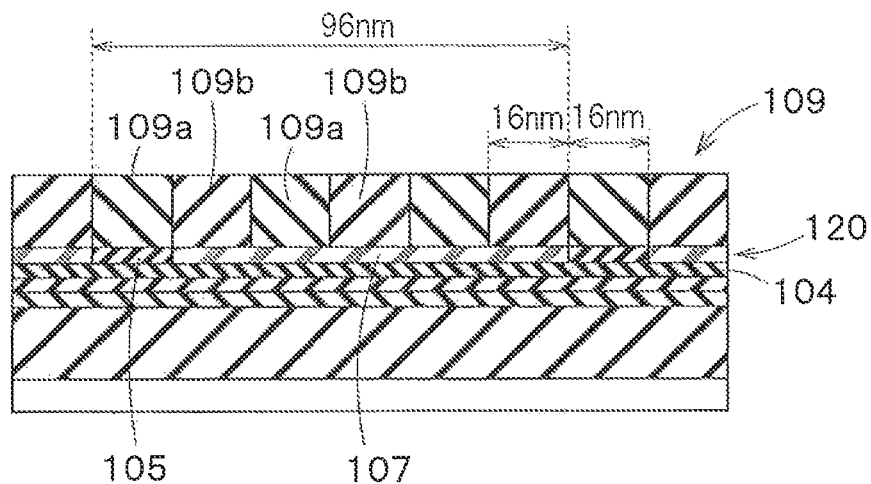
F I G. 3A
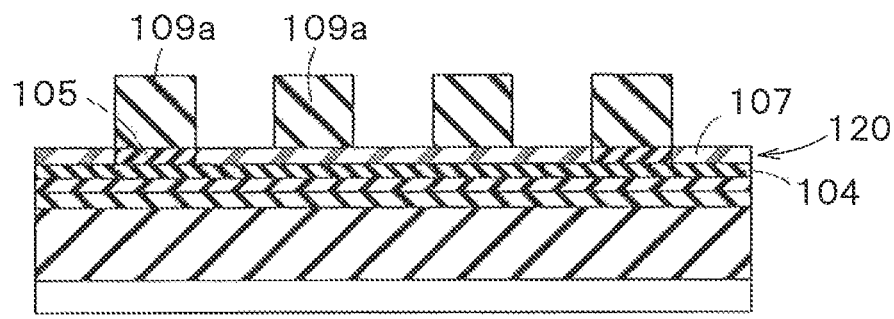
F I G. 3B
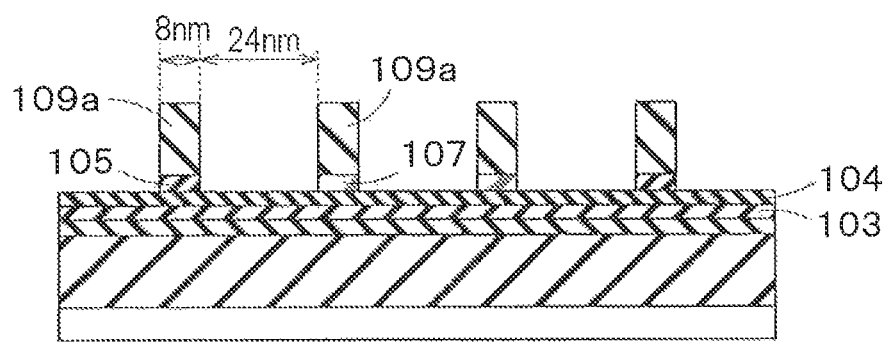
F I G. 3C

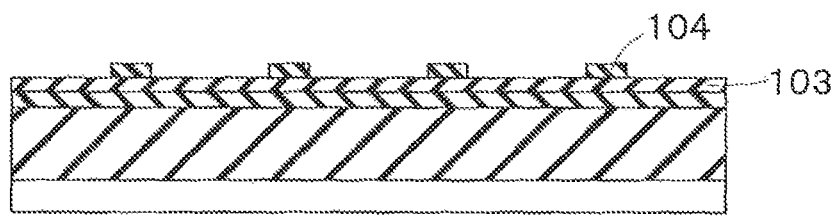
F I G. 4A
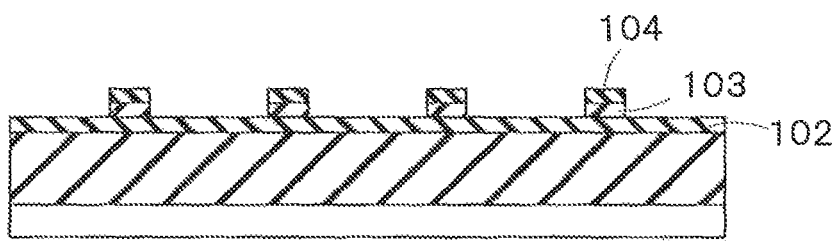
F I G. 4B
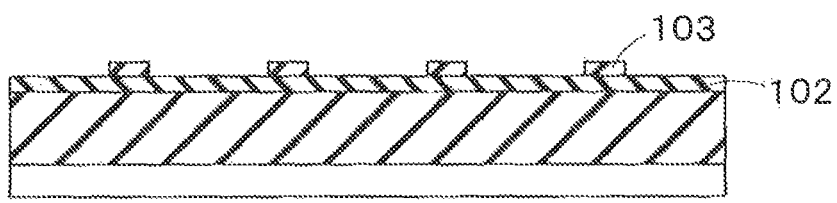
F I G. 4C

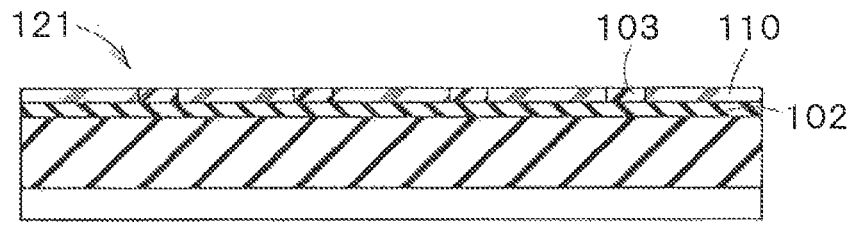
F I G. 5A
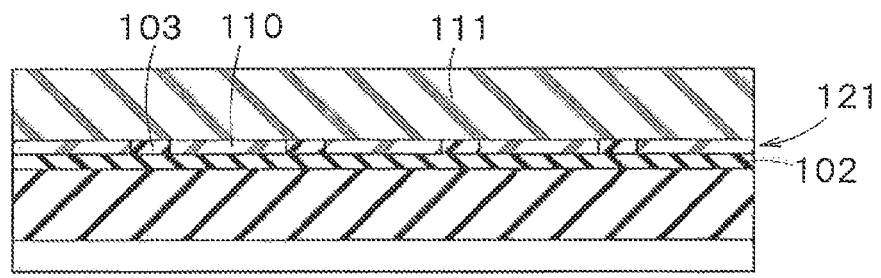
F I G. 5B
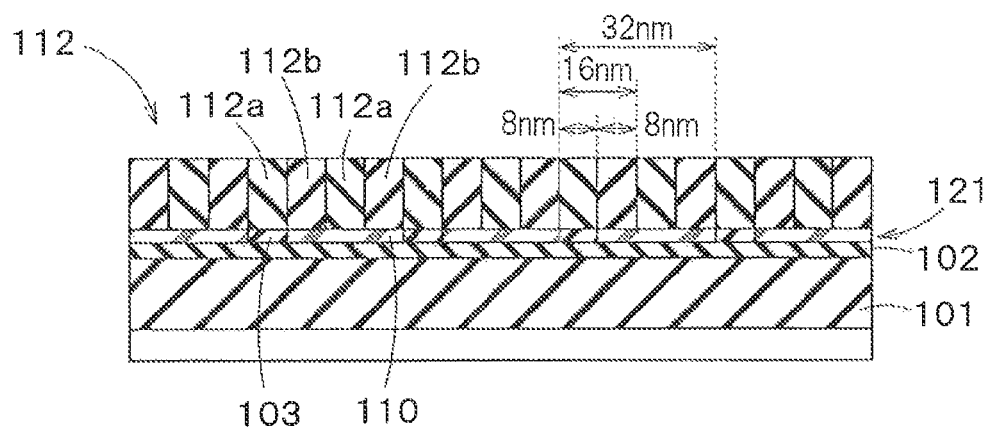
F I G. 5C

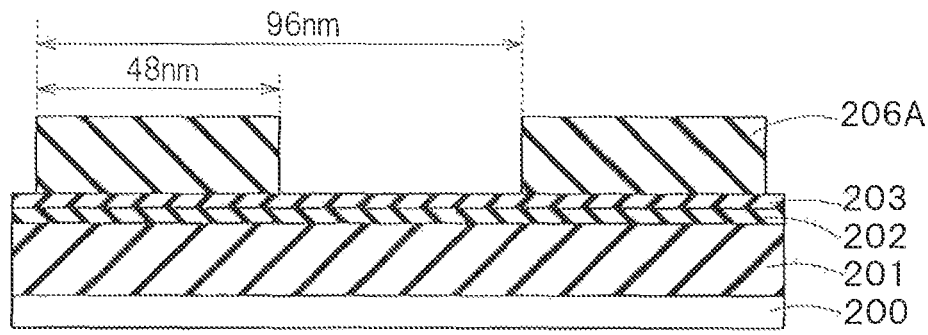
F I G. 6A
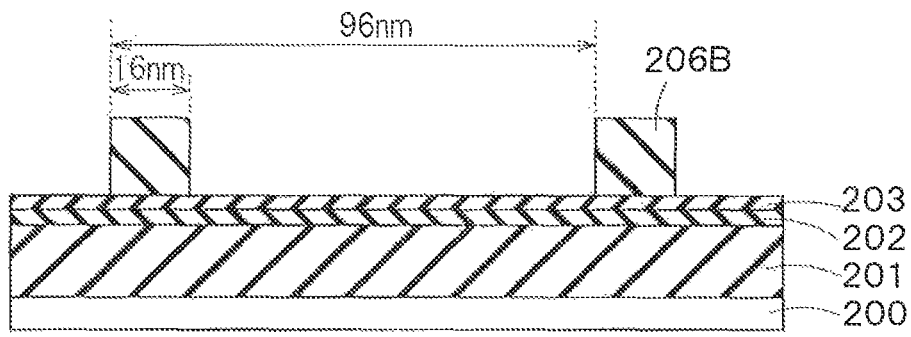
F I G. 6B
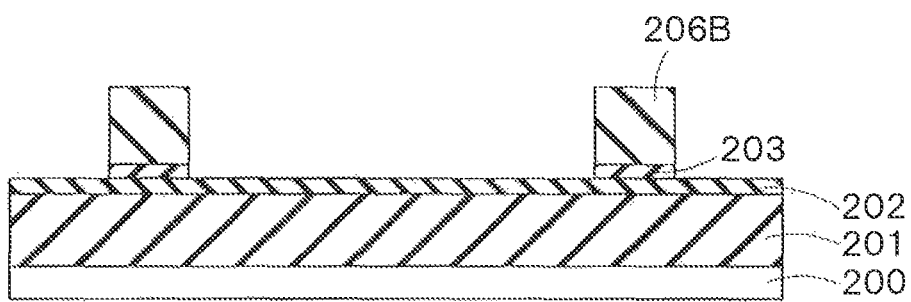
F I G. 6C

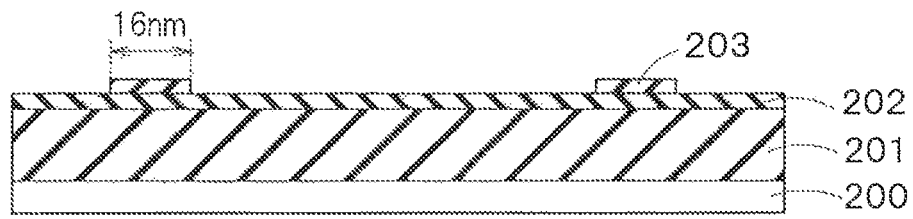
F I G. 7A
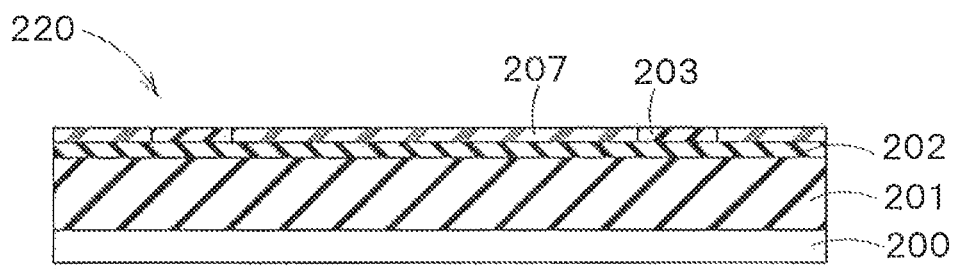
F I G. 7B
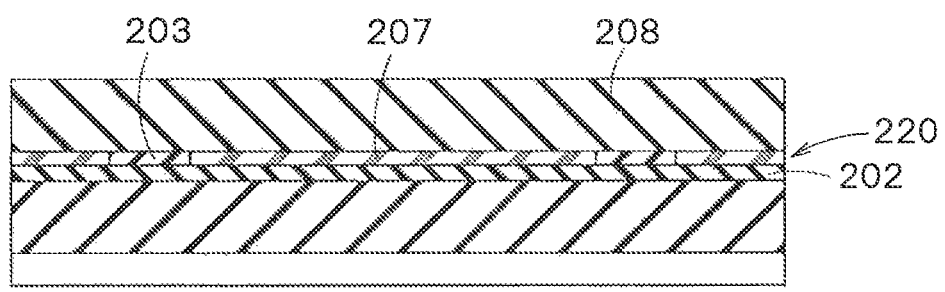
F I G. 7C

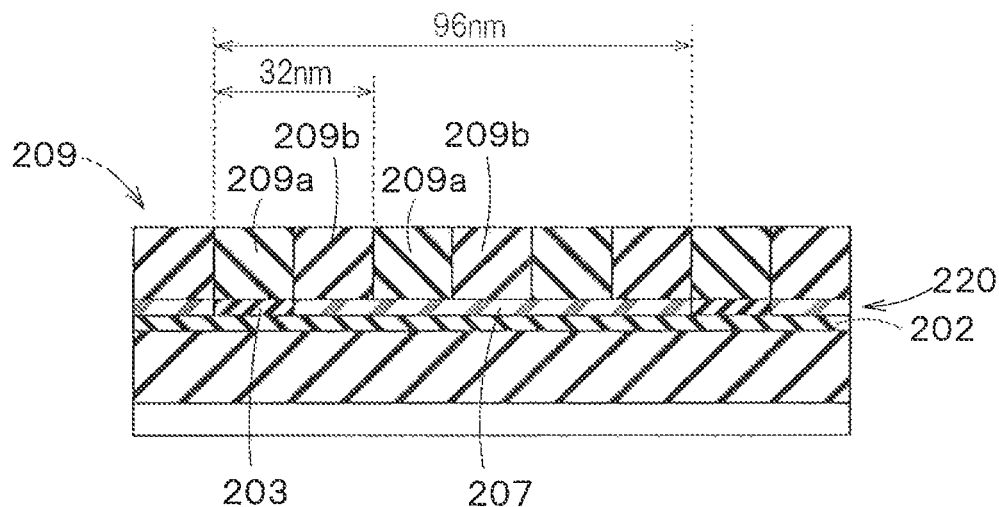
F I G. 8A
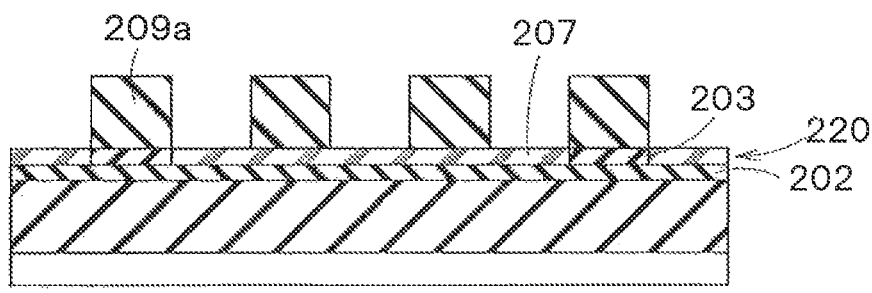
F I G. 8B
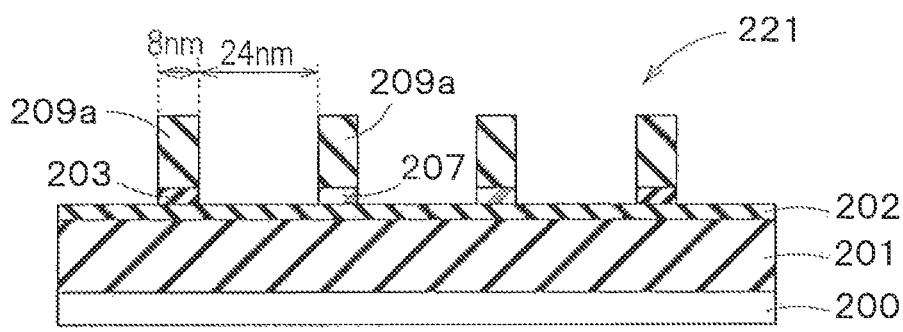
F I G. 8C

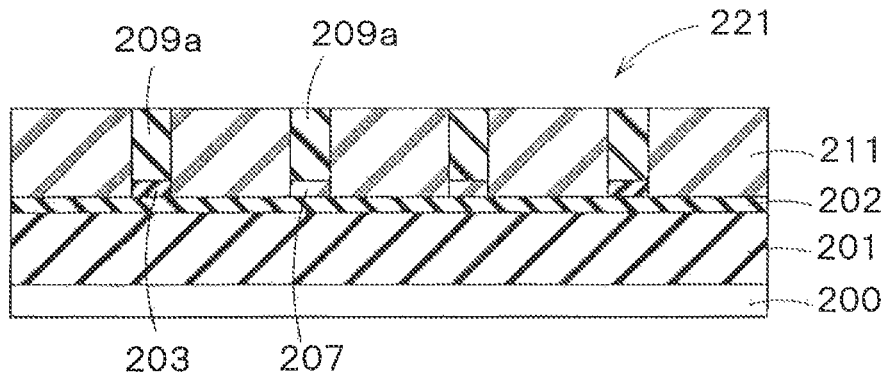
F I G. 9A
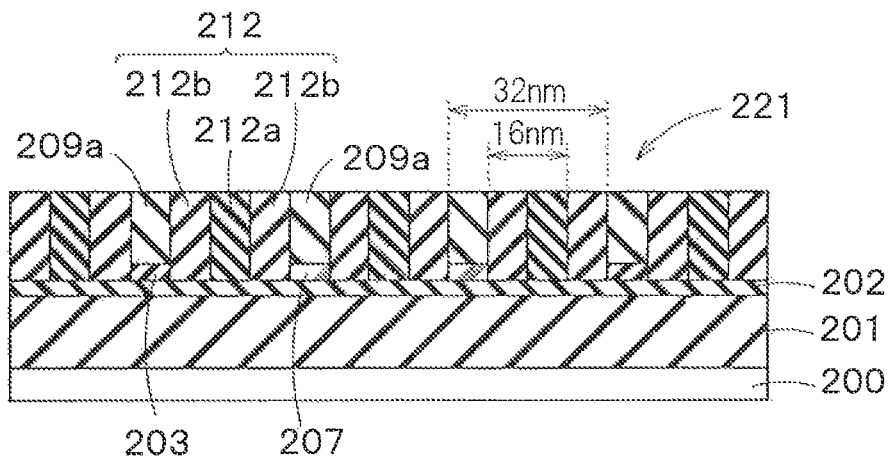
F I G. 9B
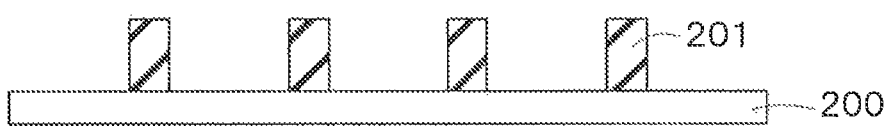
F I G. 10A
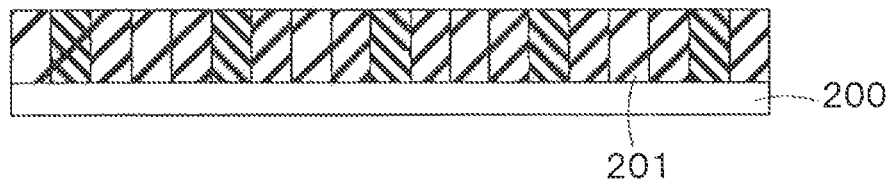
F I G. 10B FIG. 11A
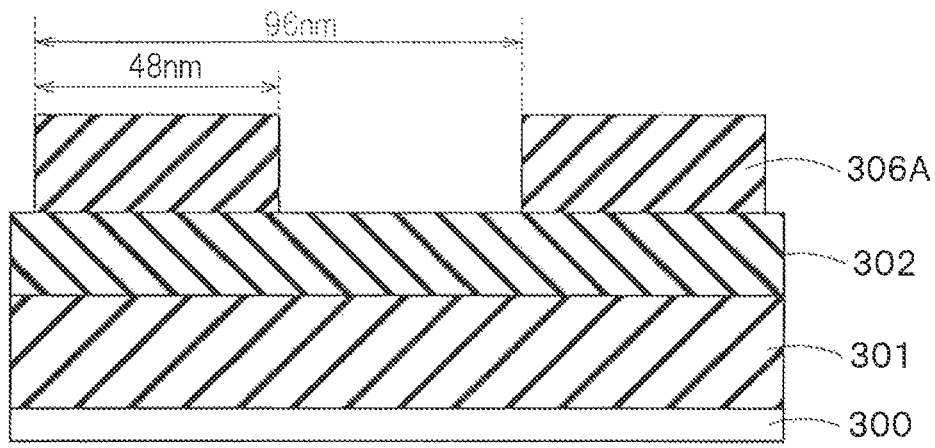
FIG. 11B
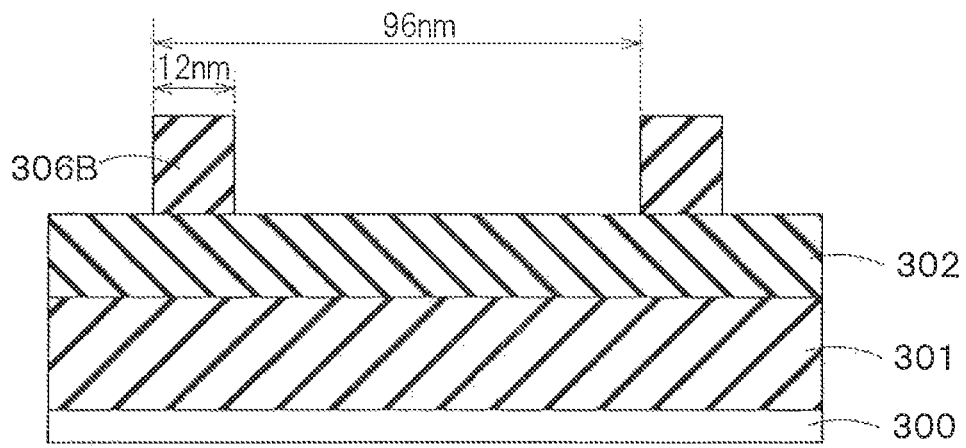
FIG. 11C

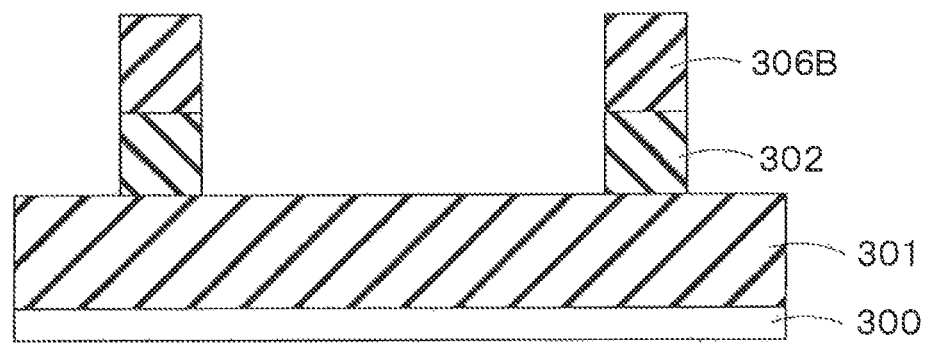
F I G. 12A
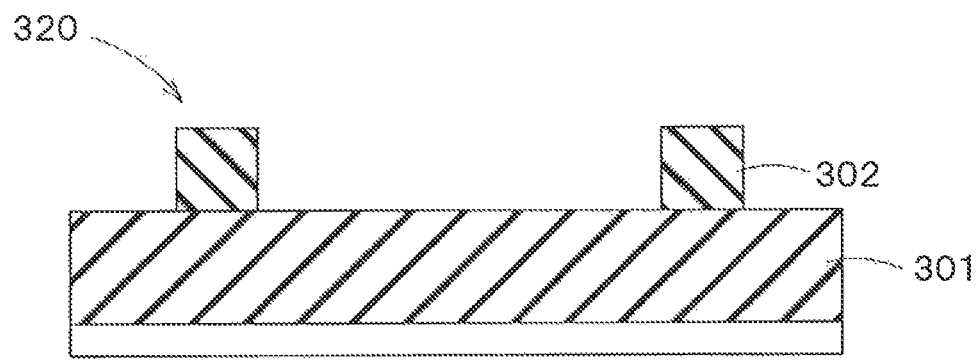
F I G. 12B
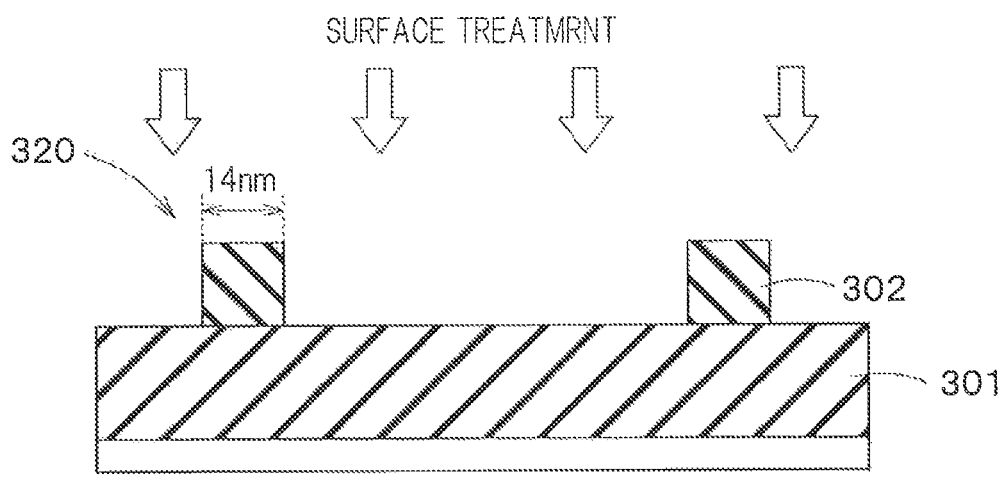
F I G. 12C

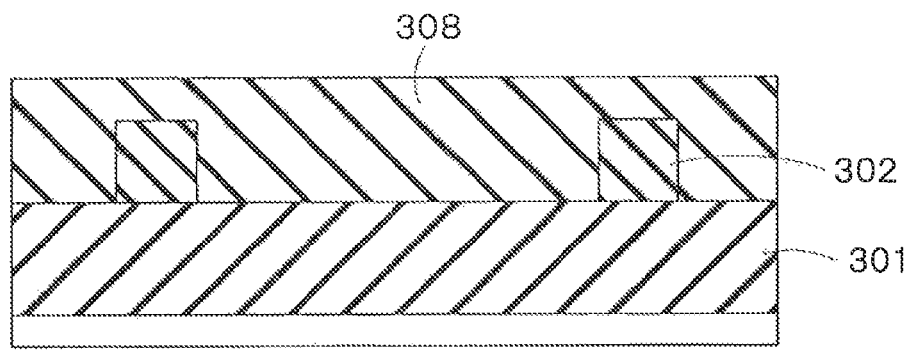
F I G. 13A
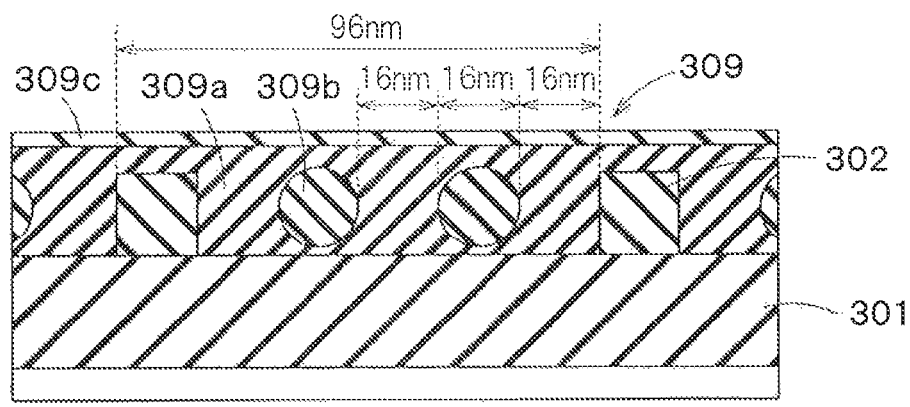
F I G. 13B
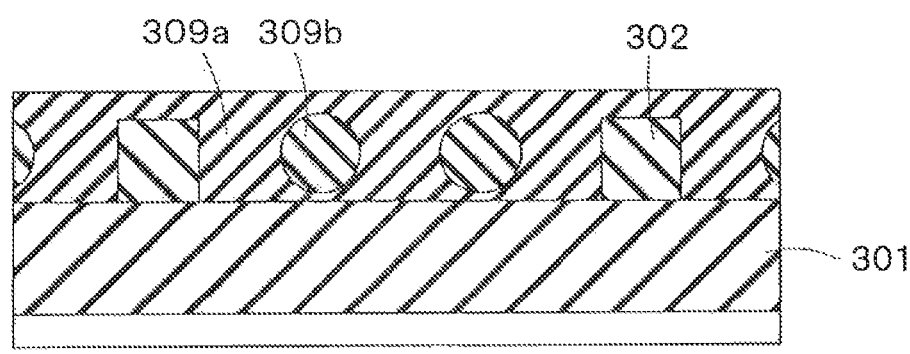
F I G. 13C

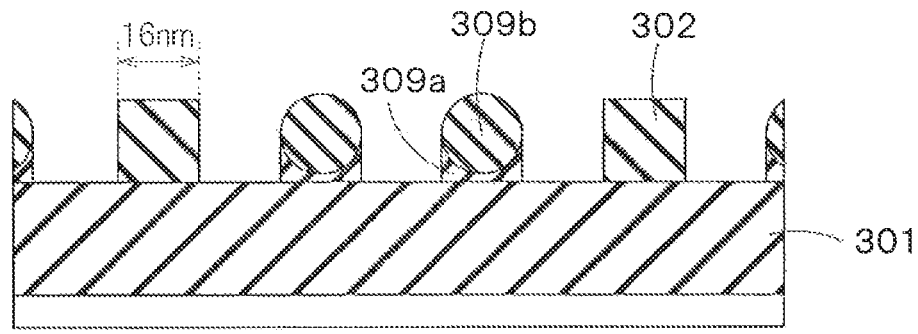
F I G. 14A
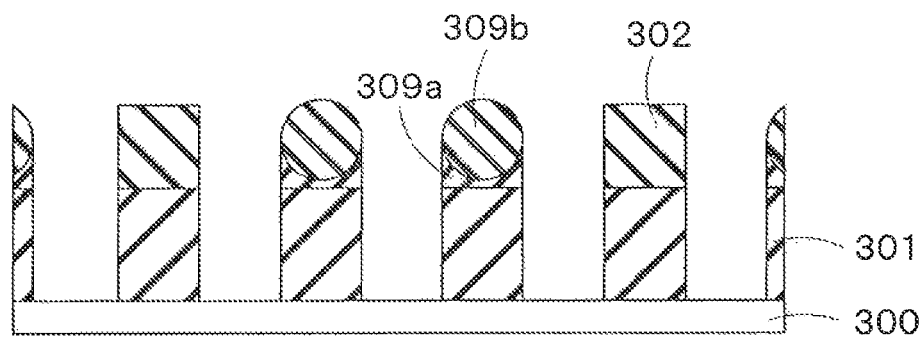
F I G. 14B
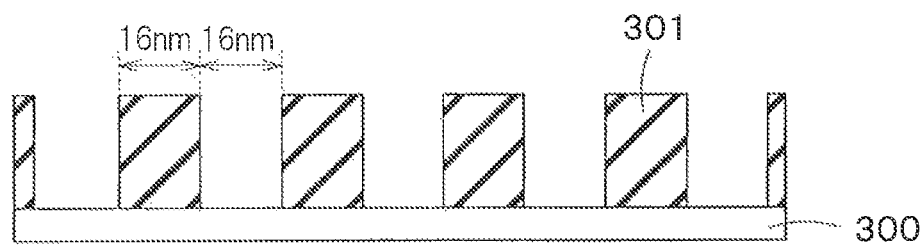
F I G. 14C

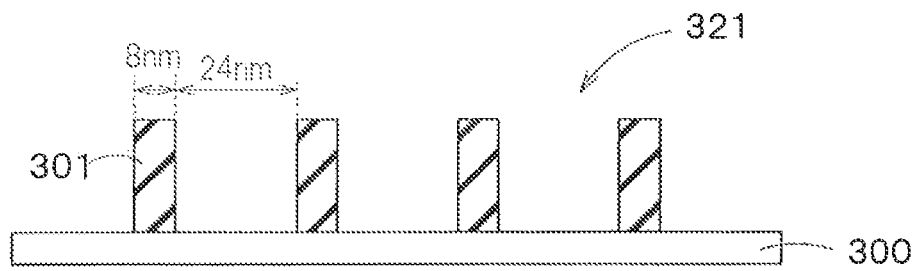
F I G. 15A
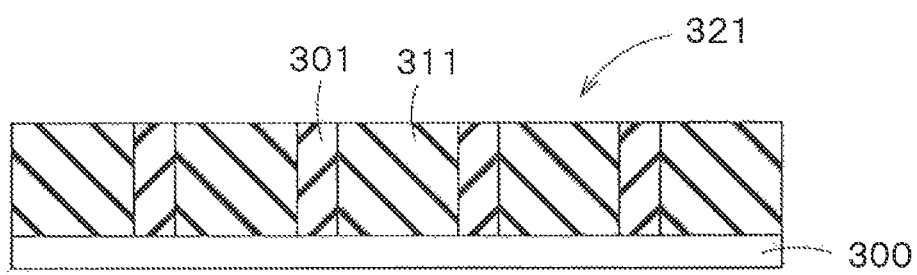
F I G. 15B
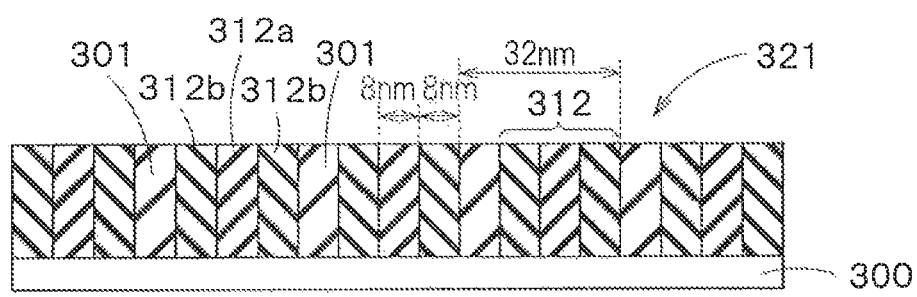
F I G. 15C

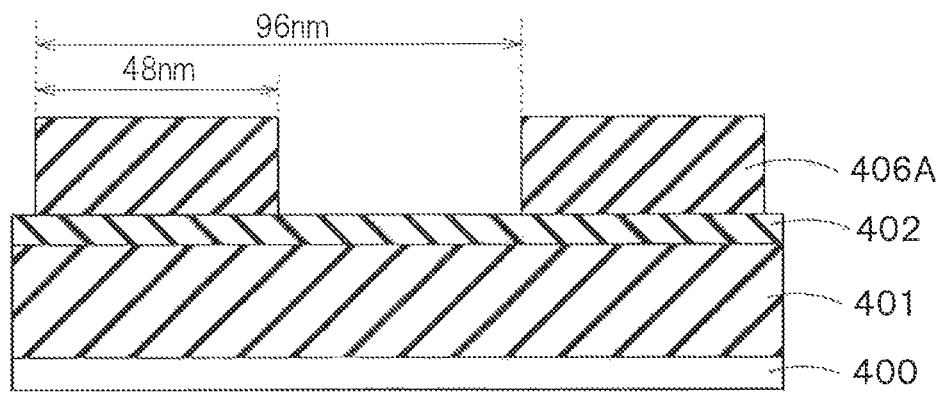
F I G. 16A
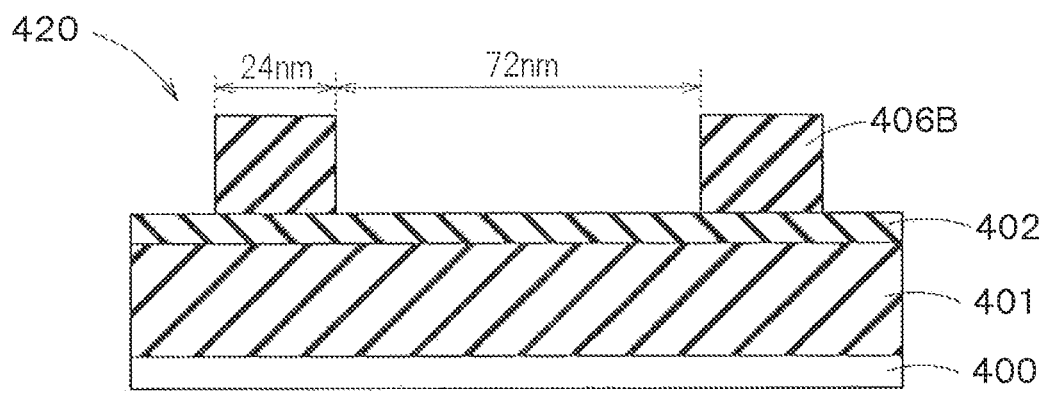
F I G. 16B
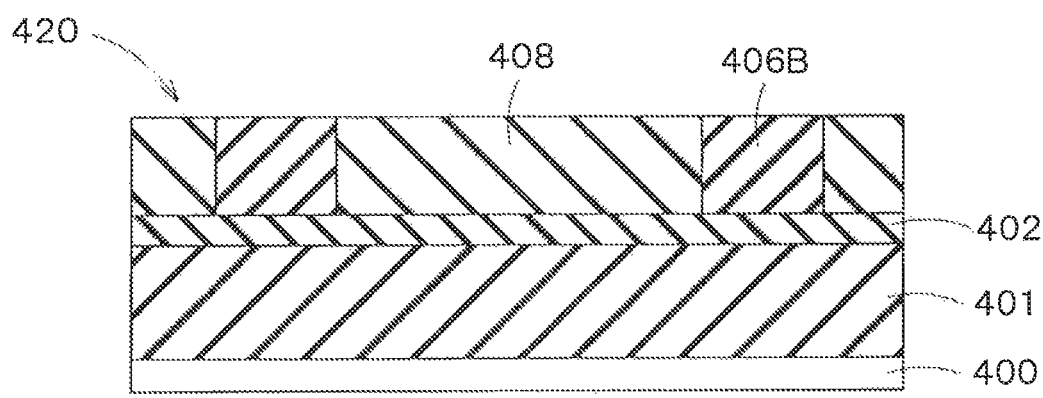
F I G. 16C

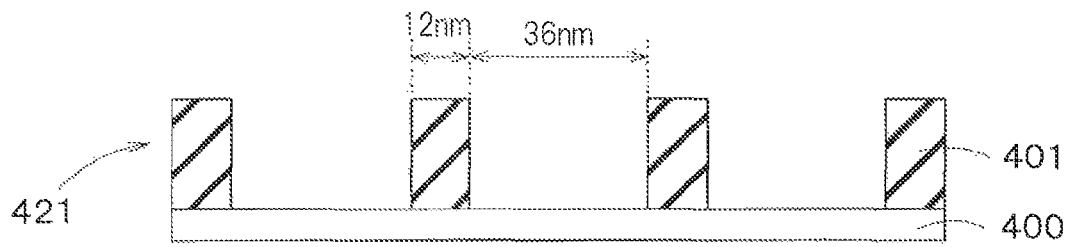
F I G. 18A
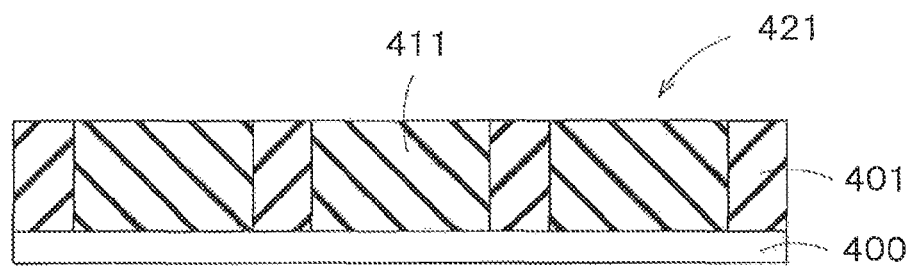
F I G. 18B
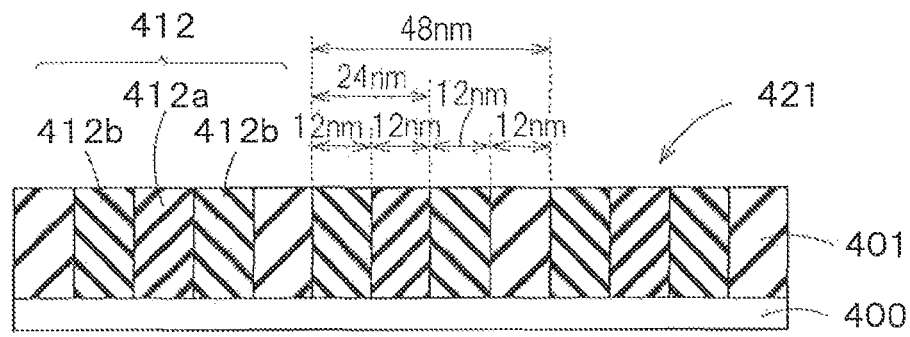
F I G. 18C

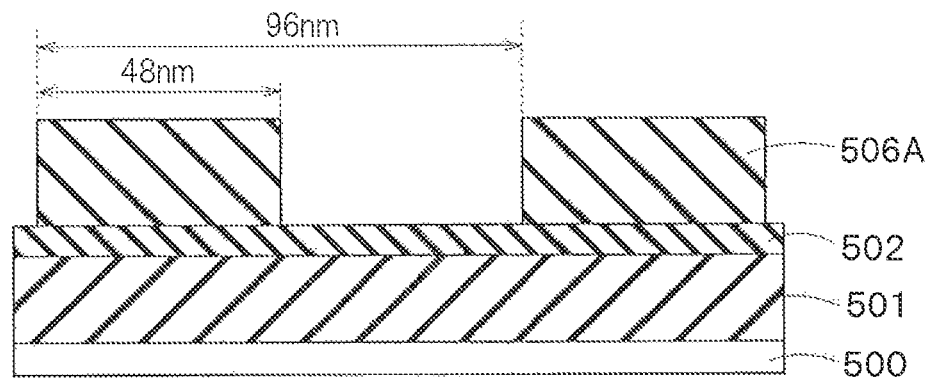
F I G. 19A
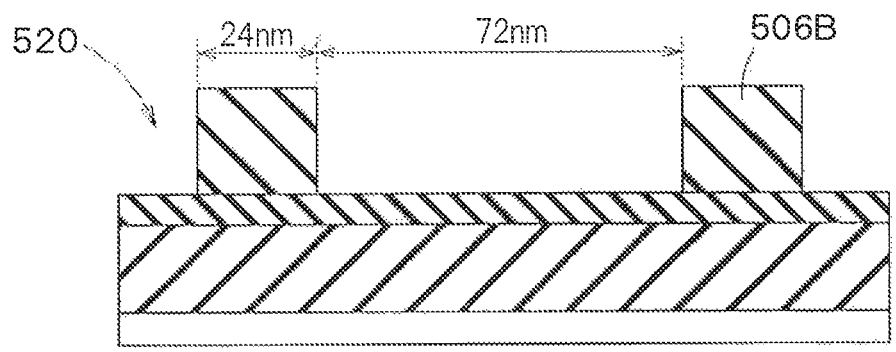
F I G. 19B
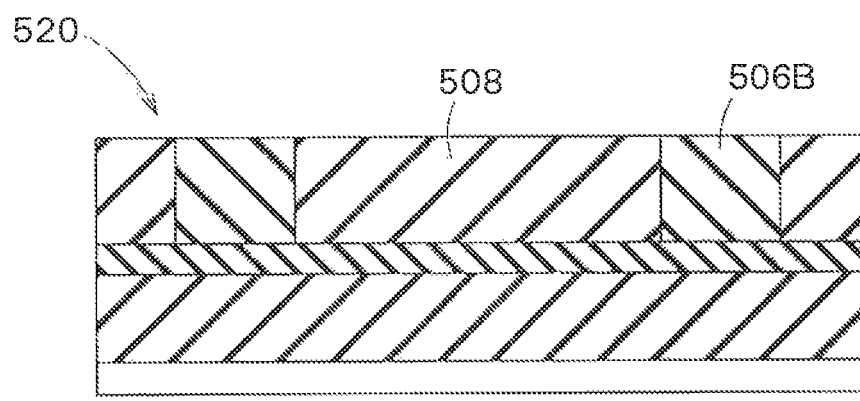
F I G. 19C

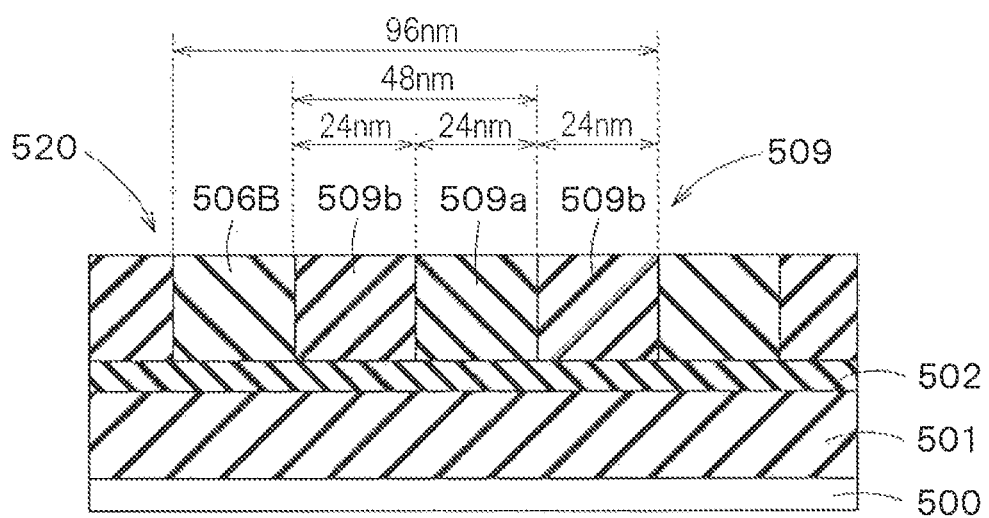
F I G. 20A
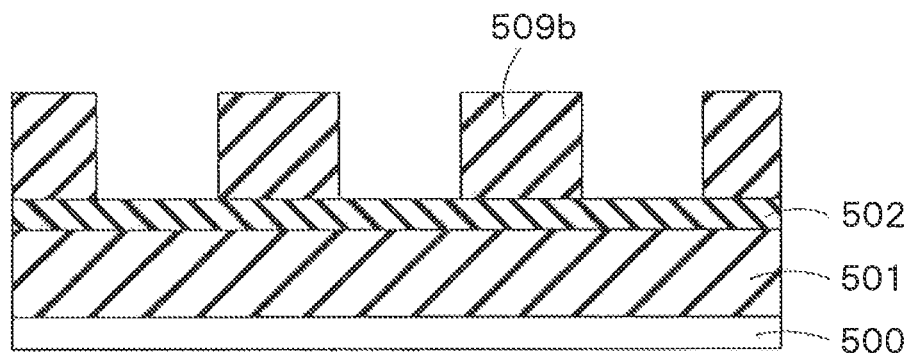
F I G. 20B
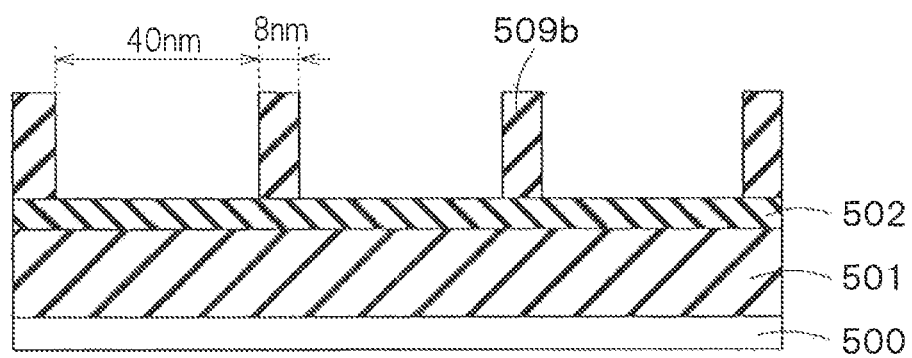
F I G. 20C

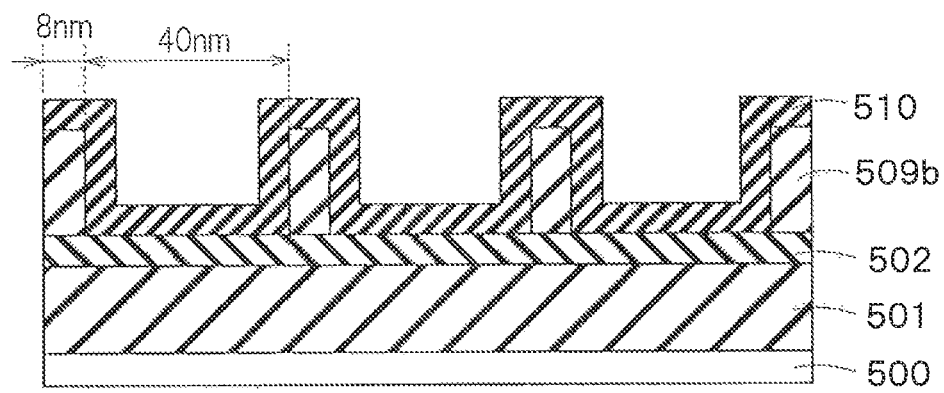
F I G. 21A
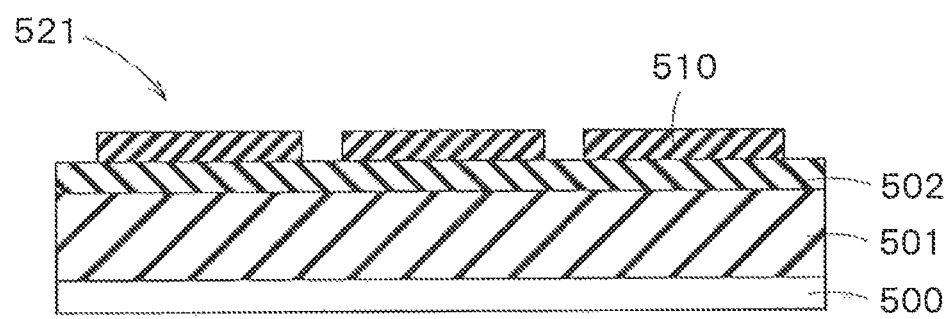
F I G. 21B

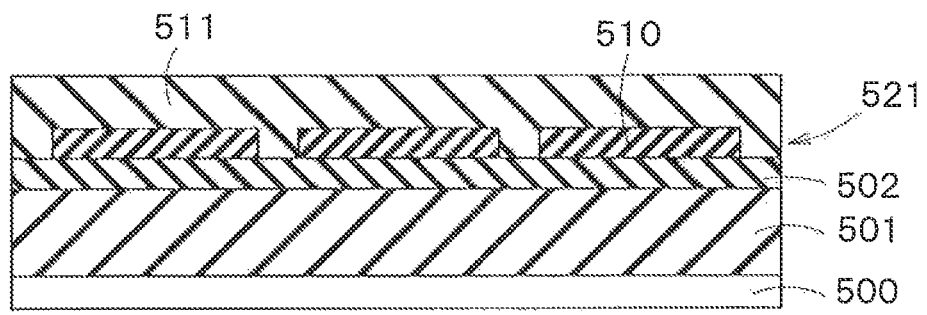
F I G. 22A
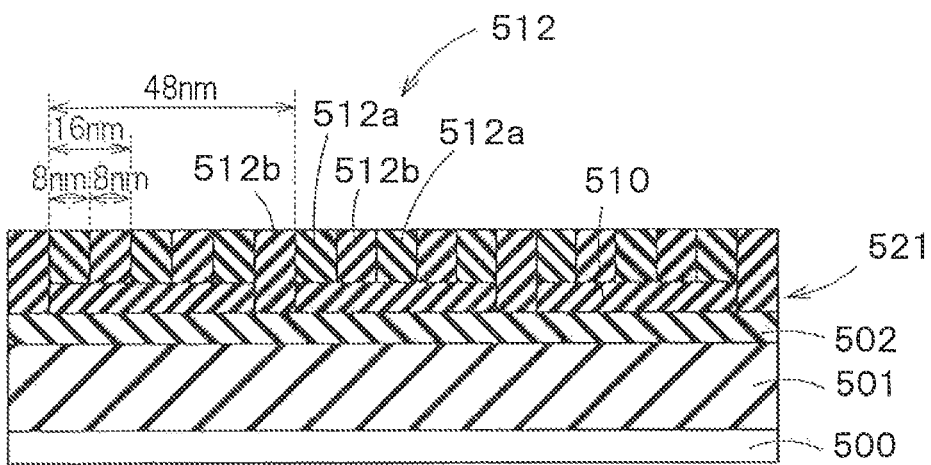
F I G. 22B

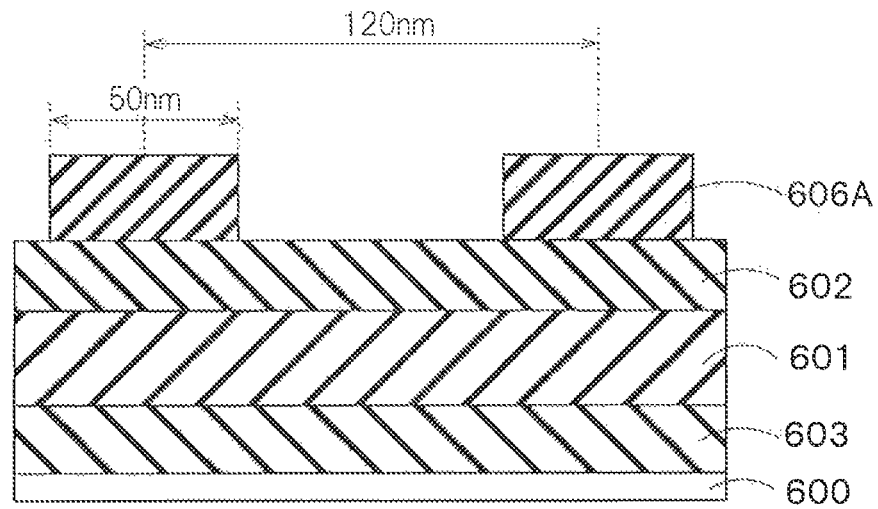
F I G. 23A
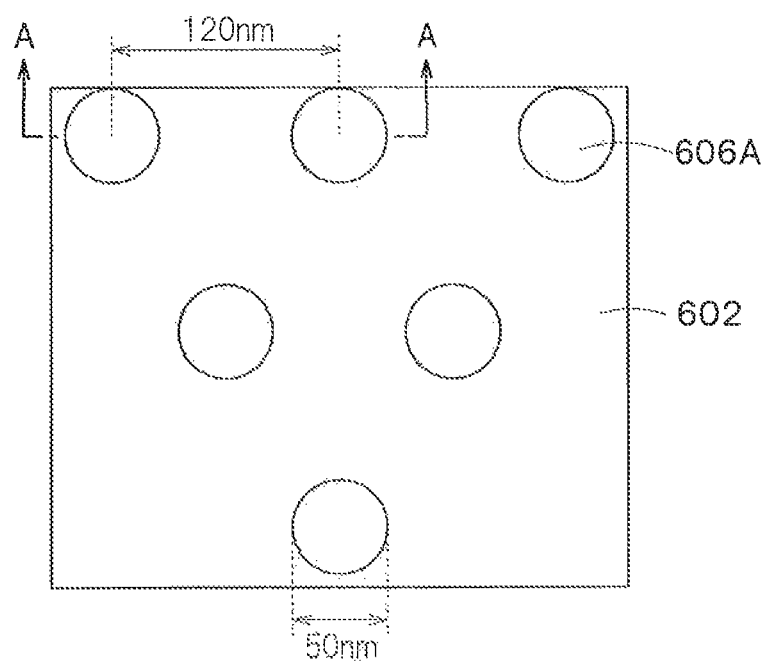
F I G. 23B

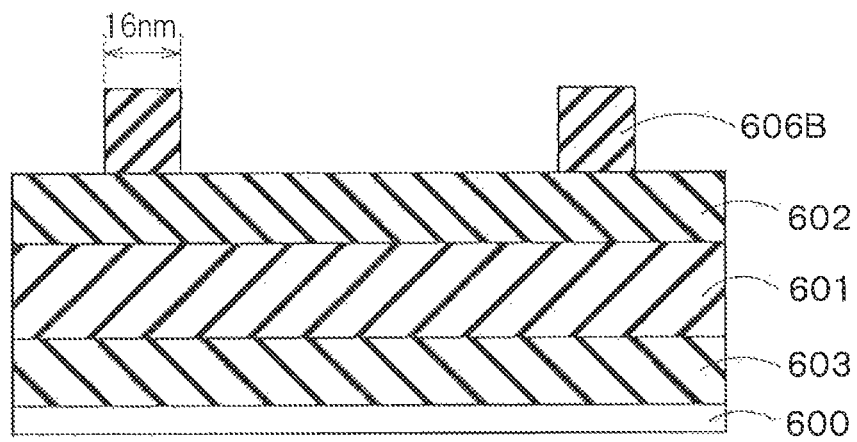
F I G. 24A
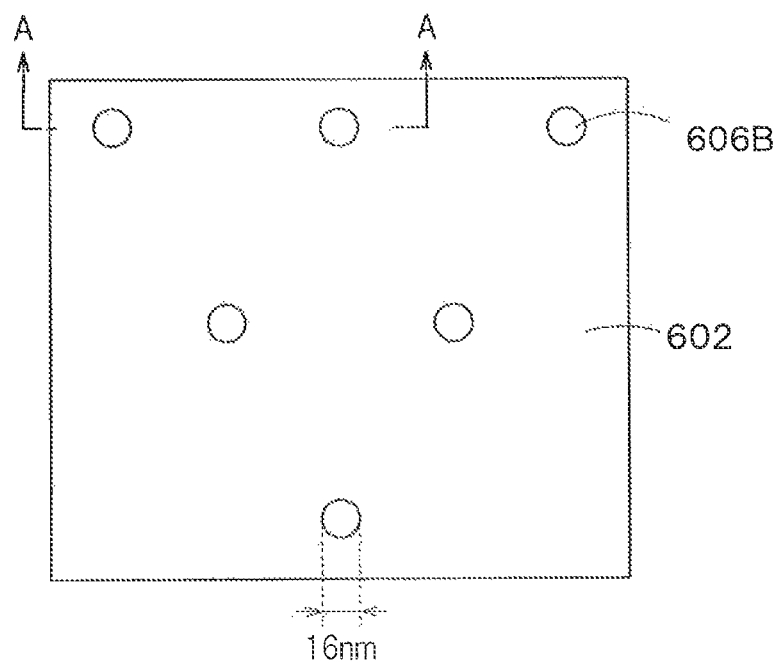
F I G. 24B

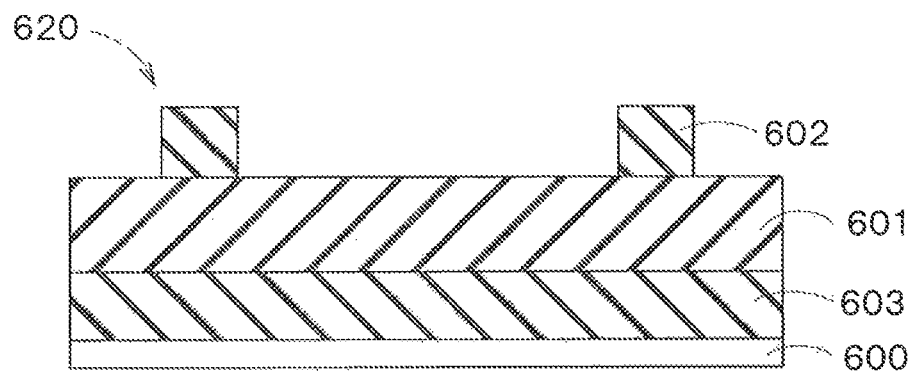
F I G. 25A
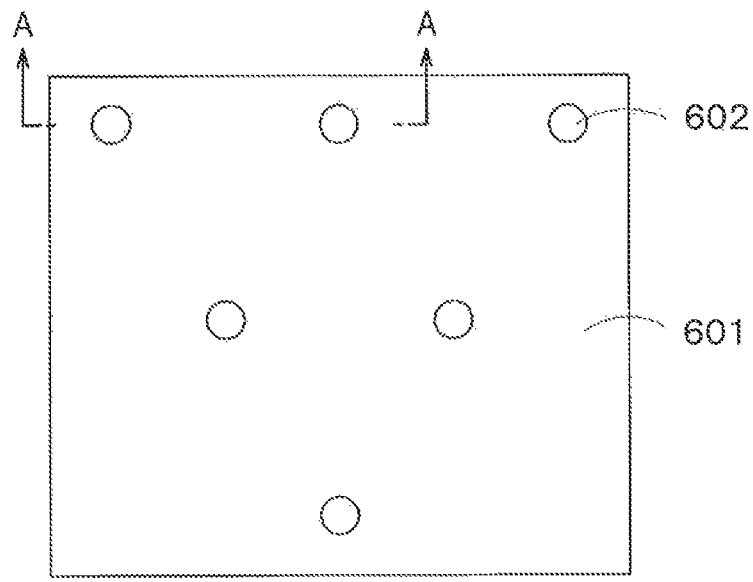
F I G. 25B

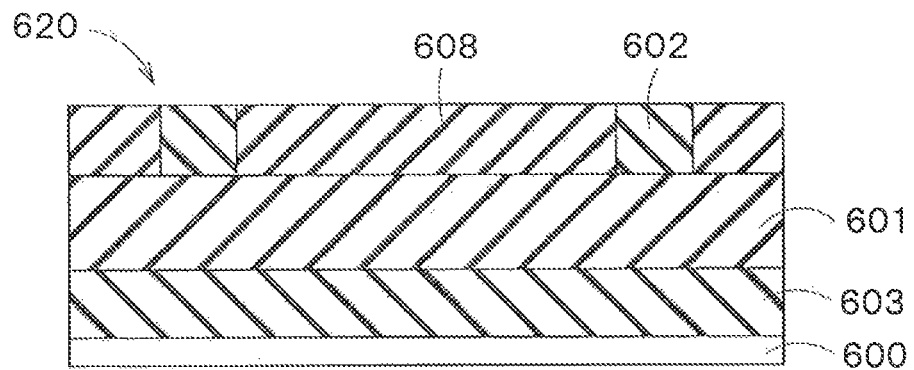
F I G. 26A
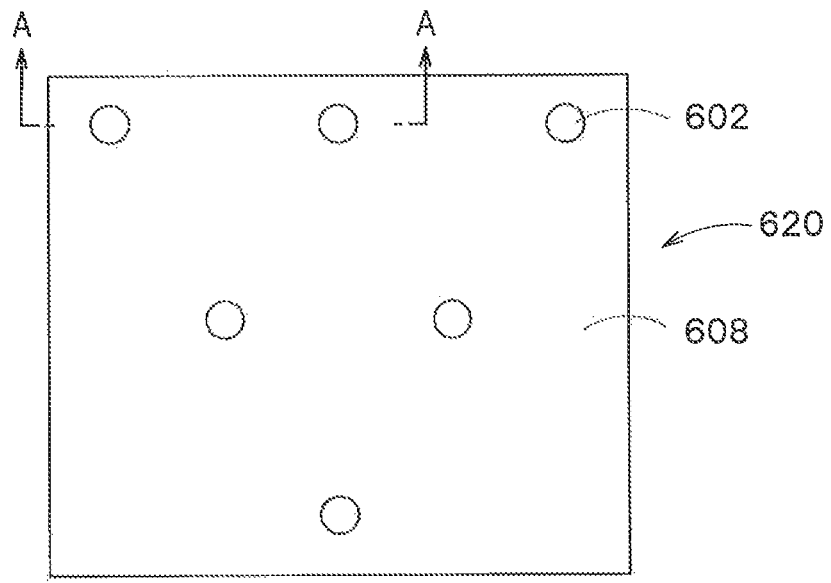
F I G. 26B

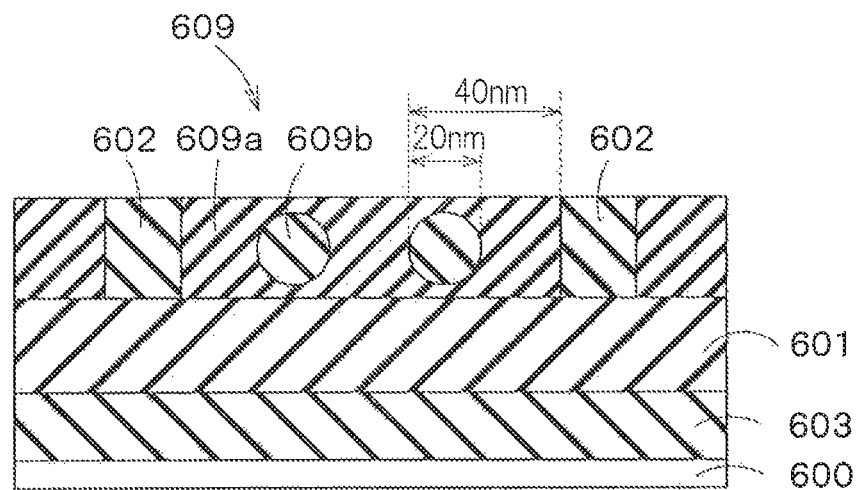
F I G. 27A
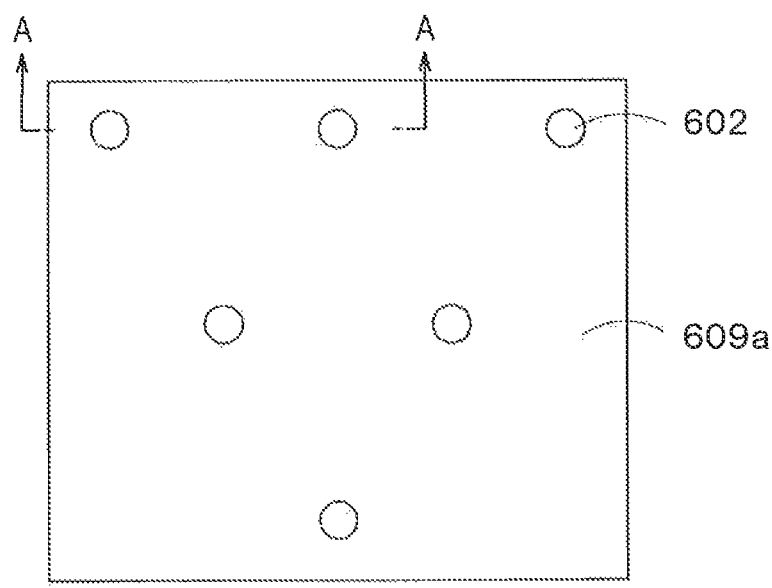
F I G. 27B

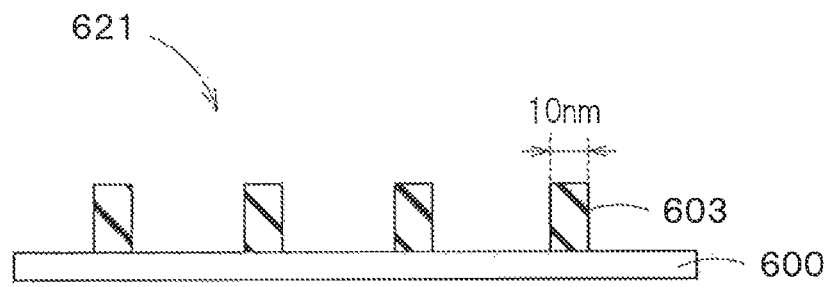
F I G. 29A
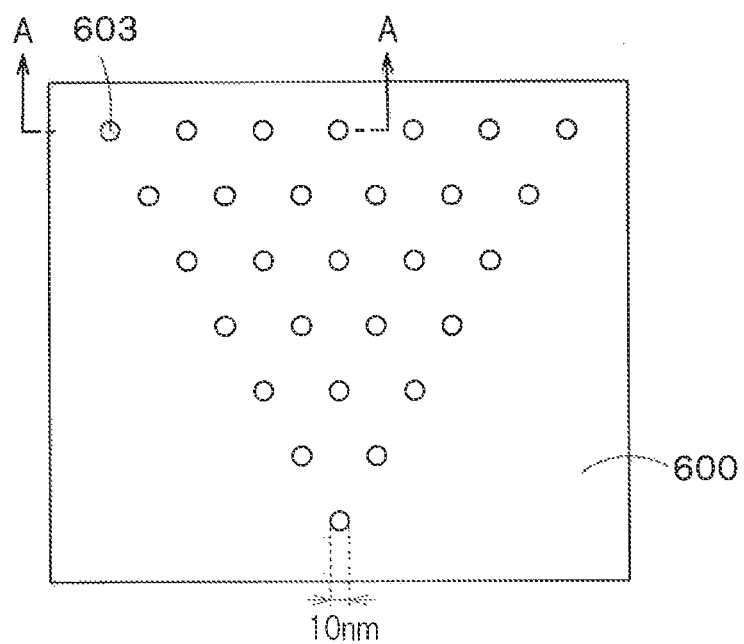
F I G. 29B

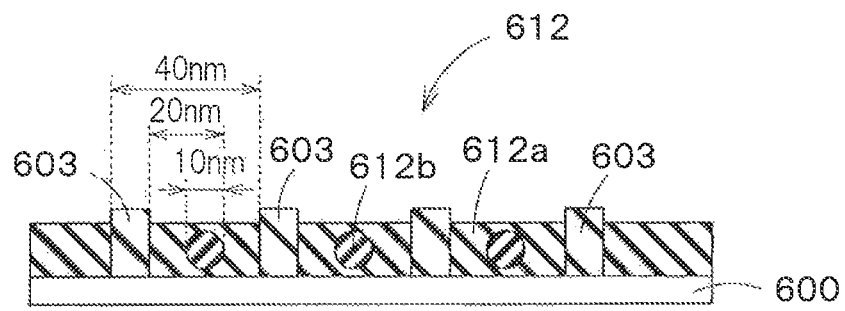
F I G. 31A
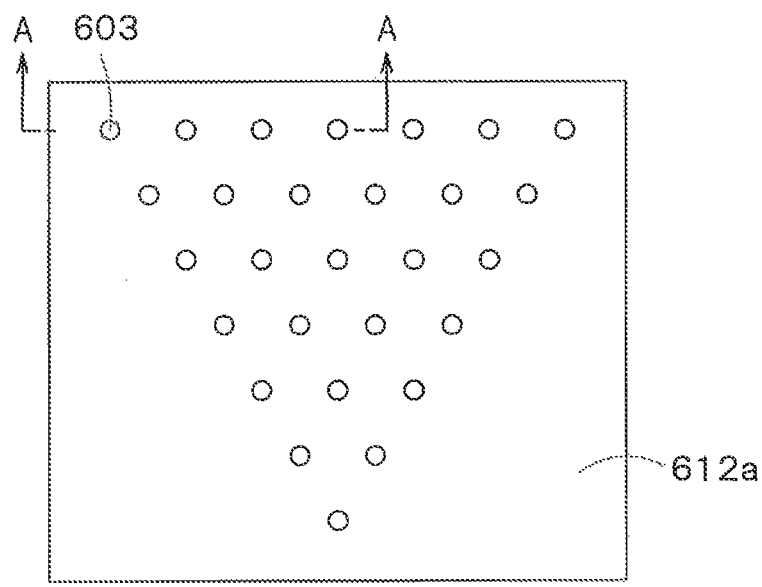
F I G. 31B

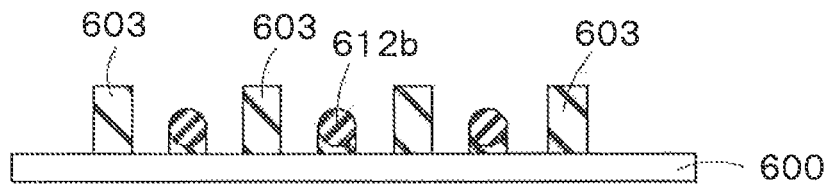
F I G. 32A
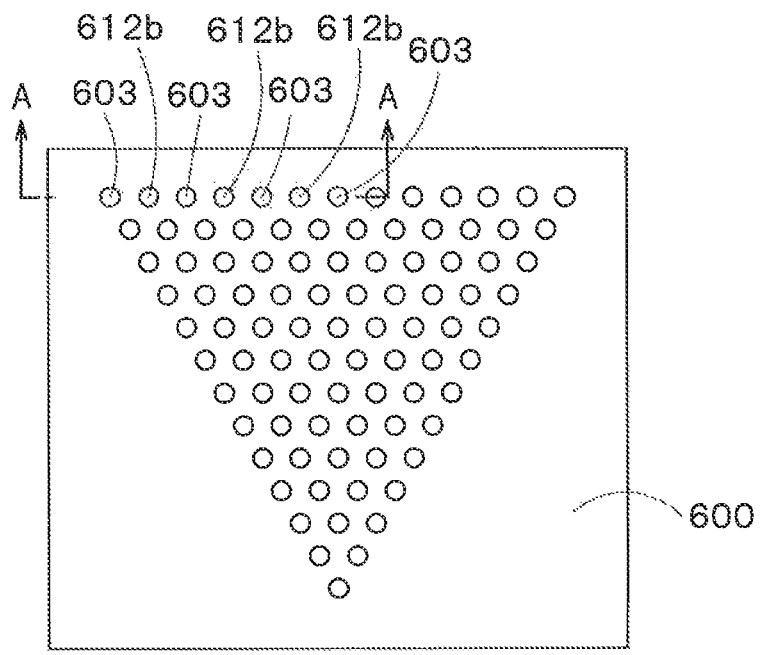
F I G. 32B

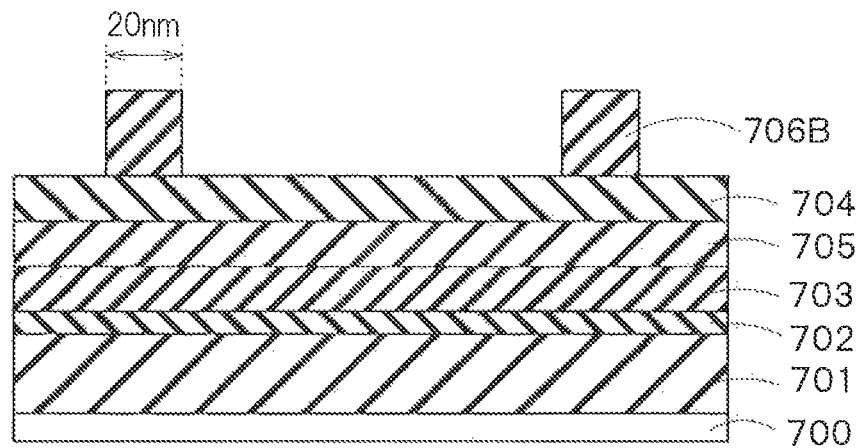
F I G. 34A
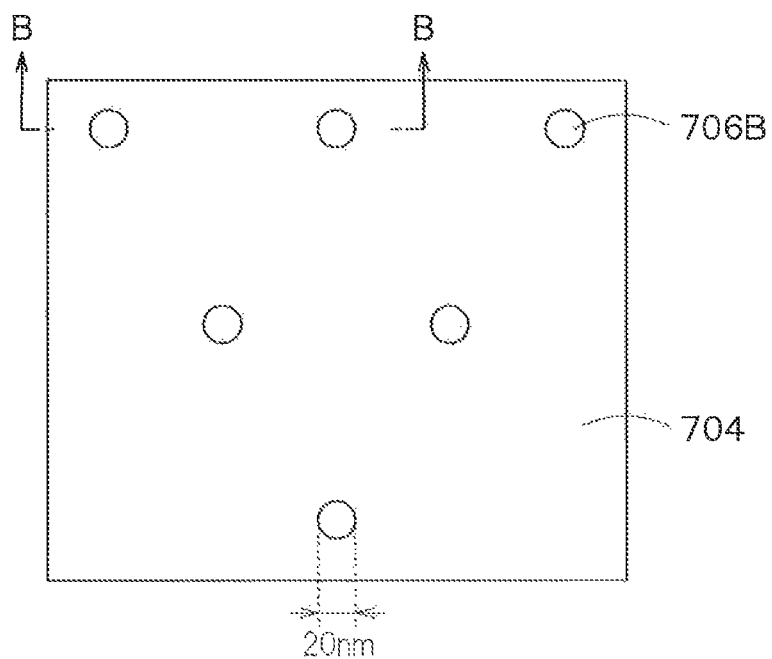
F I G. 34B

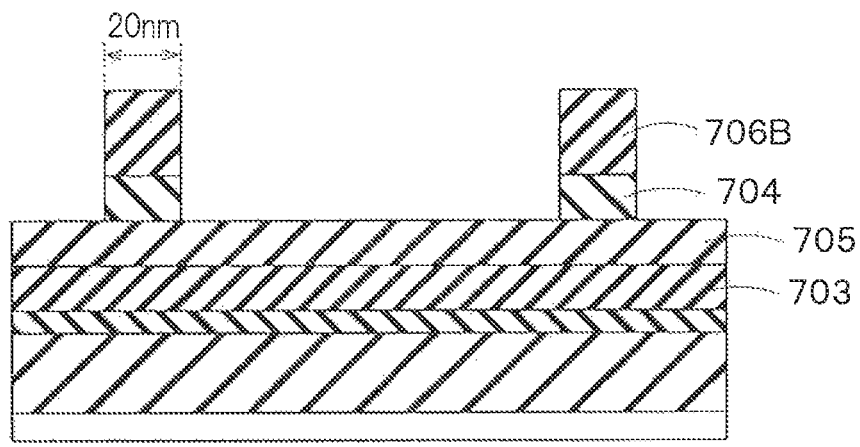
F I G. 35A
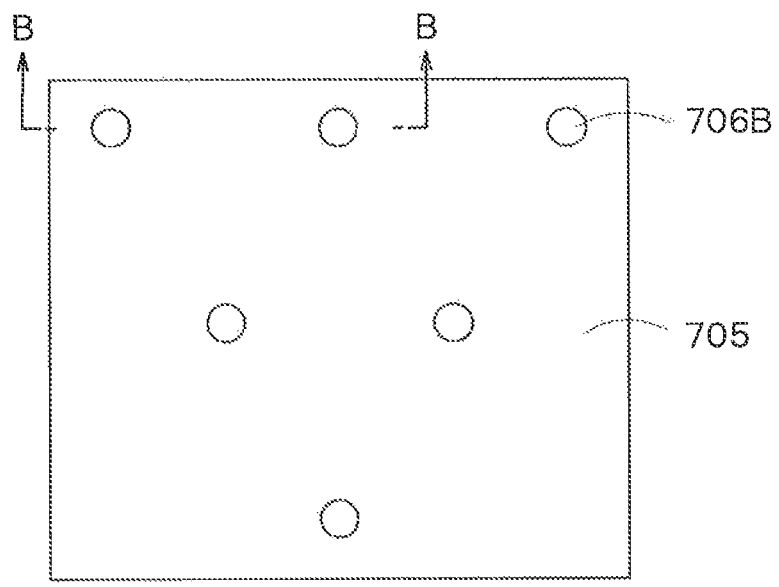
F I G. 35B

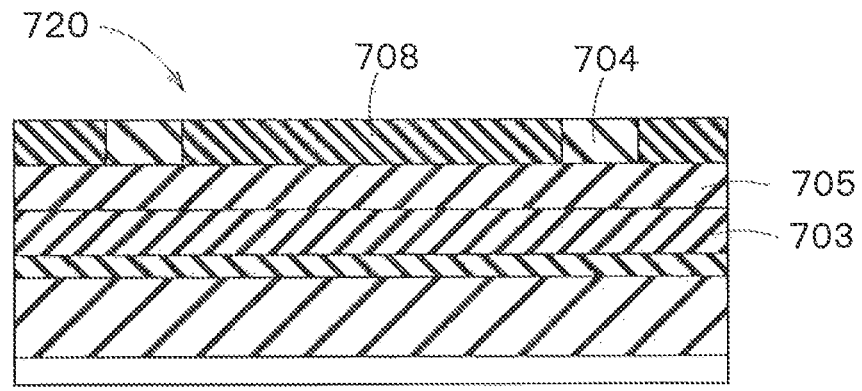
F I G. 37A
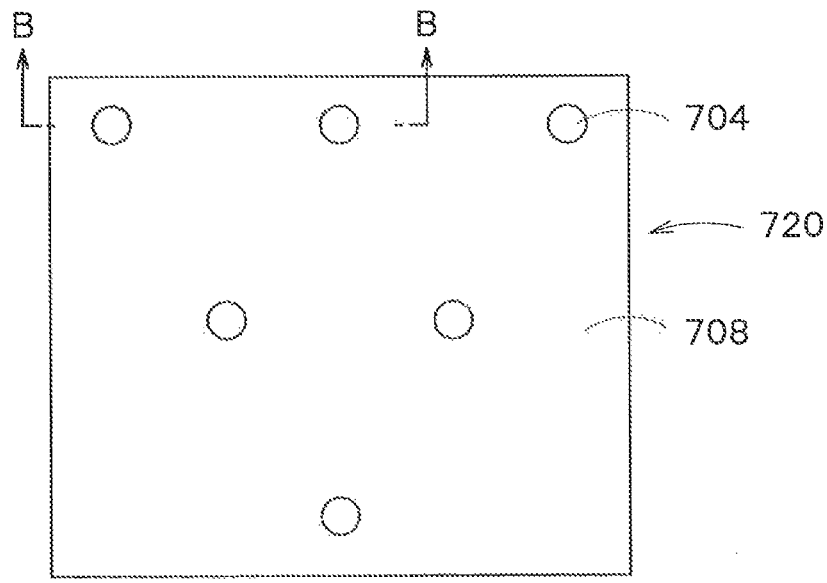
F I G. 37B

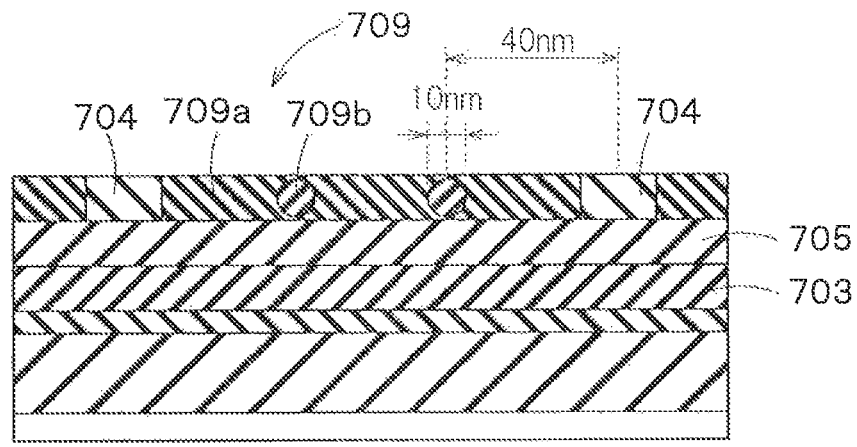
F I G. 38A
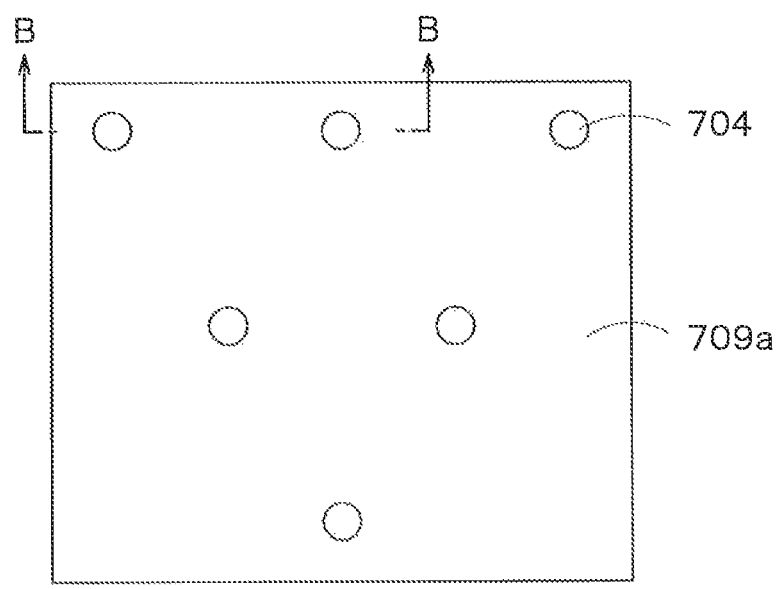
F I G. 38B

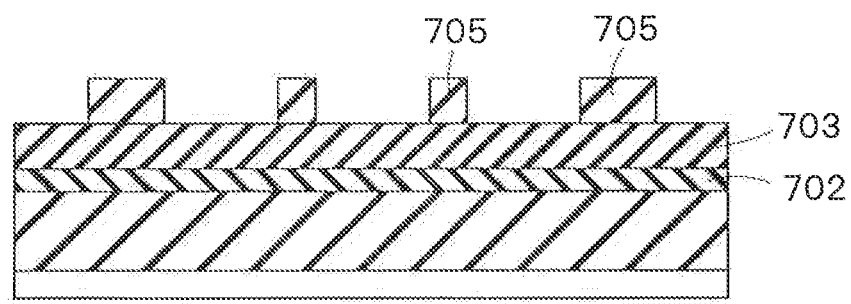
F I G. 40A
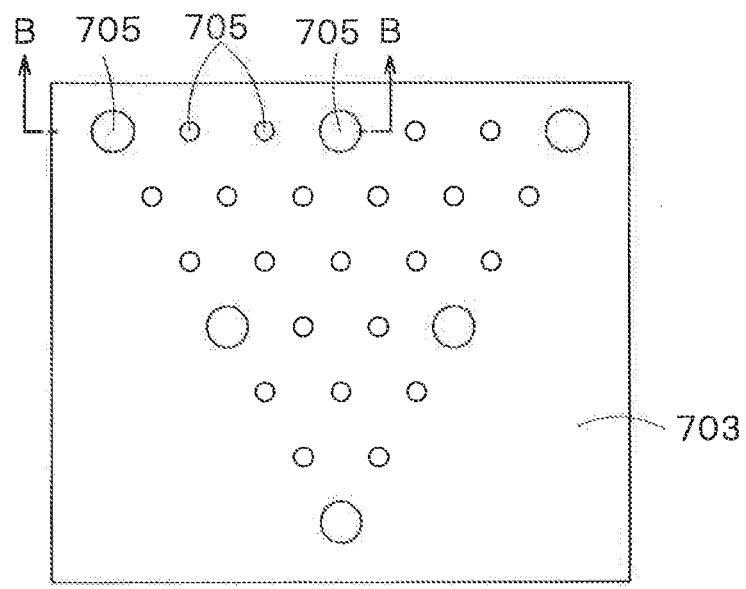
F I G. 40B

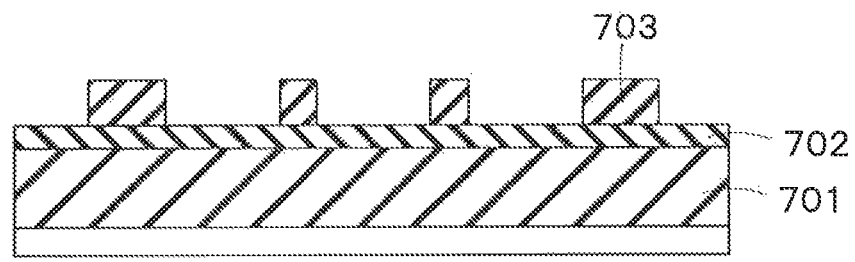
F I G. 41A
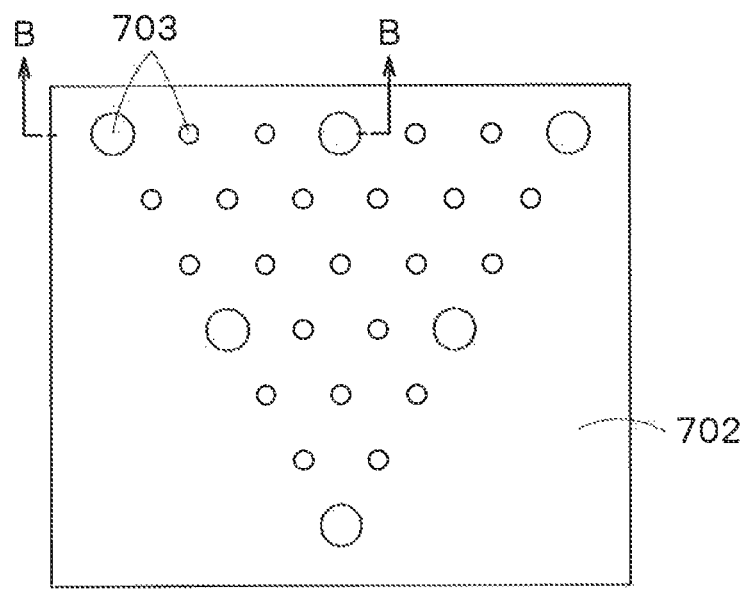
F I G. 41B

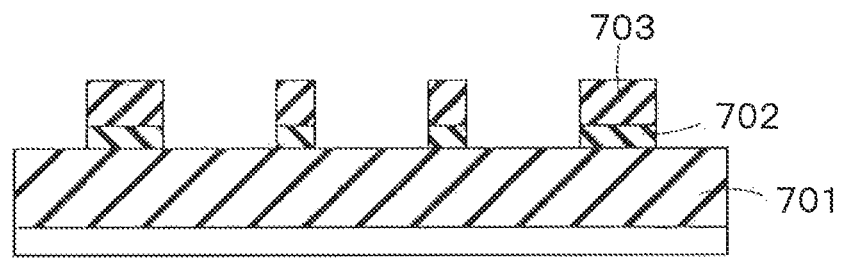
F I G. 42A
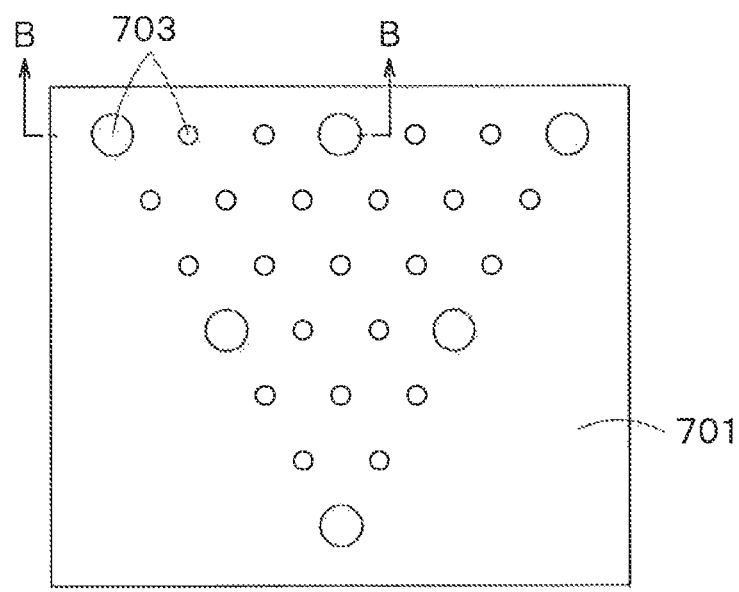
F I G. 42B

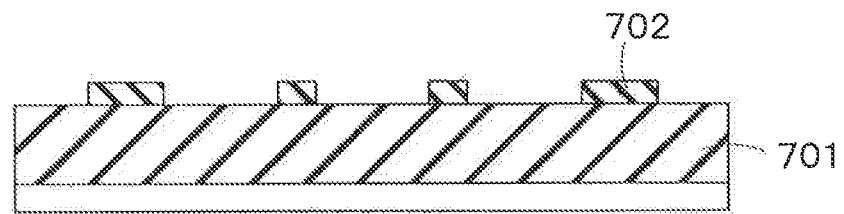
F I G. 43A
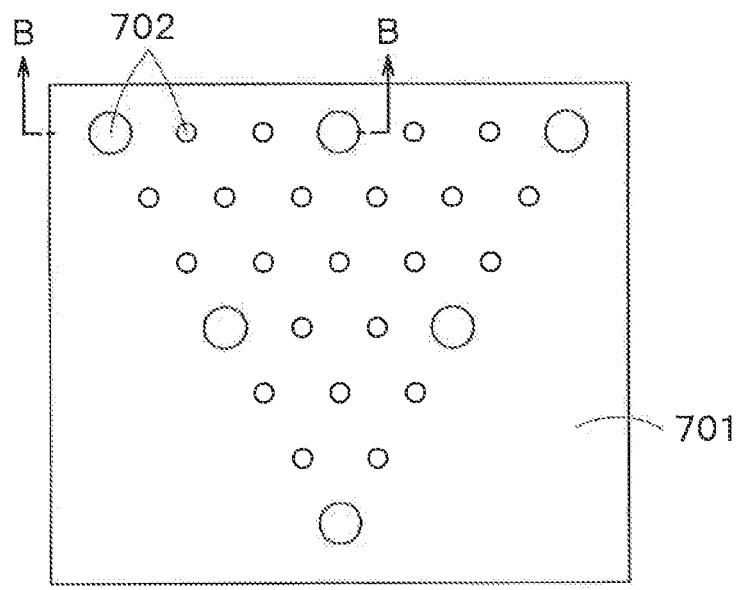
F I G. 43B

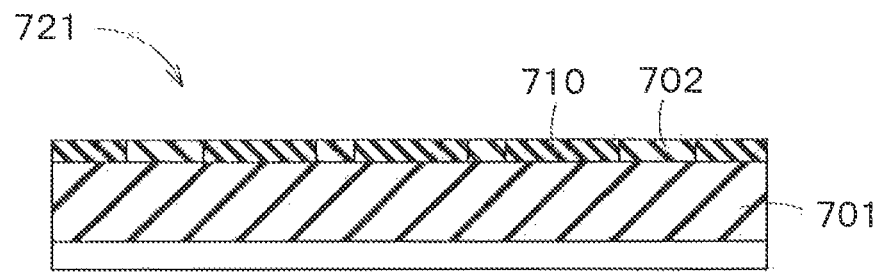
F I G. 44A
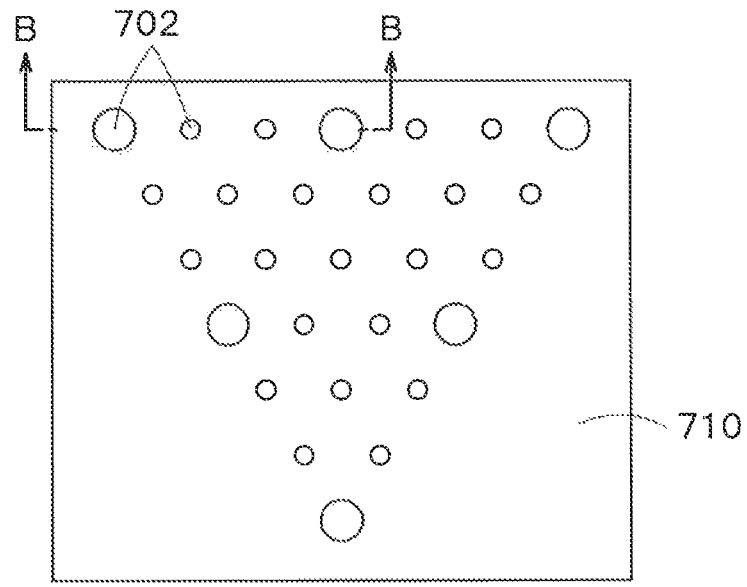
F I G. 44B

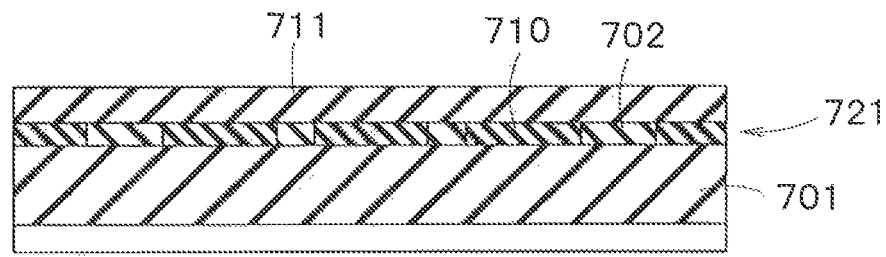
F I G. 45A
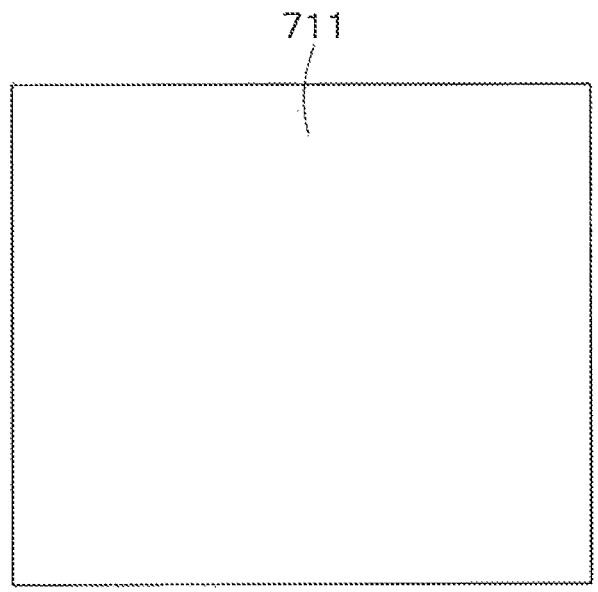
F I G. 45B

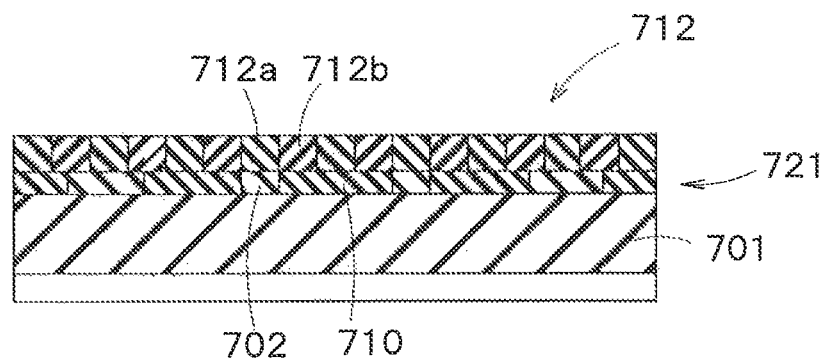
F I G. 46A
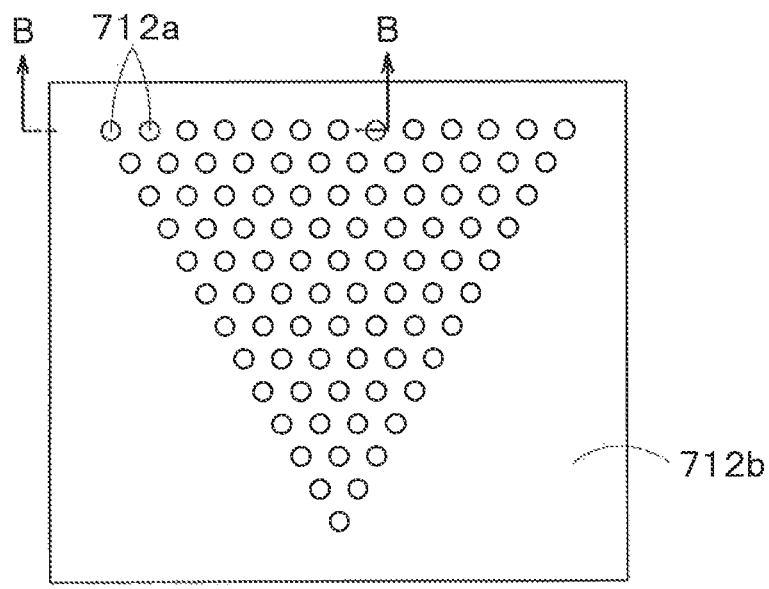
F I G. 46B

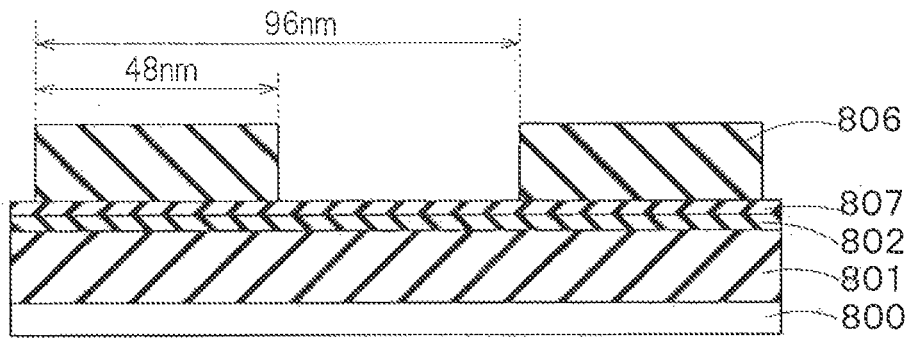
F I G. 47A
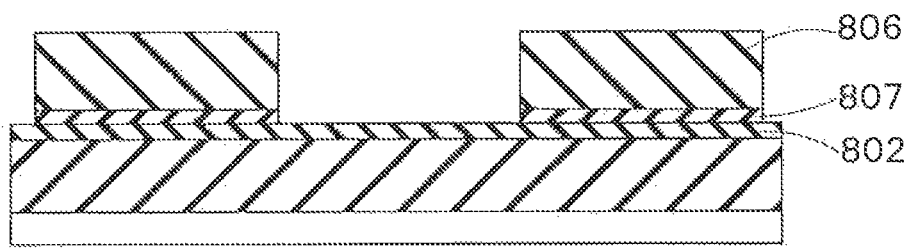
F I G. 47B
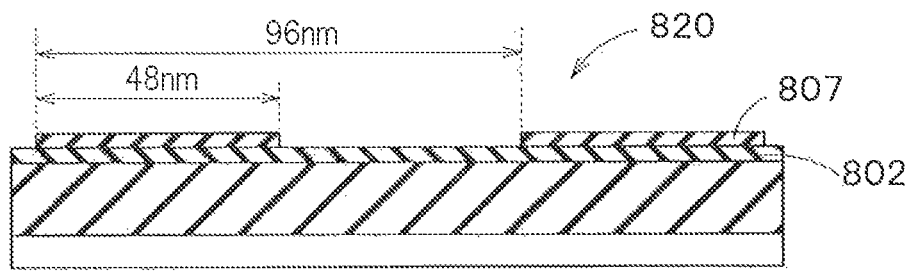
F I G. 47C

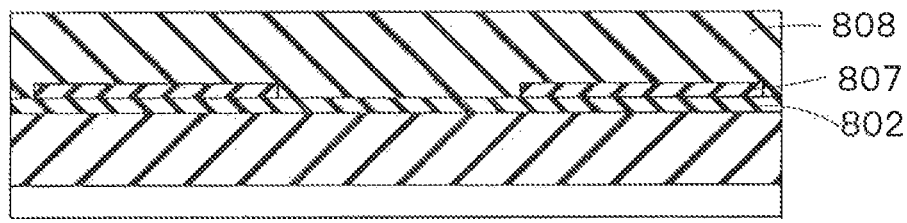
F I G. 48A
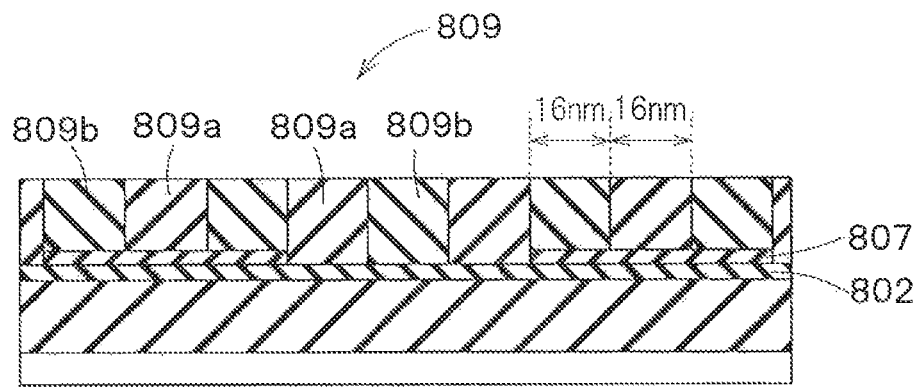
F I G. 48B
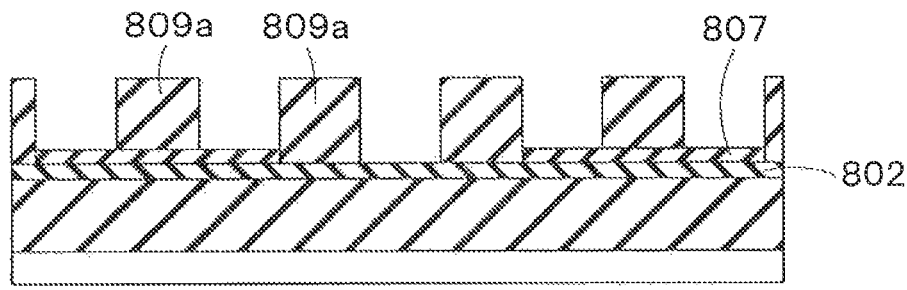
F I G. 48C

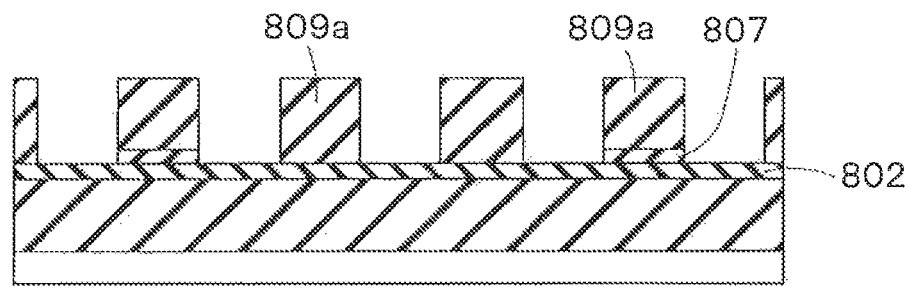
F I G. 49A
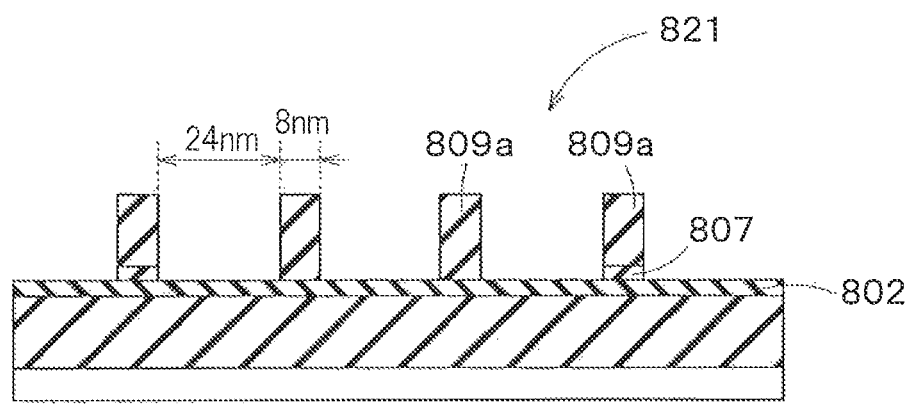
F I G. 49B

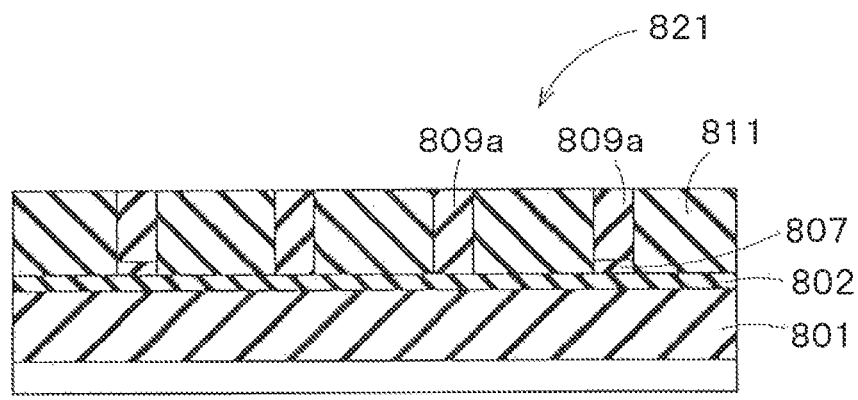
F I G. 50A
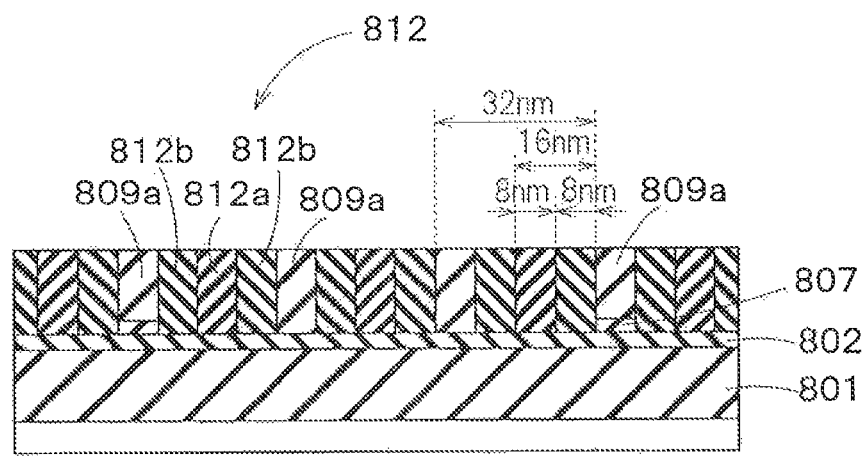
F I G. 50B
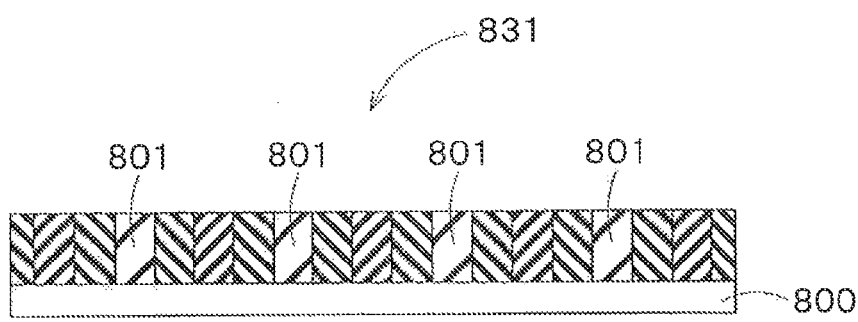
F I G. 51

PATTERN FORMING METHOD

CROSS REFERENCE TO RELATED APPLICATION

This application is based upon and claims benefit of priority from the Japanese Patent Application No. 2013-66502, filed on Mar. 27, 2013, the entire contents of which are incorporated herein by reference.

FIELD

Embodiments described herein relate generally to a pattern forming method.

BACKGROUND

As next generation candidates for a lithography technique used during a manufacturing process of a semiconductor element, there have been known a double patterning technique using ArF immersion exposure, EUV lithography, nanoimprinting, and so on. These lithography techniques include various problems such as increase in cost and reduction in throughput caused by miniaturization of a pattern.

Under such a situation, application of self-assembly (DSA: Directed Self-assembly) process to the lithography technique has been expected. The self-assembly is induced by such an autonomous behavior as energy stabilization, so that a pattern with high dimensional accuracy can be formed. Particularly, in the techniques using microphase separation of a polymeric block copolymer, periodical structures having various shapes with a size of several to several hundred nm (nanometer) can be formed by simple coating and an annealing process. The form of the polymeric block copolymer is changed into a spherical shape, a cylindrical shape, a lamellar shape, or the like based on a composition ratio of a block of the polymeric block copolymer, and the size of the polymeric block copolymer is changed based on a molecular weight, whereby a dot pattern, a hole or pillar pattern, a line pattern, and so on having various sizes can be formed.

In order to form a desired pattern over a wide range with the use of DSA, a guide for controlling an occurrence position of a polymer phase formed by self-assembly is required to be provided. As the guide, there have been known a physical guide (graphoepitaxy) having a concavoconvex structure with respect to a substrate surface and forming a microphase separation pattern in a space pattern and a chemical guide (chemo epitaxy) formed in a lower layer of a DSA material and controlling a microphase separation pattern formation position based on a difference in the interfacial surface energy.

The microphase separation pattern is formed with respect to a previously formed guide pattern. Thus, in order to form an extremely fine microphase separation pattern, formation of a guide pattern including a fine pattern is required. However, it has been difficult to form the guide pattern including the fine pattern.

The chemical guide has a first pattern member (hereinafter referred to as a neutralization layer) whose interfacial surface energy against a first segment of a self-assembly (DSA) polymer is the same as the interfacial surface energy against a second segment of the DSA polymer and a second pattern member (hereinafter referred to as a pinning layer) whose interfacial surface energy against the first segment is different from the interfacial surface energy against the second segment, and the first and second pattern members are formed into a predetermined pattern.

Since the pinning layer has a high affinity for one of the segments of the self-assembly polymer, only the segment is drawn to the pinning layer. The use of this phenomenon can realize the disposition of a polymer phase at a desired position. This is the principle of a position control using the chemical guide.

Since the position control of the DSA pattern significantly depends on the pattern of the pinning layer, the pinning layer is required to have high pattern accuracy.

For example, it is desirable that the width of the pattern of the pinning layer is comparable to the width of the DSA pattern. However, it is extremely difficult to form a pattern, which is comparable to a resolution desired to be achieved in DSA, with the use of optical lithography. Thus, there has been known a method of applying slimming treatment to a pattern previously formed by the optical lithography and thereby obtaining a pinning layer pattern having a desired pattern width. However, in this method, LER (Line Edge Roughness) and LWR (Line Width Roughness) become problems.

When the pinning layer pattern is formed by the optical lithography, the pitch of the pinning layer pattern cannot exceed the resolution limit of the optical lithography, and therefore, the pitch of the pinning layer pattern is significantly increased relative to the pitch of the polymer phase of the DSA pattern, so that the position control accuracy as the chemical guide is reduced.

It is preferable that the pitch of the pinning layer pattern is n times (n is natural number) the pitch of the DSA pattern. Presently, a chemical guide in which n=4 has been proposed. However, the smaller n (the smaller the pitch of the chemical guide), the higher the position control accuracy as the chemical guide; therefore, the formation of a chemical guide having a small pitch and a fine pattern is required.

The miniaturization of the width and pitch of the pinning layer pattern are required in a physical guide as well as the chemical guide. In the method of pattern formation using the physical guide, when the DSA pattern is formed using a block copolymer, there is a problem that a line-and-space pattern in which the line width:the space width is 1:1 cannot be formed.

BRIEF DESCRIPTION OF THE DRAWINGS

FIGS. 1A to 5C are views for explaining a pattern forming method according to a first embodiment;

FIGS. 6A to 10B are views for explaining a pattern forming method according to a second embodiment;

FIGS. 11A to 15C are views for explaining a pattern forming method according to a third embodiment;

FIGS. 16A to 18C are views for explaining a pattern forming method according to a fourth embodiment;

FIGS. 19A to 22B are views for explaining a pattern forming method according to a fifth embodiment;

FIGS. 23A to 32B are views for explaining a pattern forming method according to a sixth embodiment;

FIGS. 33A to 46B are views for explaining a pattern forming method according to a seventh embodiment;

FIGS. 47A to 50B are views for explaining a pattern forming method according to an eighth embodiment; and FIG. 51 is a view for explaining a pattern forming method according to a variation of the eighth embodiment.

DETAILED DESCRIPTION

According to one embodiment, a pattern forming method includes forming a first guide layer on a processed film, phase-separating a first self-assembly material with the use of the first guide layer to form a first self-assembly pattern including a first polymer portion and a second polymer portion, selectively removing the first polymer portion, forming a second guide layer with the use of the second polymer portion, and phase-separating a second self-assembly material with the use of the second guide layer to form a second self-assembly pattern including a third polymer portion and a fourth polymer portion.

Embodiments will now be explained with reference to the accompanying drawings.

First Embodiment

A pattern forming method according to a first embodiment will be described using FIGS. 1 to 5.

Figure 1A:
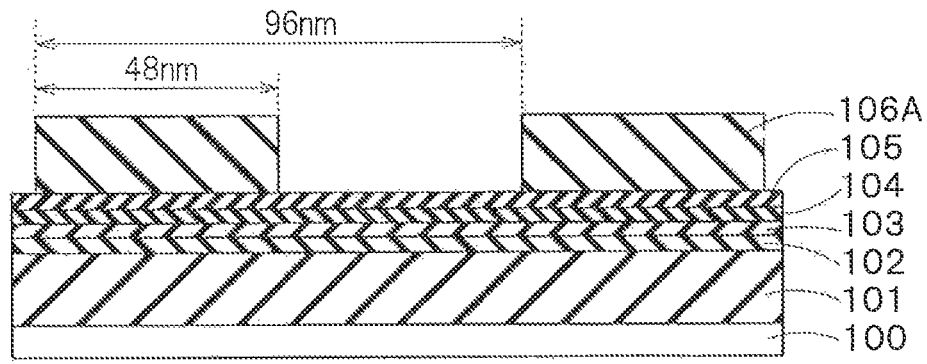

First, as shown in FIG. 1A, a processed film 101, a silicon oxide film 102, a first cross-linkable polystyrene (hereinafter referred to as X-PS) film 103, a silicon nitride film 104, and a second X-PS film 105 are sequentially formed on a semiconductor substrate 100 such as silicon wafer. The processed film 101 is, for example, an SOC (Spin on Carbon, coating type carbon) film having a film thickness of 100 nm. The silicon oxide film 102 has a film thickness of 20 nm, for example. The first X-PS film 103 has a film thickness of 7 nm, for example. An X-PS material is rotationally coated onto the silicon oxide film 102 and subjected to baking treatment (heating treatment) for 90 minutes at 250° C., whereby the first X-PS film 103 is formed. The silicon nitride film 104 has a film thickness of 20 nm, for example. The second X-PS film 105 has a film thickness of 7 nm, for example. An X-PS material is rotationally coated onto the silicon nitride film 104 and subjected to baking treatment (heating treatment) for 90 minutes at 250° C., whereby the second X-PS film 105 is formed. The X-PS material has a high affinity for polystyrene.

Subsequently, resist having a film thickness of 100 nm is rotationally coated onto the second X-PS film 105 to be exposed by an ArF excimer laser, and, thus, to be subjected to development processing, whereby a resist pattern 106A having a line-and-space shape having a pitch width of 96 nm is formed. In the resist pattern 106A, a width of a line portion and a width of a space portion are 48 nm.

Figure 1B:
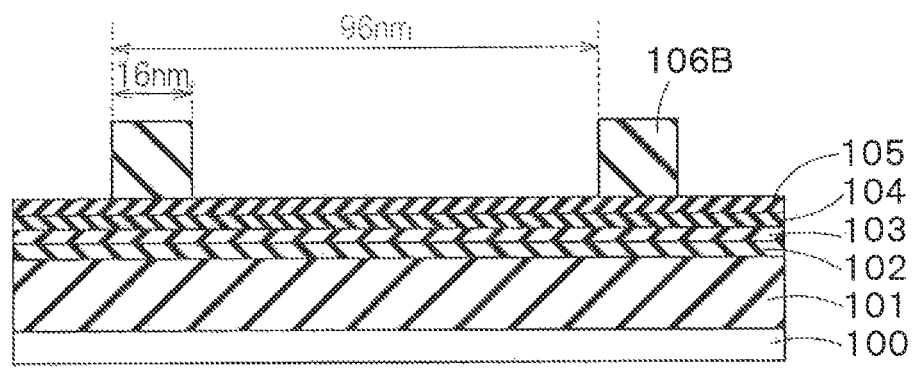

Next, as shown in FIG. 1B, the resist pattern 106A is slimmed by oxygen RIE (reactive ion etching). According to this constitution, a resist pattern 106B in which the width of the line portion is 16 nm is obtained.

Figure 1C:
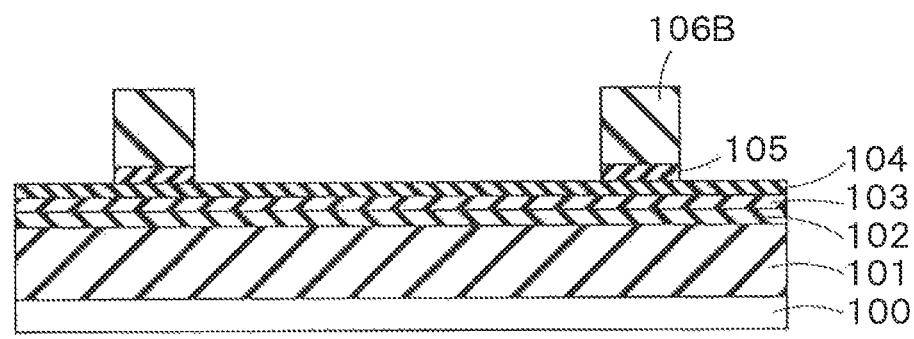

Next, as shown in FIG. 1C, the second X-PS film 105 is processed by RIE, using the resist pattern 106B as a mask. According to this constitution, a pattern shape of the resist pattern 106B is transferred onto the second X-PS film 105.

Next, as shown in FIG. 2A, the resist pattern 106B is peeled with thinner. The second X-PS film 105 has a line-and-space shape in which the width of the line portion is 16 nm.

Next, as shown in FIG. 2B, a neutralization film 107 is formed on a space portion of the second X-PS film 105, that is, the silicon nitride film 104 whose surface is exposed. For example, P(S-rMMA)-OH) is rotationally coated to be subjected to baking treatment for 5 minutes at 250° C., whereby the neutralization film 107 can be formed in a region where the second X-PS film 105 is not formed. The second X-PS film 105 and the neutralization film 107 become a chemical guide layer 120 in microphase separation of a self-assembly material to be described later.

Next, as shown in FIG. 2C, a block copolymer layer (self-assembly material layer) 108 is formed on the chemical guide layer 120. For example, there is used a block copolymer (PS-b-PMMA) of polystyrene (PS) and polymethylmethacrylate (PMMA), whose molecular weight and composition ratio are regulated so that the block copolymer is phase-separated into a lamellar structure in which the width of each phase is 16 nm. A propylene glycol monomethyl ether acetate (PGMEA) solution of the block copolymer is adjusted to a concentration of 2.0 wt % and rotationally coated onto the chemical guide layer 120 with a rotation number of 1500 rpm, whereby a block copolymer layer 108 is formed.

Next, as shown in FIG. 3A, the block copolymer layer 108 is microphase-separated. By virtue of the microphase separation, a self-assembly pattern 109 having a lamellar structure constituted of a first polymer portion 109a having PS and a second polymer portion 109b having PMMA is formed.

When the block copolymer layer 108 is a block copolymer of polystyrene (PS) and polymethylmethacrylate (PMMA), PS has a high affinity for the second X-PS film 105 provided under the block copolymer layer 108. Thus, the second X-PS film 105 is a pinning region, and a first polymer portion 109a is selectively formed on the second X-PS film 105. Since the first polymer portion 109a and a second polymer portion 109b each having a width of 16 nm are alternatively arranged, the first polymer portion 109a is formed on the neutralization film (neutral region) 107.

The pitch of the self-assembly pattern 109 (a total width of the first and second polymer portions 109a and 109b) is 32 nm. Meanwhile, the pitch of the chemical guide layer 120 (a total width of the second X-PS film 105 and the neutralization film 107) is 96 nm. Accordingly, it can be shown that the self-assembly pattern 109 having a pitch ⅓ times the pitch of the chemical guide layer 120 is obtained.

The block copolymer layer 108 is microphase-separated by heating, for example. For example, a laminate formed with the block copolymer layer 108 is baked for 90 seconds at 110° C. in a hot plate and then subjected to annealing treatment for 3 minutes at 220° C. under a nitrogen ($N_2$) atmosphere, whereby the block copolymer layer 108 is microphase-separated.

Next, as shown in FIG. 3B, the second polymer portion 109b having PMMA is selectively removed by dry etching. The first polymer portion 109a having PS remains.

Next, as shown in FIG. 3C, the neutralization film 107 under the second polymer portion 109b is etched, using the first polymer portion 109a as a mask, and the first polymer portion 109a and the second X-PS film 105 and the neutralization film 107 under the first polymer portion 109a are slimmed. According to this constitution, the first polymer portion 109a has a width of 8 nm, and a distance between the first polymer portions 109a adjacent to each other (a width of a space portion) is 24 nm.

Next, as shown in FIG. 4A, the silicon nitride film 104 is processed by RIE, using the first polymer portion 109a as a mask. According to this constitution, a pattern shape of the first polymer portion 109a is transferred onto the silicon nitride film 104. After that, the first polymer portion 109a and the second X-PS film 105 and the neutralization film 107 under the first polymer portion 109a are removed.

Next, as shown in FIG. 4B, the first X-PS film 103 is processed by RIE, using the silicon nitride film 104 as a mask. According to this constitution, a pattern shape of the silicon nitride film 104 is transferred onto the first X-PS film 103.

Next, as shown in FIG. 4C, the silicon nitride film 104 is removed by wet etching.

Next, as shown in FIG. 5A, a neutralization film 110 is formed on a space portion of the first X-PS film 103, that is, the silicon oxide film 102 whose surface is exposed. For example, P(S-rMMA)-OH) is rotationally coated to be subjected to baking treatment for 5 minutes at 250° C., whereby the neutralization film (neutral region) 110 can be formed in a region where the first X-PS film 103 is not formed. The first X-PS film 103 and the neutralization film 110 become a chemical guide layer 121 in the microphase separation of a self-assembly material to be described later.

Next, as shown in FIG. 5B, a block copolymer layer (self-assembly material layer) 111 is formed on the chemical guide layer 121. For example, there is used a block copolymer (PS-b-PMAPOSS) of polystyrene (PS) and polyhedral oligomeric silsesquioxane (POSS)-containing polymethacrylate (PMAPOSS), whose molecular weight and composition ratio are regulated so that the block copolymer is phase-separated into a lamellar structure in which the width of each phase is 8 nm. A cyclopentanone solution of the block copolymer is adjusted to a concentration of 1.0 wt % and rotationally coated onto the chemical guide layer 121 with a rotation number of 1500 rpm, whereby a block copolymer layer 111 is formed.

Next, as shown in FIG. 5C, the block copolymer layer 111 is microphase-separated. By virtue of the microphase separation, a self-assembly pattern 112 having a lamellar structure constituted of a first polymer portion 112a having PS and a second polymer portion 112b having PMAPOSS is formed.

When the block copolymer layer 111 is a block copolymer of PS and PMAPOSS, PS has a high affinity for the second X-PS film 103 provided under the block copolymer layer 111. Thus, the first X-PS film 103 is a pinning region, and a first polymer portion 112a is selectively formed on the first X-PS film 103. Since the first polymer portion 112a and a second polymer portion 112b each having a width of 8 nm are alternately arranged, the first polymer portion 112a is formed on the neutralization film (neutral region) 110.

The pitch of the self-assembly pattern 112 (a total width of the first and second polymer portions 112a and 112b) is 16 nm. Meanwhile, the pitch of the chemical guide layer 121 (a total width of the first X-PS film 105 and the neutralization film 110) is 32 nm. Accordingly, it can be shown that the self-assembly pattern 112 having a pitch ½ times the pitch of the chemical guide layer 121 is obtained.

The block copolymer layer 111 is microphase-separated by heating, for example. For example, when solvent annealing treatment is performed under an acetone vapor atmosphere, the block copolymer layer 111 is microphase-separated.

After that, one of the first and second polymer portions 112a and 112b, illustration of which will be omitted here, is selectively removed, and the silicon oxide film 102 and the processed film 101 are processed using the other polymer portion as a mask. According to this constitution, the processed film 101 can be formed into a fine pattern.

According to this embodiment, the chemical guide layer 120 based on the pattern shape of the slimmed resist pattern 106B is formed, and the self-assembly pattern 109 including the first and second polymer portions 109a and 109b is formed using the chemical guide layer 120. Then, the chemical guide layer 121 having a fine pattern shape based on the slimmed first polymer portion 109a is formed. The extremely fine self-assembly pattern 112 is then formed with high positional accuracy, using the chemical guide layer 121.

As described above, according to this embodiment, a guide pattern including a fine pattern is formed, and an extremely fine microphase separation pattern can be formed. Moreover, the accuracy of the formation position of the microphase separation pattern can be enhanced.

In the above embodiment, although the chemical guide layer in which the X-PS film is the pinning region and the P(S-rMMA)-OH)-containing neutralization film is the neutralization region (neutral region) is used, the method of chemical guide layer formation is not limited to this.

Second Embodiment

A pattern forming method according to a second embodiment will be described using FIGS. 6 to 10.

First, as shown in FIG. 6A, a processed film 201, a silicon oxide film 202, and a cross-linkable polystyrene (hereinafter referred to as X-PS) film 203 are sequentially formed on a semiconductor substrate 200 such as a silicon wafer. The processed film 201 is, for example, an SOC (Spin on Carbon, coating type carbon) film having a film thickness of 100 nm. The silicon oxide film 202 has a film thickness of 20 nm, for example. The X-PS film 203 has a film thickness of 7 nm, for example. An X-PS material is rotationally coated onto the silicon oxide film 202 and subjected to baking treatment (heating treatment) for 90 minutes at 250° C., whereby the X-PS film 203 is formed. The X-PS material has a high affinity for polystyrene.

Subsequently, resist having a film thickness of 100 nm is rotationally coated onto the X-PS film 203 to be exposed by an ArF excimer laser, and, thus, to be subjected to development processing, whereby a resist pattern 206A having a line-and-space shape having a pitch width of 96 nm is formed. In the resist pattern 206A, a width of a line portion and a width of a space portion are 48 nm.

Next, as shown in FIG. 6B, the resist pattern 206A is slimmed by oxygen RIE (reactive ion etching). According to this constitution, a resist pattern 206B in which the width of the line portion is 16 nm is obtained.

Next, as shown in FIG. 6C, the X-PS film 203 is processed by RIE, using the resist pattern 206B as a mask. According to this constitution, a pattern shape of the resist pattern 206B is transferred onto the X-PS film 203.

Next, as shown in FIG. 7A, the resist pattern 206B is peeled with thinner. The X-PS film 203 has a line-and-space shape in which the width of the line portion is 16 nm.

Next, as shown in FIG. 7B, a neutralization film 207 is formed on a space portion of the X-PS film 203, that is, the silicon oxide film 202 whose surface is exposed. For example, P(S-rMMA)-OH) is rotationally coated to be subjected to baking treatment for 5 minutes at 250° C., whereby the neutralization film 207 can be formed in a region where the X-PS film 203 is not formed. The X-PS film 203 and the neutralization film 207 become a chemical guide layer 220 in the microphase separation of a self-assembly material to be described later.

Next, as shown in FIG. 7C, a block copolymer layer (self-assembly material layer) 208 is formed on the chemical guide layer 220. For example, there is used a block copolymer (PS-b-PMMA) of polystyrene (PS) and polymethylmethacrylate (PMMA), whose molecular weight and composition ratio are regulated so that the block copolymer is phase-separated into a lamellar structure in which the width of each phase is 16 nm. A propylene glycol monomethyl ether acetate (PGMEA) solution of the block copolymer is adjusted to a concentration of 2.0 wt % and rotationally coated onto the chemical guide layer 220 with a rotation number of 1500 rpm, whereby a block copolymer layer 208 is formed.

Next, as shown in FIG. 8A, the block copolymer layer 208 is microphase-separated. By virtue of the microphase separation, a self-assembly pattern 209 having a lamellar structure constituted of a first polymer portion 209a having PS and a second polymer portion 209b having PMMA is formed.

When the block copolymer layer 208 is a block copolymer of polystyrene (PS) and polymethylmethacrylate (PMMA), PS has a high affinity for the X-PS film 203 provided under the block copolymer layer 208. Thus, the X-PS film 203 is a pinning region, and the first polymer portion 209a is selectively formed on the X-PS film 203. Since the first polymer portion 209a and a second polymer portion 209b each having a width of 16 nm are alternately arranged, the first polymer portion 209a is formed on the neutralization film (neutral region) 207.

The pitch of the self-assembly pattern 209 (a total width of the first and second polymer portions 209a and 209b) is 32 nm. Meanwhile, the pitch of the chemical guide layer 220 (a total width of the X-PS film 203 and the neutralization film 207) is 96 nm. Accordingly, it can be shown that the self-assembly pattern 209 having a pitch ⅓ times the pitch of the chemical guide layer 220 is obtained.

The block copolymer layer 208 is microphase-separated by heating, for example. For example, a laminate formed with the block copolymer layer 208 is baked for 90 seconds at 110° C. in a hot plate and then subjected to annealing treatment for 3 minutes at 220° C. under the $N_2$ atmosphere, whereby the block copolymer layer 208 is microphase-separated.

Next, as shown in FIG. 8B, the second polymer portion 209b having PMMA is selectively removed by dry etching. The first polymer portion 209a having PS remains.

Next, as shown in FIG. 8C, the first polymer portion 209a and the X-PS film 203 and the neutralization film 207 under the first polymer portion 209a are slimmed. According to this constitution, the first polymer portion 209a has a width of 8 nm, and a distance between the first polymer portions 209a adjacent to each other (a width of a space portion) is 24 nm. The first polymer portion 209a and the silicon oxide film 202 after slimming become a physical guide layer 221 in the microphase separation of a self-assembly material to be described later. The physical guide layer 221 has a concavoconvex structure. In this structure, the first polymer portion 209a corresponds to a protrusion, and a region between the first polymer portions 209a corresponds to a recess. In this case, the ratio between the widths of the protrusion and the recesses of the physical guide is 1:3.

Next, as shown in FIG. 9A, a blend polymer layer (self-assembly material layer) 211 is formed in the recess of the physical guide layer 221. The blend polymer used in this case is a blend polymer of polystyrene (PS) and polydimethylsiloxane (PDMS), whose molecular weight and composition ratio are regulated so that the blend polymer is phase-separated into a lamellar structure in which the width of each phase is 8 nm. The volume ratio of PS to PDMS is PS:PDMS=1:2. A propylene glycol monomethyl ether acetate (PGMEA) solution of the blend polymer is adjusted to a concentration of 2.0 wt % and rotationally coated to a recess of the physical guide layer 221 with a rotation number of 1500 rpm, whereby a blend polymer layer 211 is formed.

Next, as shown in FIG. 9B, the blend polymer layer 211 is microphase-separated. By virtue of the microphase separation, a self-assembly pattern 212 having a lamellar structure constituted of a first polymer portion 212a having PS and a second polymer portion 212b having PDMS is formed.

When the blend polymer layer 211 is a blend polymer of PS and PDMS, the second polymer portion 212b which is adjacent to a protrusion of the physical guide layer 221 (the first polymer portion 209a having PS) and has PDMS is formed. The second polymer portion 212b and the first polymer portion 212a held between the second polymer portions 212b are formed in the recess of the physical guide layer 221. The protrusion of the physical guide layer 221 and the self-assembly pattern 212 form a pattern in which the PS regions and the PDMS regions with a width of 8 nm are regularly arranged by 1:1.

The pitch of the self-assembly pattern 212 (a total width of the first and second polymer portions 212a and 212b) is 16 nm. The pitch of the physical guide layer 221 (a total width of the protrusion and the recess) is 32 nm. Accordingly, it can be shown that the self-assembly pattern 212 having a pitch ½ times the pitch of the physical guide layer 221 is obtained.

The blend polymer layer 211 is microphase-separated by heating, for example. For example, a laminate formed with the blend polymer layer 211 is baked for 1 minute at 110° C. in a hot plate and then subjected to annealing treatment for 1 minute at 170° C. under the $N_2$ atmosphere, whereby the blend polymer layer 211 is microphase-separated.

After that, any one of the PS region (the first polymer portion 209a and the first polymer portion 212a) and the PDMS region (the second polymer portion 212b), illustration of which will be omitted here, is selectively removed, and the silicon oxide film 202 and the processed film 201 are processed using the other region as a mask. According to this constitution, the processed film 201 can be formed into a fine pattern.

According to this embodiment, the chemical guide layer 220 based on the pattern shape of the slimmed resist pattern 206B is formed, and the self-assembly pattern 209 including the first and second polymer portions 209a and 209b is formed using the chemical guide layer 220. The slimmed first polymer portion 209a is utilized as the protrusion of the physical guide layer 221. The extremely fine self-assembly pattern 212 is then formed with high positional accuracy, using the physical guide layer 221.

As described above, according to this embodiment, a guide pattern including a fine pattern is formed, and an extremely fine microphase separation pattern can be formed. Moreover, the accuracy of the formation position of the microphase separation pattern can be enhanced.

In the second embodiment, the silicon oxide film 202 and the processed film 201 may be processed using the slimmed first polymer portion 209a (see, FIG. 8C) as a mask, as shown in FIG. 10A (drawing is modified). In this case, the processed film 201 and the semiconductor substrate 200 can be utilized as a physical guide layer. A self-assembly material layer is formed in a recess of the physical guide layer to be microphase-separated, whereby a self-assembly pattern 231 as shown in FIG. 10B (drawing is modified) can be formed. In FIG. 9A, before a process for coating the self-assembly material, a surface of the physical guide layer is treated if necessary, and, for example, the surface of the physical guide layer is exposed to one of homopolymers of the self-assembly material, or polymer brush, whereby the affinity for one of polymers contained in the self-assembly material may be enhanced. In this case, since an optimal width of the protrusion of the physical guide is different depending on materials to be exposed based on a thickness of a film formed on the surface of the physical guide, the protrusion is formed to have a required size if necessary.

In the above embodiment, although the chemical guide layer in which the X-PS film is the pinning region and the P(S-rMMA)-OH)-containing neutralization film is the neutralization region (neutral region) is used, the method of chemical guide layer formation is not limited to this.

Third Embodiment

A pattern forming method according to a third embodiment will be described using FIGS. 11 to 15.

First, as shown in FIG. 11A, a processed film 301 and a silicon oxide film 302 are sequentially formed on a semiconductor substrate 300 such as a silicon wafer. The processed film 301 is, for example, an SOC (Spin on Carbon, coating type carbon) film having a film thickness of 100 nm. The silicon oxide film 302 has a film thickness of 30 nm, for example.

Next, as shown in FIG. 11B, resist having a film thickness of 100 nm is rotationally coated onto the silicon oxide film 302 to be exposed by an ArF excimer laser, and, thus, to be subjected to development processing, whereby a resist pattern 306A having a line-and-space shape having a pitch width of 96 nm is formed. In the resist pattern 306A, a width of a line portion and a width of a space portion are 48 nm.

Next, as shown in FIG. 11C, the resist pattern 306A is slimmed by oxygen RIE (reactive ion etching). According to this constitution, a resist pattern 306B in which the width of the line portion is 12 nm is obtained.

Next, as shown in FIG. 12A, the silicon oxide film 302 is processed by RIE, using the resist pattern 306B as a mask. According to this constitution, a pattern shape of the resist pattern 306B is transferred onto the silicon oxide film 302.

Next, as shown in FIG. 12B, the resist pattern 306B is peeled with thinner. The silicon oxide film 302 has a line-and-space shape in which the width of the line portion is 12 nm. The silicon oxide film 302 and the processed film 301 become a physical guide layer 320 in the microphase separation of a self-assembly material to be described later. The physical guide layer 320 has a concavoconvex structure, and in this structure, the silicon oxide film 302 corresponds to a protrusion, and a region between the silicon oxide films 302 corresponds to a recess.

Next, as shown in FIG. 12C, a surface of the physical guide layer 320 is treated, and the surface having a high affinity for polydimethylsiloxane (PDMS) is formed. For example, the surface of the physical guide layer 320 is exposed to a homopolymer of PDMS or polymer brush, whereby the affinity for PDMS can be enhanced. At this time, a PDMS thin film (not shown) is formed on the surface of the physical guide 302, so that the width of the protrusion including the PDMS thin film is 14 nm.

Next, as shown in FIG. 13A, a block copolymer layer (self-assembly material layer) 308 is formed to fill the recess of the physical guide layer 320. For example, there is used a block copolymer (PS-b-PDMS) of polystyrene (PS) and polydimethylsiloxane (PDMS), whose molecular weight and composition ratio are regulated so that a horizontal cylindrical structure in which a cylinder diameter is 16 nm is formed by phase separation. A propylene glycol monomethyl ether acetate (PGMEA) solution of the block copolymer is adjusted to a concentration of 2.0 wt % and rotationally coated to the recess of the physical guide layer 320 with a rotation number of 1500 rpm, whereby a block copolymer layer 308 is formed.

Next, as shown in FIG. 13B, the block copolymer layer 308 is microphase-separated. By virtue of the microphase separation, a self-assembly pattern 309 constituted of a first polymer portion 309a having PS and a second polymer portion 309b having PDMS is formed. The second polymer portion 309b has a horizontal cylindrical structure with a cylinder diameter of 16 nm and is formed parallel to the silicon oxide film 302 having a line shape. The first polymer portion 309a is formed to enclose the second polymer portion 309b. Meanwhile, a PDMS thin film 309c is formed on a surface of the self-assembly pattern 309 (a boundary between a polymer layer and atmosphere).

In the recess of the physical guide layer 320, the first polymer portion 309a and the second polymer portion 309b are alternately arranged between the protrusions (between the silicon oxide films 302). In a direction (a left and right direction in the drawing) perpendicular to an extending direction of the second polymer portion 309b having the horizontal cylindrical structure, a distance between center points of the two second polymer portions 309b adjacent to each other is 32 nm.

The pitch of the self-assembly pattern 309 (the distance between the center points of the two adjacent second polymer portions 309b) is 32 nm. The pitch of the physical guide layer 320 (a distance between the centers of the protrusions) is 96 nm. Accordingly, it can be shown that the self-assembly pattern 309 having a pitch ⅓ times the pitch of the physical guide layer 320 is obtained.

The block copolymer layer 308 is microphase-separated by heating, for example. For example, a laminate formed with the block copolymer layer 308 is baked for 1 minute at 110° C. in a hot plate and then subjected to annealing treatment for 1 minute at 170° C. under the $N_2$ atmosphere, whereby the block copolymer layer 308 is microphase-separated.

Next, as shown in FIG. 13C, the PDMS thin film 309c formed at the interface with atmosphere is removed by etching.

Next, as shown in FIG. 14A, the first polymer portion 309b having PS is selectively removed by dry etching. The second polymer portion 309b having PDMS, the first polymer portion 309a located under the second polymer portion 309b, and the silicon oxide film 302 remain. At this time, a PDMS thin film (not shown) corresponding to the second polymer portion is formed on the surface of the silicon oxide film 302 which is a physical guide surface, and the line width is 16 nm.

Next, as shown in FIG. 14B, the processed film 301 is processed by RIE, using the second polymer portion 309b and the silicon oxide film 302 as masks.

Next, as shown in FIG. 14C, the second polymer portion 309b and the silicon oxide film 302 are peeled. At this time, the processed film 301 has a line-and-space shape whose line portion and space portion each have a width of 16 nm.

Next, as shown in FIG. 15A, the processed film 301 is slimmed by oxide RIE. According to this constitution, the width of the processed film 301 is 8 nm, and a distance between the processed films 301 adjacent to each other (a width of a space portion) is 24 nm. The processed film 301 and the semiconductor substrate 300 after slimming become a physical guide layer 321 in the microphase separation of a self-assembly material to be described later. The physical guide layer 321 has a concavoconvex structure. In this structure, the processed film 301 corresponds to a protrusion, and a region between the processed films 301 corresponds to a recess. In this case, the ratio between the widths of the protrusion and the recesses of the physical guide is 1:3.

Next, as shown in FIG. 15B, a blend polymer layer (self-assembly material layer) 311 is formed in the recess of the physical guide layer 321. The blend polymer used in this case is a blend polymer of polystyrene (PS) and polydimethylsiloxane (PDMS), whose molecular weight and composition ratio are regulated so that the blend polymer is phase-separated into a lamellar structure in which the width of each phase is 8 nm. The volume ratio of PS to PDMS is PS:PDMS=1:2. A propylene glycol monomethyl ether acetate (PGMEA) solution of the blend polymer is adjusted to a concentration of 2.0 wt % and rotationally coated to a recess of the physical guide layer 321 at a rate of 1500 rpm, whereby a blend polymer layer 311 is formed.

Next, as shown in FIG. 15C, the blend polymer layer 311 is microphase-separated. By virtue of the microphase separation, a self-assembly pattern 312 having a lamellar structure constituted of a first polymer portion 312a having PS and a second polymer portion 312b having PDMS is formed.

When the blend polymer layer 311 is a blend polymer of PS and PDMS, the second polymer portion 312b which is adjacent to a protrusion of the physical guide layer 321 and has PDMS is formed. The second polymer portion 312b and the first polymer portion 312a held between the second polymer portions 312b are formed in the recess of the physical guide layer 321. A pattern in which the PS regions and the PDMS regions with a width of 8 nm are regularly arranged is formed.

The pitch of the self-assembly pattern 312 (a total width of the first and second polymer portions 312a and 312b) is 16 nm. The pitch of the physical guide layer 321 (a total width of the protrusion and the recess) is 32 nm. Accordingly, it can be shown that the self-assembly pattern 312 having a pitch ½ times the pitch of the physical guide layer 321 is obtained.

The blend polymer layer 311 is microphase-separated by heating, for example. For example, a laminate formed with the blend polymer layer 311 is baked for 1 minute at 110° C. in a hot plate and then subjected to annealing treatment for 1 minute at 170° C. under the $N_2$ atmosphere, whereby the blend polymer layer 311 is microphase-separated.

According to this embodiment, the physical guide layer 320 based on the pattern shape of the slimmed resist pattern 306B is formed, and the self-assembly pattern 309 including the first polymer portion 309a and the second polymer portion 309b which has a horizontal cylindrical structure is formed using the chemical guide layer 320. Then, the processed film 301 onto which the pattern width of the second polymer portion 309b is transferred is slimmed to be used as a protrusion of the physical guide layer 321. The extremely fine self-assembly pattern 312 is then formed with high positional accuracy, using the physical guide layer 321.

As described above, according to this embodiment, a guide pattern including a fine pattern is formed, and an extremely fine microphase separation pattern can be formed. Moreover, the accuracy of the formation position of the microphase separation pattern can be enhanced.

In the third embodiment, in the process shown in FIG. 12C, although the surface of the physical guide layer 320 is treated by being exposed to the homopolymer of PDMS to which the OH group is added, the surface treatment may be performed by other methods if necessary. For example, the surface of the physical guide layer may be exposed to a homopolymer of PS to which the OH group is added, if necessary. In this case, since an optimal width of the protrusion of the physical guide is different depending on materials to be exposed, the protrusion is formed to have a required size if necessary. On the other hand, the surface treatment process of FIG. 12C itself may be omitted.

Similarly, before a process for coating the self-assembly material in FIG. 15B, the surface of the physical guide layer is treated if necessary, and, for example, the surface of the physical guide layer is exposed to one of homopolymers of the self-assembly material, or polymer brush, whereby the affinity for one of polymers contained in the self-assembly material may be enhanced.

Fourth Embodiment

A pattern forming method according to a fourth embodiment will be described using FIGS. 16 to 18.

First, as shown in FIG. 16A, a processed film 401 and a silicon oxide film 402 are sequentially formed on a semiconductor substrate 400 such as a silicon wafer. The processed film 401 is, for example, an SOC (Spin on Carbon, coating type carbon) film having a film thickness of 100 nm. The silicon oxide film 402 has a film thickness of 30 nm, for example.

Subsequently, resist having a film thickness of 100 nm is rotationally coated onto the silicon oxide film 402 to be exposed by an ArF excimer laser, and, thus, to be subjected to development processing, whereby a resist pattern 406A having a line-and-space shape having a pitch width of 96 nm is formed. In the resist pattern 406A, a width of a line portion and a width of a space portion are 48 nm.

Next, as shown in FIG. 16B, the resist pattern 406A is slimmed by oxygen RIE (reactive ion etching). According to this constitution, a resist pattern 406B in which the width of the line portion is 24 nm and the width of the space portion is 72 nm is obtained. The resist pattern 406B and the silicon oxide film 402 become a physical guide layer 420 in the microphase separation of a self-assembly material to be described later. The physical guide layer 420 has a concavoconvex structure. In this structure, a line portion of the resist pattern 406B corresponds to a protrusion, and a space portion of the resist pattern 406B corresponds to a recess. In this case, the ratio between the widths of the protrusion and the recesses of the physical guide is 1:3.

Next, as shown in FIG. 16C, a blend polymer layer (self-assembly material layer) 408 is formed in the recess of the physical guide layer 420. The blend polymer used in this case is a blend polymer of polystyrene (PS) and polydimethylsiloxane (PDMS), whose molecular weight and composition ratio are regulated so that the blend polymer is phase-separated into a lamellar structure in which the width of each phase is 24 nm. The volume ratio of PS to PDMS is PS:PDMS=1:2. A propylene glycol monomethyl ether acetate (PGMEA) solution of the blend polymer is adjusted to a concentration of 2.0 wt % and rotationally coated to a recess of the physical guide layer 420 with a rotation number of 1500 rpm, whereby a blend polymer layer 408 is formed.

Figure 17A:
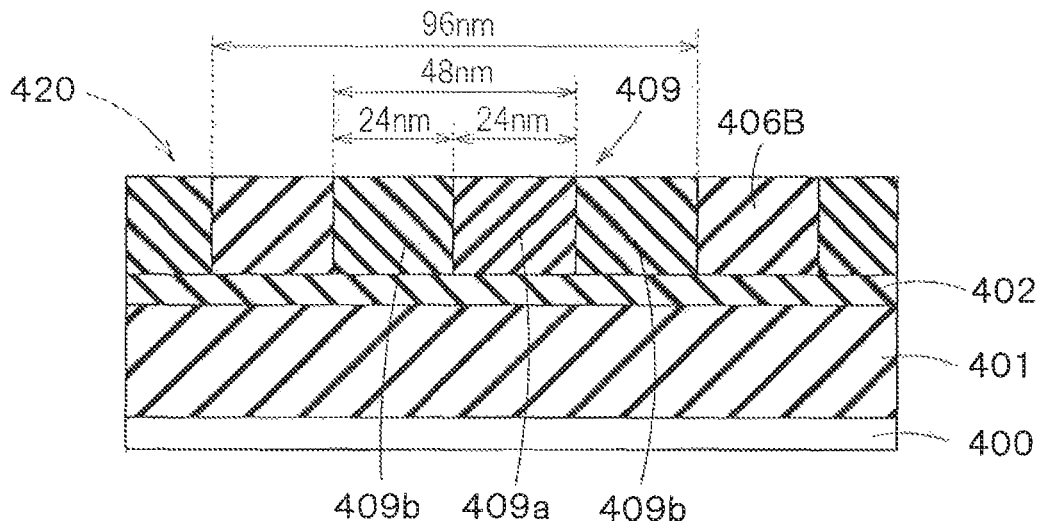

Next, as shown in FIG. 17A, the blend polymer layer 408 is microphase-separated. By virtue of the microphase separation, a self-assembly pattern 409 having a lamellar structure constituted of a first polymer portion 409a having PS and a second polymer portion 409b having PDMS is formed.

When the blend polymer layer 408 is a blend polymer of PS and PDMS, the second polymer portion 409b which is adjacent to a protrusion of the physical guide layer 420 and has PDMS is formed. The second polymer portion 409b and the first polymer portion 409a held between the second polymer portions 409b are formed in the recess of the physical guide layer 420. A pattern in which the PS regions and the PDMS regions with a width of 24 nm are regularly arranged is formed.

The pitch of the self-assembly pattern 409 (a total width of the first and second polymer portions 409a and 409b) is 48 nm. The pitch of the physical guide layer 420 (a total width of the protrusion and the recess) is 96 nm. Accordingly, it can be shown that the self-assembly pattern 409 having a pitch ½ times the pitch of the physical guide layer 420 is obtained.

The blend polymer layer 408 is microphase-separated by heating, for example. For example, a laminate formed with the blend polymer layer 408 is baked for 1 minute at 110° C. in a hot plate and then subjected to annealing treatment for 1 minute at 170° C. under the $N_2$ atmosphere, whereby the blend polymer layer 408 is microphase-separated.

Figure 17B:
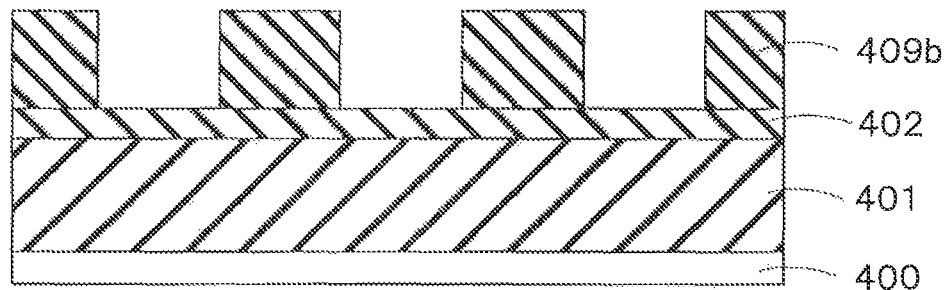

Next, as shown in FIG. 17B, the first polymer portion 409a and a protrusion (resist pattern 406B) of the physical guide layer 420 are selectively removed. The second polymer portion 409b remains to form a line-and-space shape.

Figure 17C:
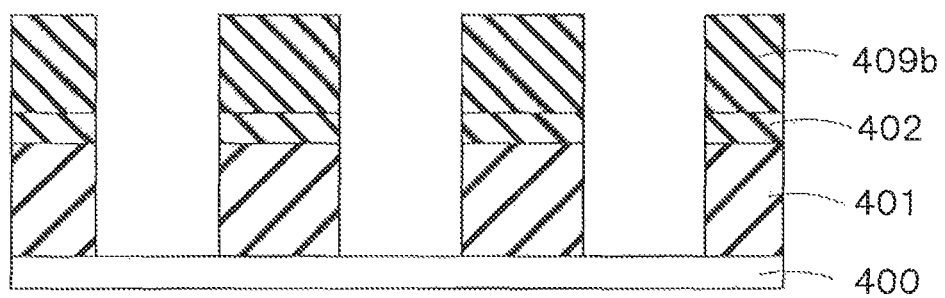

Next, as shown in FIG. 17C, the silicon oxide film 402 and the processed film 401 are processed by RIE, using the second polymer portion 409b as a mask.

Next, as shown in FIG. 18A, the second polymer portion 409b and the silicon oxide film 402 are removed. After that, the second polymer portion 409b is slimmed by oxygen RIE to have a width of 12 nm. According to this constitution, the second polymer portion 409b has a line-and-space shape in which the width of the line portion is 12 nm and the width of the space portion is 36 nm. According to this constitution, the processed film 401 has a line-and-space shape in which the width of the line portion is 12 nm and the width of the space portion is 36 nm. The processed film 401 and the semiconductor substrate 400 become a physical guide layer 421 in the microphase separation of a self-assembly material to be described later. The physical guide layer 421 has a concavoconvex structure. In this structure, the processed film 401 corresponds to a protrusion, and a region between the processed films 401 corresponds to a recess. In this case, the ratio between the widths of the protrusion and the recesses of the physical guide is 1:3.

Next, as shown in FIG. 18B, a blend polymer layer (self-assembly material layer) 411 is formed in the recess of the physical guide layer 421. The blend polymer used in this case is a blend polymer of polystyrene (PS) and polydimethylsiloxane (PDMS), whose molecular weight and composition ratio are regulated so that the blend polymer is phase-separated into a lamellar structure in which the width of each phase is 12 nm. The volume ratio of PS to PDMS is PS:PDMS=1:2. A propylene glycol monomethyl ether acetate (PGMEA) solution of the blend polymer is adjusted to a concentration of 2.0 wt % and rotationally coated to a recess of the physical guide layer 421 with a rotation number of 1500 rpm, whereby a blend polymer layer 411 is formed.

Next, as shown in FIG. 18C, the blend polymer layer 411 is microphase-separated. By virtue of the microphase separation, a self-assembly pattern 412 having a lamellar structure constituted of a first polymer portion 412a having PS and a second polymer portion 412b having PDMS is formed.

When the blend polymer layer 411 is a blend polymer of PS and PDMS, the second polymer portion 412b which is adjacent to a protrusion of the physical guide layer 421 and has PDMS is formed. The second polymer portion 412b and the first polymer portion 412a held between the second polymer portions 412b are formed in the recess of the physical guide layer 421. A pattern in which the PS regions and the PDMS regions with a width of 12 nm are regularly arranged is formed.

The pitch of the self-assembly pattern 412 (a total width of the first and second polymer portions 412a and 412b) is 24 nm. The pitch of the physical guide layer 421 (a total width of the protrusion and the recess) is 48 nm. Accordingly, it can be shown that the self-assembly pattern 412 having a pitch ½ times the pitch of the physical guide layer 421 is obtained.

The blend polymer layer 411 is microphase-separated by heating, for example. For example, a laminate formed with the blend polymer layer 411 is baked for 1 minute at 110° C. in a hot plate and then subjected to annealing treatment for 1 minute at 170° C. under the $N_2$ atmosphere, whereby the blend polymer layer 411 is microphase-separated.

According to this embodiment, the physical guide layer 420 including a slimmed resist pattern 406B is formed, and the self-assembly pattern 409 including the first and second polymer portions 409a and 409b is formed using the physical guide layer 420. Then, the processed film 401 onto which the pattern shape of the slimmed second polymer portion 409b is transferred is used as a protrusion of the physical guide layer 421. The extremely fine self-assembly pattern 412 is then formed with high positional accuracy, using the physical guide layer 421.

As described above, according to this embodiment, a guide pattern including a fine pattern is formed, and an extremely fine microphase separation pattern can be formed. Moreover, the accuracy of the formation position of the microphase separation pattern can be enhanced.

Similarly, before a process for coating the self-assembly material in FIGS. 16C and 18B, the surface of the physical guide layer is treated if necessary, and, for example, the surface of the physical guide layer is exposed to one of homopolymers of the self-assembly material, or polymer brush, whereby the affinity for one of polymers contained in the self-assembly material may be enhanced. In this case, since an optimal width of the protrusion of the physical guide is different depending on materials to be exposed based on a thickness of a film formed on the surface of the physical guide, the protrusion is formed to have a required size if necessary.

Fifth Embodiment

A pattern forming method according to a fifth embodiment will be described using FIGS. 19 to 22.

First, as shown in FIG. 19A, an organic film 501 and a silicon oxide film 502 are sequentially formed on a semiconductor substrate 500 such as a silicon wafer. The silicon oxide film 502 has a film thickness of 20 nm, for example.

Subsequently, resist having a film thickness of 100 nm is rotationally coated onto the silicon oxide film 502 to be exposed by an ArF excimer laser, and, thus, to be subjected to development processing, whereby a resist pattern 506A having a line-and-space shape having a pitch width of 96 nm is formed. In the resist pattern 506A, each width of a line portion and a space portion is 48 nm.

Next, as shown in FIG. 19B, the resist pattern 506A is slimmed by oxygen RIE (reactive ion etching). According to this constitution, a resist pattern 506B in which the width of the line portion is 24 nm and the width of the space portion is 72 nm is obtained. The resist pattern 506B becomes a physical guide layer 520 in the microphase separation of a self-assembly material to be described later. The physical guide layer 520 has a concavoconvex structure. In this structure, a line portion of the resist pattern 506B corresponds to the protrusion, and a space portion of the resist pattern 506B corresponds to the recess. In this case, the ratio between the widths of the protrusion and the recesses of the physical guide is 1:3.

Next, as shown in FIG. 19C, a blend polymer layer (self-assembly material layer) 508 is formed in the recess of the physical guide layer 520. The blend polymer used in this case is a blend polymer of polystyrene (PS) and polymethylmethacrylate (PMMA), whose molecular weight and composition ratio are regulated so that the blend polymer is phase-separated into a lamellar structure in which the width of each phase is 24 nm. The volume ratio of PS to PDMS is PS:PMMA=2:1. A propylene glycol monomethyl ether acetate (PGMEA) solution of the blend polymer is adjusted to a concentration of 2.0 wt % and rotationally coated to a recess of the physical guide layer 520 with a rotation number of 1500 rpm, whereby a blend polymer layer 508 is formed. The physical guide layer 520 has a tolerance for the PGMEA solution.

Next, as shown in FIG. 20A, the blend polymer layer 508 is microphase-separated. By virtue of the microphase separation, a self-assembly pattern 509 having a lamellar structure constituted of a first polymer portion 509a having PMMA and a second polymer portion 509b having PS is formed.

When the blend polymer layer 508 is a blend polymer of PS and PMMA, the first polymer portion 509a which is adjacent to a protrusion of the physical guide layer 520 and has PMMA is formed. The first polymer portion 509a and the second polymer portion 509b held between the first polymer portions 509a are formed in the recess of the physical guide layer 520. A pattern in which the PS regions and the PMMA regions with a width of 24 nm are regularly arranged is formed.

The pitch of the self-assembly pattern 509 (a total width of the first and second polymer portions 509a and 509b) is 48 nm. The pitch of the physical guide layer 520 (a total width of the protrusion and the recess) is 96 nm. Accordingly, it can be shown that the self-assembly pattern 509 having a pitch ½ times the pitch of the physical guide layer 520 is obtained.

The blend polymer layer 508 is microphase-separated by heating, for example. For example, a laminate formed with the blend polymer layer 508 is baked for 1 minute at 110° C. in a hot plate and then subjected to annealing treatment for 1 minute at 150° C. under the $N_2$ atmosphere, whereby the blend polymer layer 508 is microphase-separated.

Next, as shown in FIG. 20B, the first polymer portion 509a and a protrusion (resist pattern 506B) of the physical guide layer 520 are selectively removed. The second polymer portion 509b remains to form a line-and-space shape.

Next, as shown in FIG. 20C, the second polymer portion (PS) 509b is slimmed by RIE to have a width of 8 nm. According to this constitution, the second polymer portion (PS) 509b has a line-and-space shape in which the width of the line portion is 8 nm and the width of the space portion is 40 nm.

Next, as shown in FIG. 21A, a neutralization film 510 is formed on a surface of the pattern of the second polymer portion (PS) 509b and on the silicon oxide film 502 to cover the pattern.

Next, as shown in FIG. 21B, the pattern of the second polymer portion (PS) 509b is removed together with the neutralization film 510 formed thereon to make the neutralization film 510 a line-and-space shape. According to this, a chemical guide layer 521 including a neutralization region and a pinning region is formed. The neutralization film 510 is the neutralization region, and the exposed silicon oxide film 502 is the pinning region.

Next, as shown in FIG. 22A, a block copolymer layer (self-assembly material layer) 511 is formed on the chemical guide layer 521. For example, there is used a block copolymer of polystyrene (PS) and polyhedral oligomeric silsesquioxane (POSS)-containing polymethacrylate (PMAPOSS), whose molecular weight and composition ratio are regulated so that the structure of the block copolymer is phase-separated into a lamellar structure in which the width of each phase is 8 nm. A cyclopentanone solution of the block copolymer is adjusted to a concentration of 1.0 wt % and rotationally coated onto the chemical guide layer 521 with a rotation number of 1500 rpm, whereby a block copolymer layer 511 is formed.

Next, as shown in FIG. 22B, the block copolymer layer 511 is microphase-separated. By virtue of the microphase separation, a self-assembly pattern 512 having a lamellar structure constituted of a first polymer portion 512a having PS and a second polymer portion 512b having PMAPOSS is formed.

The pitch of the self-assembly pattern 512 (a total width of the first polymer portion (PS) 512a and the second polymer portion (PMAPOSS) 512b) is 16 nm. Meanwhile, the pitch of the chemical guide layer 521 is 48 nm. Accordingly, it can be shown that the self-assembly pattern 512 having a pitch ⅓ times the pitch of the chemical guide layer 521 is obtained.

The block copolymer layer 511 is microphase-separated by heating, for example. For example, when solvent annealing treatment is performed under an acetone vapor atmosphere, the block copolymer layer 511 is microphase-separated.

According to this embodiment, the physical guide layer 520 including the slimmed resist pattern 506B is formed, and the self-assembly pattern 509 including the first and second polymer portions 509a and 509b is formed using the physical guide layer 520. Then, the chemical guide layer 521 having a fine pattern shape based on the slimmed second polymer portion 509b is formed. The extremely fine self-assembly pattern 512 is then formed with high positional accuracy, using the chemical guide layer 521.

As described above, according to this embodiment, a guide pattern including a fine pattern is formed, and an extremely fine microphase separation pattern can be formed. Moreover, the accuracy of the formation position of the microphase separation pattern can be enhanced.

Before a process for coating the self-assembly material in FIG. 19C, the surface of the physical guide layer is treated if necessary, and, for example, the surface of the physical guide layer is exposed to one of homopolymers of the self-assembly material, or polymer brush, whereby the affinity for one of polymers contained in the self-assembly material may be enhanced. In this case, since an optimal width of the protrusion of the physical guide is different depending on materials to be exposed, the protrusion is formed to have a required size if necessary.

Sixth Embodiment

A pattern forming method according to a sixth embodiment will be described using FIGS. 23 to 32. FIGS. 23B to 32B are upper views. Each of FIGS. 23A to 32A is a longitudinal cross-sectional view along an A-A line of each of FIGS. 23B to 32B.

First, as shown in FIGS. 23A and 23B, a silicon oxide film 603, a processed film 601, and a silicon oxide film 602 are sequentially formed on a semiconductor substrate 600 such as a silicon wafer. The processed film 601 is, for example, an SOC (Spin on Carbon, coating type carbon) film having a film thickness of 100 nm. The silicon oxide films 602 and 603 have a film thickness of 30 nm, for example.

Subsequently, resist having a film thickness of 100 nm is rotationally coated onto the silicon oxide film 602 to be exposed by an ArF excimer laser, and, thus, to be subjected to development processing, whereby a resist pattern 606A including a pillar structure having a diameter of 50 nm is formed. The pitch of the resist pattern 606A, that is, a center-to-center distance of the pillar structures adjacent to each other is 120 nm.

The resist pattern 606A is, for example, a periodic pattern placed on a two-dimensional hexagonal lattice. In other words, the center of the pillar structure of the resist pattern 606A is located at the center and the apex of a regular hexagon. In the drawing, a portion of such a pattern is shown.

Next, as shown in FIGS. 24A and 24B, the resist pattern 606A is slimmed by oxygen RIE (reactive ion etching). According to this constitution, a resist pattern 606B including a pillar structure having a diameter of 16 nm is obtained. The pitch of the resist pattern 606B, that is, a center-to-center distance of the pillar structures adjacent to each other is kept at 120 nm.

Next, as shown in FIGS. 25A and 25B, the silicon oxide film 602 is processed by RIE, using the resist pattern 606B as a mask. According to this constitution, a pattern shape of the resist pattern 606B is transferred onto the silicon oxide film 602. After that, the resist pattern 606B is peeled with thinner.

The silicon oxide film 602 and the processed film 601 become a physical guide layer 620 in the microphase separation of a self-assembly material to be described later. The physical guide layer 620 has a concavoconvex structure, and in this structure, the silicon oxide film 602 corresponds to a protrusion, and a region between the silicon oxide films 602 corresponds to a recess.

Next, as shown in FIGS. 26A and 26B, a block copolymer layer (self-assembly material layer) 608 is formed in a recess of the physical guide layer 620. For example, there is used a block copolymer (PS-b-PDMS) of polystyrene (PS) and polydimethylsiloxane (PDMS), whose molecular weight and composition ratio are regulated so that a sphere structure having a diameter of 20 nm is formed by phase separation. A propylene glycol monomethyl ether acetate (PGMEA) solution of the block copolymer is adjusted to a concentration of 2.0 wt % and rotationally coated into the recess of the physical guide layer 620 with a rotation number of 1500 rpm, whereby a block copolymer layer 608 is formed.

Next, as shown in FIGS. 27A and 27B, the block copolymer layer 608 is microphase-separated. By virtue of the microphase separation, a self-assembly pattern 609 constituted of a first polymer portion 609a having PS and a second polymer portion 609b having PDMS is formed. The second polymer portion 609b has a sphere structure having a diameter of 20 nm. The first polymer portion 609a is formed to enclose the second polymer portion 609b.

In the recess of the physical guide layer 620, the first polymer portion 609a and the second polymer portion 609b are alternately arranged between the protrusions (between the silicon oxide films 602).

The pitch of the self-assembly pattern 609 (the distance between the center points of the two adjacent second polymer portions 609b) is 40 nm. The pitch of the physical guide layer 620 (a distance between the center points of the protrusions) is 120 nm. Accordingly, it can be shown that the self-assembly pattern 609 having a pitch ⅓ times the pitch of the physical guide layer 620 is obtained.

The block copolymer layer 608 is microphase-separated by heating, for example. For example, a laminate formed with the block copolymer layer 608 is baked for 1 minute at 110° C. in a hot plate and then subjected to annealing treatment for 1 minute at 170° C. under the $N_2$ atmosphere, whereby the block copolymer layer 608 is microphase-separated.

Figure 28A:
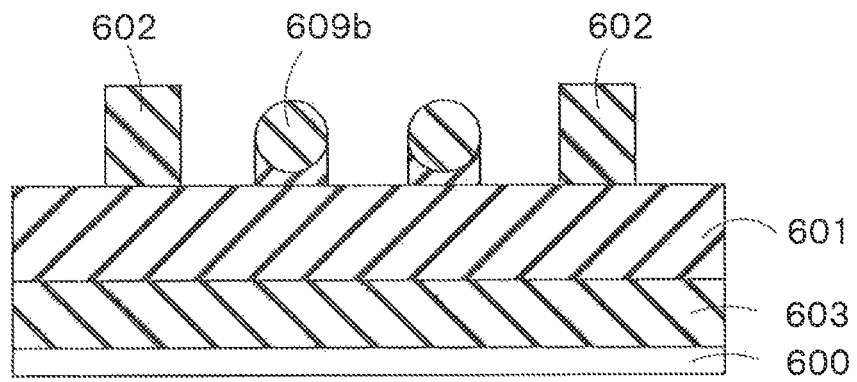
Figure 28B:
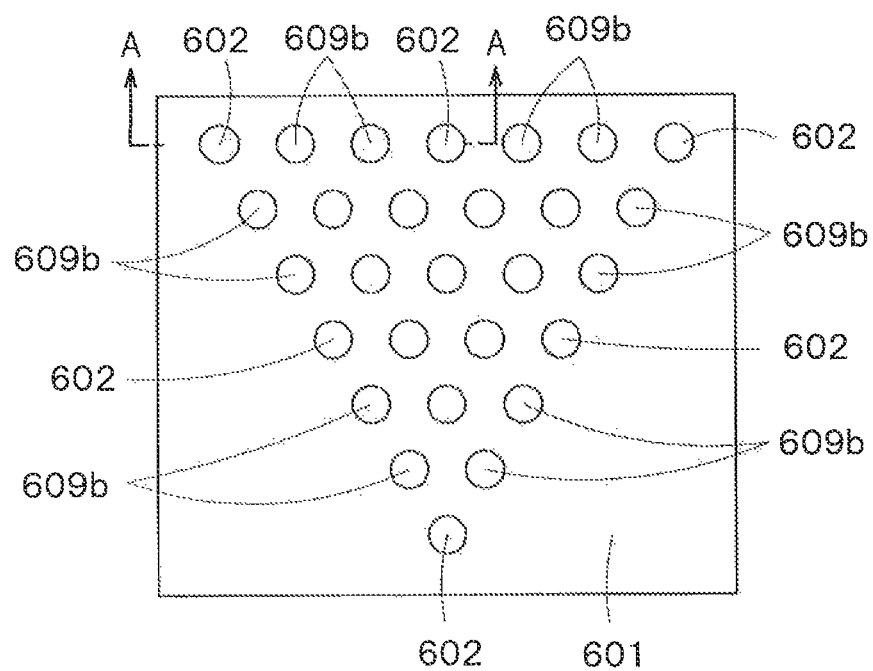

Next, as shown in FIGS. 28A and 28B, the first polymer portion 609a having PS is selectively removed by dry etching. The second polymer portion 609b having PDMS and the silicon oxide film 602 remain. At this time, a PDMS thin film of a second polymer is formed on a surface of the silicon oxide film 302 which is a physical guide surface, and a pillar diameter of the physical guide is 20 nm.

Next, as shown in FIGS. 29A and 29B, the pattern shape formed in the process shown in FIGS. 28A and 28B is transferred to the processed film 601 and the silicon oxide film 603. After the silicon oxide film 603 is processed, the processed film 601 is removed.

After that, the silicon oxide film 603 is slimmed by oxygen RIE. According to this constitution, the silicon oxide film 603 has a pillar structure having a diameter of 10 nm. A center-to-center distance of the silicon oxide film 603 adjacent to each other is 40 nm.

The silicon oxide film 603 after slimming becomes a physical guide layer 621 in the microphase separation of a self-assembly material to be described later.

Figure 30A:
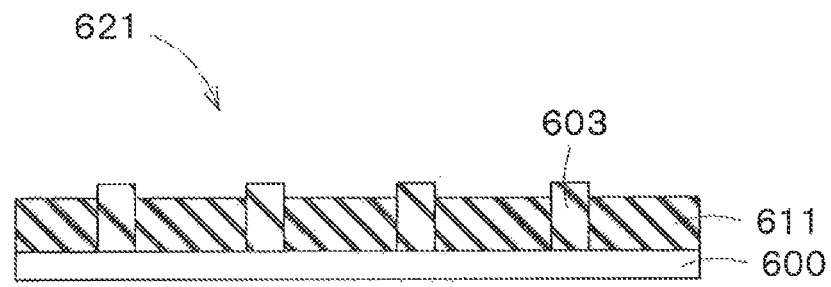
Figure 30B:
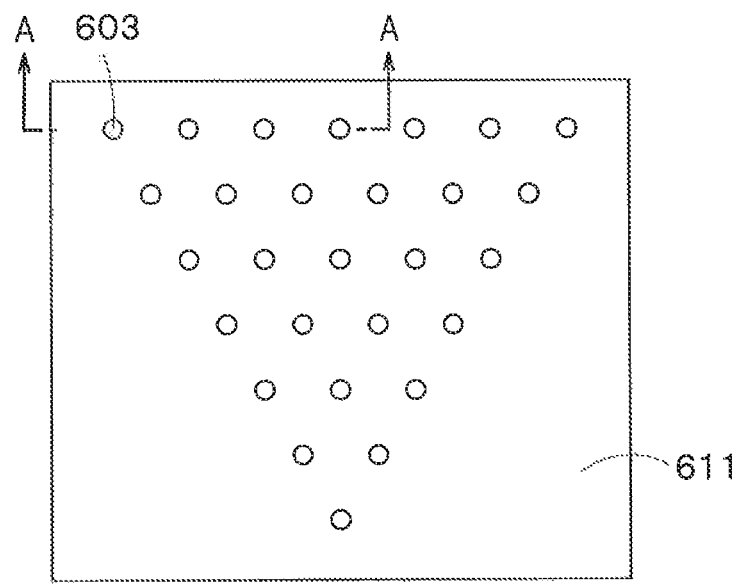

Next, as shown in FIGS. 30A and 30B, a block copolymer layer (self-assembly material layer) 611 is formed in the recess of the physical guide layer 621. For example, there is used a block copolymer (PS-b-PDMS) of polystyrene (PS) and polydimethylsiloxane (PDMS), whose molecular weight and composition ratio are regulated so that a sphere structure with a diameter of 10 nm is formed by phase separation. A propylene glycol monomethyl ether acetate (PGMEA) solution of the block copolymer is adjusted to a concentration of 2.0 wt % and rotationally coated to the recess of the physical guide layer 621 with a rotation number of 1500 rpm, whereby a block copolymer layer 611 is formed.

Next, as shown in FIGS. 31A and 31B, the block copolymer layer 611 is microphase-separated. By virtue of the microphase separation, a self-assembly pattern 612 constituted of a first polymer portion 612a having PS and a second polymer portion 612b having PDMS is formed. The second polymer portion 612b has a sphere structure having a diameter of 10 nm. The first polymer portion 612a is formed to enclose the second polymer portion 612b.

The first polymer portion 612a and the second polymer portion 612b are alternately arranged at regular intervals between the protrusions of the physical guide layer 621.

The pitch of the self-assembly pattern 612 (a total width of the first and second polymer portions 612a and 612b) is 20 nm. The pitch of the physical guide layer 621 (a total width of the protrusion and the recess) is 40 nm. Accordingly, it can be shown that the self-assembly pattern 612 having a pitch ½ times the pitch of the physical guide layer 621 is obtained.

The block copolymer layer 611 is microphase-separated by heating, for example. For example, a laminate formed with the block copolymer layer 611 is baked for 1 minute at 110° C. in a hot plate and then subjected to annealing treatment for 1 minute at 170° C. under the $N_2$ atmosphere, whereby the block copolymer layer 611 is microphase-separated.

Next, as shown in FIGS. 32A and 32B, the first polymer portion 612a having PS is selectively removed by dry etching. The second polymer portion 612b having PDMS and the silicon oxide film 602 remain. Thus, a pillar of 10 nm is formed at a pitch of 20 nm.

According to this embodiment, the physical guide layer 620 based on the slimmed resist pattern 606B having a sphere structure is formed, and the self-assembly pattern 609 including the first polymer portion 609a and the second polymer portion 609b having a sphere structure is formed using the physical guide layer 620. Then, the physical guide layer 621 having a fine pattern shape including the slimmed second polymer portion 609b is formed. The self-assembly pattern 612 having an extremely fine pillar structure is then formed with high positional accuracy, using the physical guide layer 621.

As described above, according to this embodiment, a guide pattern including a fine pattern is formed, and an extremely fine microphase separation pattern can be formed. Moreover, the accuracy of the formation position of the microphase separation pattern can be enhanced.

Before a process for coating the self-assembly material in FIGS. 26A, 26B, 30A, and 30B, the surface of the physical guide layer is treated if necessary, and, for example, the surface of the physical guide layer is exposed to one of homopolymers of the self-assembly material, or polymer brush, whereby the affinity for one of polymers contained in the self-assembly material may be enhanced. In this case, since an optimal width of the protrusion of the physical guide is different depending on materials to be exposed, the protrusion is formed to have a required size if necessary.

Seventh Embodiment

A pattern forming method according to a seventh embodiment will be described using FIGS. 33 to 46. FIGS. 33B to 46B are upper views. Each of FIGS. 33A to 46A is a longitudinal cross-sectional view along an A-A line of each of FIGS. 33B to 46B.

Figure 33A:
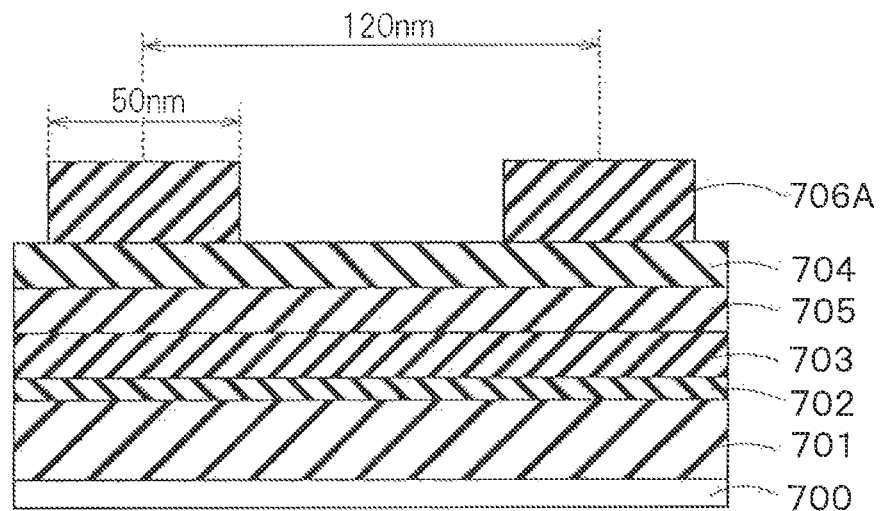
Figure 33B:
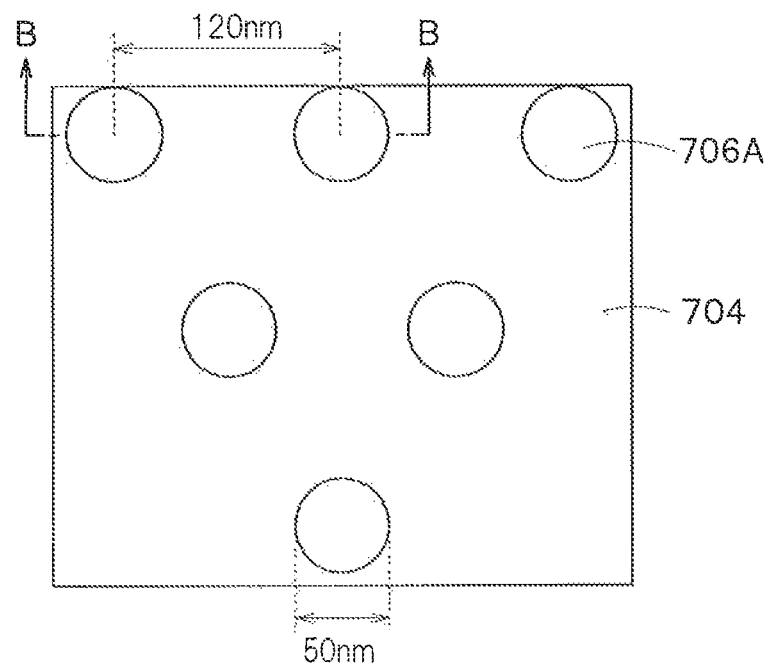

First, as shown in FIGS. 33A and 33B, a processed film 701, an X-PS film 702, an amorphous silicon oxide film 703, an organic film 705 and a silicon oxide film 704 are sequentially formed on a semiconductor substrate 700 such as a silicon wafer. The processed film 701 is, for example, a silicon oxide film having a film thickness of 100 nm. The X-PS film 702 has a film thickness of 7 nm, for example. An X-PS material is rotationally coated onto the processed film 701 and subjected to baking treatment (heating treatment) for 90 minutes at 250° C., whereby the X-PS film 702 is formed. The X-PS material has a high affinity for polystyrene. The amorphous silicon film 703 and the silicon oxide film 704 have a film thickness of 30 nm, for example. The organic film 705 is, for example, an SOC (Spin on Carbon) film having a film thickness of 100 nm.

Subsequently, resist having a film thickness of 100 nm is rotationally coated onto the silicon oxide film 703 to be exposed by an ArF excimer laser, and, thus, to be subjected to development processing, whereby a resist pattern 706A including a pillar structure having a diameter of 50 nm is formed. The pitch of the resist pattern 706A, that is, a center-to-center distance of pillar structures adjacent to each other is 120 nm.

The resist pattern 706A is, for example, a periodic pattern placed on a two-dimensional hexagonal lattice. In other words, the center of the pillar structure of the resist pattern 706A is located at the center and the apex of a regular hexagon. In the drawing, a portion of such a pattern is shown.

Next, as shown in FIGS. 34A and 348, the resist pattern 706A is slimmed by oxygen RIE (reactive ion etching). According to this constitution, a resist pattern 706B including a pillar structure having a diameter of 20 nm is obtained. The pitch of the resist pattern 706B, that is, a center-to-center distance of the pillar structures adjacent to each other is kept at 120 nm.

Next, as shown in FIGS. 35A and 35B, the silicon oxide film 704 is processed by RIE, using the resist pattern 706B as a mask. According to this constitution, a pattern shape of the resist pattern 706B is transferred onto the silicon oxide film 704.

Figure 36A:
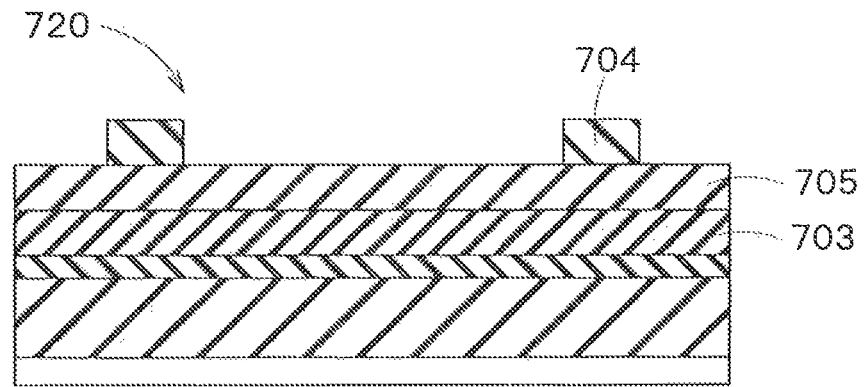
Figure 36B:
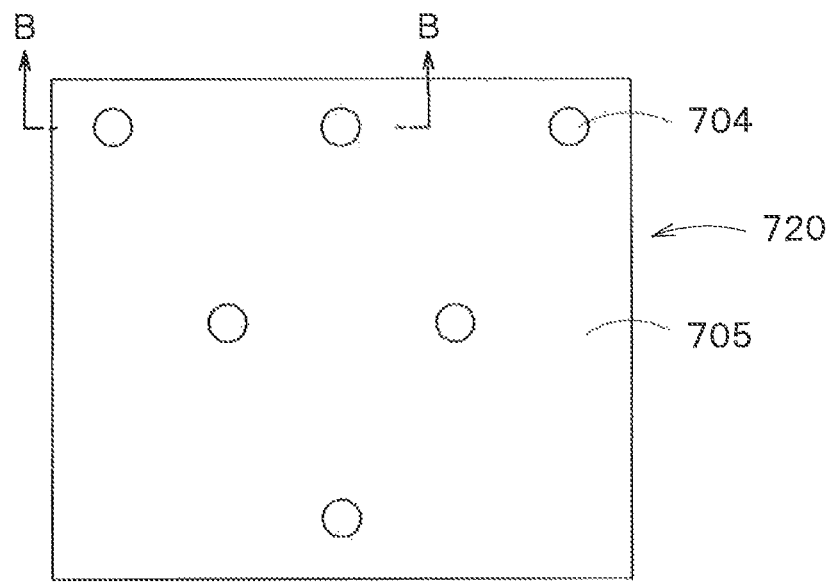

Next, as shown in FIGS. 36A and 36B, the resist pattern 706B is peeled with thinner. The silicon oxide film 704 becomes a protrusion of a physical guide layer 720 in the microphase separation of a self-assembly material to be described later.

Next, as shown in FIGS. 37B and 37B, a block copolymer layer (self-assembly material layer) 708 is formed in a recess of the physical guide layer 720. For example, there is used a block copolymer (PS-b-PDMS) of polystyrene (PS) and polydimethylsiloxane (PDMS), whose molecular weight and composition ratio are regulated so that a sphere structure with a diameter of 10 nm is formed by phase separation. A propylene glycol monomethyl ether acetate (PGMEA) solution of the block copolymer is adjusted to a concentration of 2.0 wt % and rotationally coated into the recess of the physical guide layer 720 with a rotation number of 1500 rpm, whereby a block copolymer layer 708 is formed.

Next, as shown in FIGS. 38A and 38B, the block copolymer layer 708 is microphase-separated. By virtue of the microphase separation, a self-assembly pattern 709 constituted of a first polymer portion 709a having PS and a second polymer portion 709b having PDMS is formed. The second polymer portion 709b has a sphere structure having a diameter of 10 nm. The first polymer portion 709a is formed to enclose the second polymer portion 709b.

In the recess of the physical guide layer 720, the first polymer portion 709a and the second polymer portion 709b are alternately arranged between the protrusions (between the silicon oxide films 704).

The pitch of the self-assembly pattern 709 (the total of the width of the first polymer portion (10 nm) and the width of the second polymer portion 709b (30 nm)) is 40 nm. The pitch of the physical guide layer 720 (a total width of the protrusion and the recess) is 120 nm. Accordingly, it can be shown that the self-assembly pattern 709 having a pitch ⅓ times the pitch of the physical guide layer 720 is obtained.

The block copolymer layer 708 is microphase-separated by heating, for example. For example, a laminate formed with the block copolymer layer 708 is baked for 1 minute at 110° C. in a hot plate and then subjected to annealing treatment for 1 minute at 170° C. under the $N_2$ atmosphere, whereby the block copolymer layer 708 is microphase-separated.

Figure 39A:
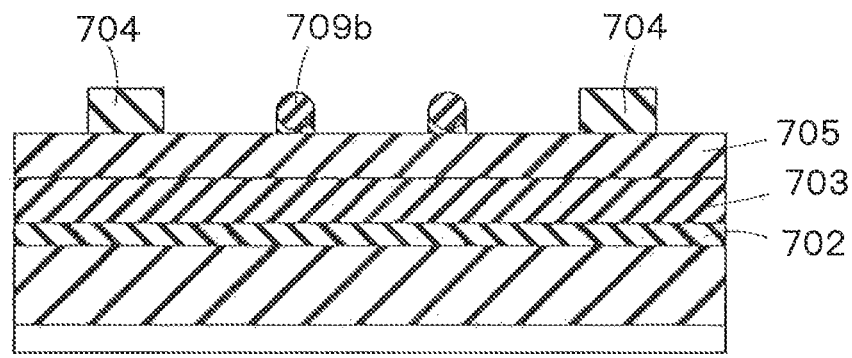
Figure 39B:
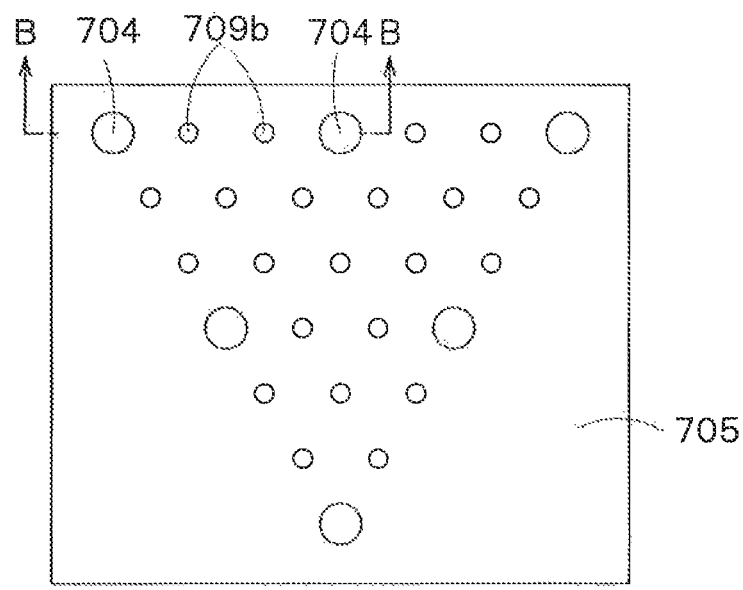

Next, as shown in FIGS. 39A and 39B, the first polymer portion 709a having PS is selectively removed by dry etching. The second polymer portion 709b having PDMS and the silicon oxide film 704 remain.

Next, as shown in FIGS. 40A and 40B, the organic film 705 is processed by RIE, using the second polymer portion 709b and the silicon oxide film 704 as masks. Then, the second polymer portion 709b and the silicon oxide film 704 are removed.

Next, as shown in FIGS. 41A and 41B, a pattern shape of the organic film 705 is transferred to the amorphous silicon oxide film 703. Finally, each pattern shape of the second polymer portion 709b and the silicon oxide film 704 is transferred onto the amorphous silicon oxide film 703.

Next, as shown in FIGS. 42A and 42B, the X-PS film 702 is processed by RIE, using the amorphous silicon film 703 as a mask. A pattern shape of the amorphous silicon oxide film 703 is transferred onto the X-PS film 702.

After that, as shown in FIGS. 43A and 43B, the amorphous silicon oxide film 703 is removed.

Next, as shown in FIGS. 44A and 44B, a neutralization film 710 is formed on a space portion of the X-PS film 702, that is, the processed film 701 whose surface is exposed. For example, P(S-rMMA)-OH) is rotationally coated to be subjected to baking treatment for 5 minutes at 250° C., whereby the neutralization film 710 can be formed in a region where the X-PS film 702 is not formed. The X-PS film 702 and the neutralization film 710 become a chemical guide layer 721 in the microphase separation of a self-assembly material to be described later.

Next, as shown in FIGS. 45A and 45B, a block copolymer layer (self-assembly material layer) 711 is formed on the chemical guide layer 721. For example, there is used a block copolymer (PS-b-PMAPOSS) of polystyrene (PS) and polyhedral oligomeric silsesquioxane (POSS)-containing polymethacrylate (PMAPOSS), whose molecular weight and composition ratio are regulated so that a pillar structure having a diameter of 10 nm is formed by the phase separation. A cyclopentanone solution of the block copolymer is adjusted to a concentration of 1.0 wt % and rotationally coated onto the chemical guide layer 721 with a rotation number of 1500 rpm, whereby a block copolymer layer 711 is formed.

Next, as shown in FIGS. 46A and 46B, the block copolymer layer 711 is microphase-separated. By virtue of the microphase separation, a self-assembly pattern 712 having a pillar structure constituted of a first polymer portion 712*a* having PS and a second polymer portion 712*b* having PMAPOSS is formed.

When the block copolymer layer 711 is a block copolymer of PS and PMAPOSS, PS has a high affinity for the X-PS film 702 provided under the block copolymer layer 711. Thus, the X-PS film 702 is a pinning region, and the first polymer portion (PS) 712*a* is selectively formed on the X-PS film 702. Since the first polymer portion (PS) 712*a* and a second polymer portion (PMAPOSS) 712*b* each having a width of 10 nm are alternately arranged, the first polymer portion 712*a* is formed on the neutralization film (neutral region) 710.

The block copolymer layer 711 is microphase-separated by heating, for example. For example, when solvent annealing treatment is performed under an acetone vapor atmosphere, the block copolymer layer 711 is microphase-separated.

According to this embodiment, the physical guide layer 720 based on the slimmed resist pattern 706B having a pillar structure is formed, and the self-assembly pattern 709 including the first polymer portion 709*a* and the second polymer portion 709*b* which has a sphere structure is formed using the physical guide layer 720. Then, the chemical guide layer 721 having a fine pattern shape based on the second polymer portion 709*b* is formed. The self-assembly pattern 712 having an extremely fine pillar structure is then formed with high positional accuracy, using the chemical guide layer 721.

As described above, according to this embodiment, a guide pattern including a fine pattern is formed, and an extremely fine microphase separation pattern can be formed. Moreover, the accuracy of the formation position of the microphase separation pattern can be enhanced.

Before a process for coating the self-assembly material in FIGS. 37A and 37B, the surface of the physical guide layer is treated if necessary, and, for example, the surface of the physical guide layer is exposed to one of homopolymers of the self-assembly material, or polymer brush, whereby the affinity for one of polymers contained in the self-assembly material may be enhanced. In this case, since an optimal width of the protrusion of the physical guide is different depending on materials to be exposed, the protrusion is formed to have a required size if necessary.

In the above embodiment, although the chemical guide layer in which the X-PS film is the pinning region and the P(S-rMMA)-OH)-containing neutralization film is the neutralization region (neutral region) is used, the method of chemical guide layer formation is not limited to this.

Eighth Embodiment

A pattern forming method according to an eighth embodiment will be described using FIGS. 47 to 50. In this embodiment, a method of chemical guide formation is different in comparison with the second embodiment.

First, as shown in FIG. 47A, a processed film 801, a silicon oxide film 802, and a neutralization film 807 are sequentially formed on a semiconductor substrate 800 such as a silicon wafer. For example, P(S-rMMA)-OH) is rotationally coated to be subjected to baking treatment for 5 minutes at 250° C., whereby the neutralization film 807 having a film thickness of 10 nm can be formed. The processed film 801 is, for example, an SOC (Spin on Carbon, coating type carbon) film having a film thickness of 100 nm. The silicon oxide film 802 has a film thickness of 30 nm, for example.

Subsequently, resist having a film thickness of 100 nm is rotationally coated onto the neutralization film 807 to be exposed by an ArF excimer laser, and, thus, to be subjected to development processing, whereby a line-and-space pattern 806 in which each width of the line portion and the space portion is 48 nm is formed.

Next, as shown in FIG. 47B, the neutralization film 807 is processed by oxygen RIE, using the resist pattern 806 as a mask. According to this constitution, a pattern shape of the resist pattern 206B is transferred onto the neutralization film 807.

Next, as shown in FIG. 47C, the resist pattern 806 is peeled with thinner. The neutralization film 807 has a line-and-space shape in which each width of the line portion and the space portion is 48 nm. In this pattern, the hydrophilization of a space portion is realized by oxygen RIE, and a pinning region having a hydrophilic surface and a surface of the neutralization film 807 as the line portion each have a neutral region. Thus, the neutralization film 807 becomes a chemical guide layer 820 in the microphase separation of a self-assembly material to be described later.

Next, as shown in FIG. 48A, a block copolymer layer (self-assembly material layer) 808 is formed on the chemical guide layer 820. For example, there is used a block copolymer (PS-b-PMMA) of polystyrene (PS) and polymethylmethacrylate (PMMA), whose molecular weight and composition ratio are regulated so that the block copolymer is phase-separated into a lamellar structure in which the width of each phase is 16 nm. A propylene glycol monomethyl ether acetate (PGMEA) solution of the block copolymer is adjusted to a concentration of 2.0 wt % and rotationally coated onto the chemical guide layer 820 with a rotation number of 1500 rpm, whereby a block copolymer layer 808 is formed.

Next, as shown in FIG. 48B, the block copolymer layer 808 is microphase-separated. By virtue of the microphase separation, a self-assembly pattern 809 having a lamellar structure constituted of a first polymer portion 809*a* having PS and a second polymer portion 809*b* having PMMA is formed.

When the block copolymer layer 808 is a block copolymer of polystyrene (PS) and polymethylmethacrylate (PMMA), PMMA has a high affinity for a surface of the silicon oxide film 802 appearing between the neutralization films 807 provided under the block copolymer layer 808. Thus, the surface of the silicon oxide film 802 becomes a pinning region, and a second polymer portion 809*b* is selectively formed on the surface of the silicon oxide film 802. The first polymer portion 809*a* and the second polymer portion 809*b* each having a width of 16 nm are alternately arranged on the neutralization film 807.

The pitch of the self-assembly pattern 809 (a total width of the first and second polymer portions 209*a* and 209*b*) is 32 nm. Meanwhile, the pitch of the chemical guide layer 820 (the pitch of the neutralization film 807) is 96 nm. Accordingly, it can be shown that the self-assembly pattern 809 having a pitch 1/3 times the pitch of the chemical guide layer 820 is obtained.

The block copolymer layer 808 is microphase-separated by heating, for example. For example, a laminate formed with the block copolymer layer 808 is baked for 90 seconds at 110° C. in a hot plate and then subjected to the annealing treatment for 3 minutes at 220° C. under the $N_2$ atmosphere, whereby the block copolymer layer 808 is microphase-separated.

Next, as shown in FIG. 48C, the second polymer portion 809*b* having PMMA is selectively removed by dry etching. The first polymer portion 809*a* having PS remains.

Next, as shown in FIG. 49A, the neutralization film 807 is processed by oxygen RIE, using the first polymer portion 809a as a mask.

Next, as shown in FIG. 49B, the first polymer portion 809a and the neutralization film 807 under the first polymer portion 809a are slimmed. According to this constitution, the first polymer portion 809a has a width of 8 nm, and a distance between the first polymer portions 809a adjacent to each other (width of a space portion) is 24 nm. The first polymer portion 809a and the silicon oxide film 802 after slimming become a physical guide layer 821 in the microphase separation of a self-assembly material to be described later. The physical guide layer 821 has a concavoconvex structure. In this structure, the first polymer portion 809a corresponds to a protrusion, and a region between the first polymer portions 809a corresponds to a recess. In this case, the ratio between the widths of the protrusion and the recesses of the physical guide is 1:3.

Next, as shown in FIG. 50A, a blend polymer layer (self-assembly material layer) 811 is formed in the recess of the physical guide layer 821. The blend polymer used in this case is a blend polymer of polystyrene (PS) and polydimethylsiloxane (PDMS), whose molecular weight and composition ratio are regulated so that the blend polymer is phase-separated into a lamellar structure in which the width of each phase is 8 nm. The volume ratio of PS to PDMS is PS:PDMS 1:2. A propylene glycol monomethyl ether acetate (PGMEA) solution of the blend polymer is adjusted to a concentration of 2.0 wt % and rotationally coated to a recess of the physical guide layer 221 with a rotation number of 1500 rpm, whereby a blend polymer layer 811 is formed.

Next, as shown in FIG. 50B, the blend polymer layer 811 is microphase-separated. By virtue of the microphase separation, a self-assembly pattern 812 having a lamellar structure constituted of a first polymer portion 812a having PS and a second polymer portion 812b having PDMS is formed.

When the blend polymer layer 811 is a blend polymer of PS and PDMS, the second polymer portion 812b which is adjacent to a protrusion (the first polymer portion 809a having PS) of the physical guide layer 821 and has PDMS is formed. The second polymer portion 812b and the first polymer portion 812a held between the second polymer portions 812b are formed in the recess of the physical guide layer 821. The protrusion of the physical guide layer 821 and the self-assembly pattern 812 form a pattern in which the PS regions and the PDMS regions with a width of 8 nm regularly arranged by 1:1.

The pitch of the self-assembly pattern 812 (a total width of the first and second polymer portions 812a and 812b) is 16 nm. The pitch of the physical guide layer 821 (a total width of the protrusion and the recess) is 32 nm. Accordingly, it can be shown that the self-assembly pattern 812 having a pitch ½ times the pitch of the physical guide layer 821 is obtained.

The blend polymer layer 811 is microphase-separated by heating, for example. For example, a laminate formed with the blend polymer layer 811 is baked for 1 minute at 110° C. in a hot plate and then subjected to the annealing treatment for 1 minute at 170° C. under the $N_2$ atmosphere, whereby the blend polymer layer 811 is microphase-separated.

After that, any one of the PS region (the first polymer portion 809a and the first polymer portion 812a) and the PDMS region (the second polymer portion 812b), illustration of which will be omitted here, is selectively removed, and the silicon oxide film 802 and the processed film 801 are processed using the other region as a mask. According to this constitution, the processed film 801 can be formed into a fine pattern.

According to this embodiment, the chemical guide layer 820 based on the pattern shape of the resist pattern 806 is formed, and the self-assembly pattern 809 including the first and second polymer portions 809a and 809b is formed using the chemical guide layer 820. The slimmed first polymer portion 809a is utilized as the protrusion of the physical guide layer 821. The extremely fine self-assembly pattern 812 is then formed using the physical guide layer 821.

As described above, according to this embodiment, a guide pattern including a fine pattern is formed, and an extremely fine microphase separation pattern can be formed with high positional accuracy.

In the eighth embodiment, the silicon oxide film 802 and the processed film 801 may be processed using the slimmed first polymer portion 809a (see, FIG. 49B) as a mask, as shown in FIG. 51. In this case, the processed film 801 and the semiconductor substrate 800 can be utilized as a physical guide layer. A self-assembly material layer is formed in a recess of the physical guide layer to be microphase-separated, whereby a self-assembly pattern 831 as shown in FIG. 51 can be formed. If necessary, the surface of the physical guide layer is treated before the formation of the self-assembly material layer, and a surface having a high affinity for one of polymers contained in the self-assembly material layer may be formed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A pattern forming method comprising:
   forming a first guide layer on a processed film;
   phase-separating a first self-assembly material with the use of the first guide layer to form a first self-assembly pattern including a first polymer portion and a second polymer portion;
   selectively removing the first polymer portion;
   forming a second guide layer with the use of the second polymer portion and the first guide layer; and
   phase-separating a second self-assembly material with the use of the second guide layer to form a second self-assembly pattern including a third polymer portion and a fourth polymer portion.

2. The pattern forming method according to claim 1, wherein the first guide layer is a chemical guide layer having a pinning region, which has a higher affinity for one of the first and second polymer portions than an affinity for another one of the first and second polymer portions, and a neutralization region including a neutralization film.

3. The pattern forming method according to claim 2, wherein a width of the pinning region is equal to a half of a pitch of the first self-assembly pattern.

4. The pattern forming method according to claim 1, wherein the second guide layer is a chemical guide layer having a pinning region, which has a higher affinity for one of the third and fourth polymer portions than an affinity for another one of the third and fourth polymer portions, and a neutralization region including a neutralization film.

5. The pattern forming method according to claim 4, wherein a width of the pinning region is equal to a half of a pitch of the second self-assembly pattern.

6. The pattern forming method according to claim 5, wherein the first guide layer is a physical guide layer having a concavoconvex structure.

7. The pattern forming method according to claim 2, wherein the second guide layer is a chemical guide layer having a second pinning region, which has a higher affinity for one of the third and fourth polymer portions than an affinity for another one of the third and fourth polymer portions, and a second neutralization region including a neutralization film.

8. The pattern forming method according to claim 7, wherein a width of the second pinning region is equal to a half of a pitch of the second self-assembly pattern.

9. The pattern forming method according to claim 1, wherein the second guide layer is a physical guide layer including the second polymer portion which has been slimmed.

10. The pattern forming method according to claim 1, wherein the first guide layer has a concavoconvex structure, in the concavoconvex structure, a width of a recess is three times a width of a protrusion, and the first self-assembly material is a blend polymer in which a volume ratio between a polymer material corresponding to the first polymer portion and a polymer material corresponding to the second polymer portion is 1:2.

11. The pattern forming method according to claim 1, wherein the second guide layer has a concavoconvex structure, in the concavoconvex structure, a width of a recess is three times a width of a protrusion, and the second self-assembly material is a blend polymer in which a volume ratio of a polymer material corresponding to the third polymer portion to a polymer material corresponding to the fourth polymer portion is 1:2.

12. The pattern forming method according to claim 11, wherein the protrusion of the second guide layer includes the second polymer portion which has been slimmed.

13. The pattern forming method according to claim 11, wherein a width of the protrusion is equal to a half of a pitch of the second self-assembly pattern.

14. A pattern forming method comprising:
forming a first guide layer on a processed film;
phase-separating a first self-assembly material with the use of the first guide layer to form a first self-assembly pattern including a first polymer portion and a second polymer portion;
selectively removing the first polymer portion;
forming a second guide layer with the use of the second polymer portion; and
phase-separating a second self-assembly material with the use of the second guide layer to form a second self-assembly pattern including a third polymer portion and a fourth polymer portion,
wherein:
the first guide layer is a chemical guide layer having a pinning region, which has a higher affinity for one of the first and second polymer portions than an affinity for another one of the first and second polymer portions, and a neutralization region including a neutralization film, and
the second guide layer has a concavoconvex structure, in the concavoconvex structure, a width of a recess is three times a width of a protrusion, and the second self-assembly material is a blend polymer in which a volume ratio of a polymer material corresponding to the third polymer portion to a polymer material corresponding to the fourth polymer portion is 1:2.

15. The pattern forming method according to claim 14, wherein the protrusion of the second guide layer includes the second polymer portion which has been slimmed.

16. A pattern forming method comprising:
forming a first guide layer on a processed film;
phase-separating a first self-assembly material with the use of the first guide layer to form a first self-assembly pattern including a first polymer portion and a second polymer portion;
selectively removing the first polymer portion;
forming a second guide layer with the use of the second polymer portion; and
phase-separating a second self-assembly material with the use of the second guide layer to form a second self-assembly pattern including a third polymer portion and a fourth polymer portion,
wherein:
the first guide layer and the second guide layer are physical guide layers having a concavoconvex structure, and
a protrusion of the second guide layer includes the second polymer portion which has been slimmed.

17. The pattern forming method according to claim 16, wherein the second polymer portion has a sphere structure.

* * * * *